US012726214B2

(12) United States Patent
Cooper et al.

(10) Patent No.: US 12,726,214 B2
(45) Date of Patent: Sep. 1, 2026

(54) SYSTEM AND METHOD FOR DISTRIBUTED NODE-BASED DATA COMPACTION WITH DYADIC DISTRIBUTION-BASED COMPRESSION AND ENCRYPTION

(71) Applicant: AtomBeam Technologies Inc., Moraga, CA (US)

(72) Inventors: Joshua Cooper, Columbia, SC (US); Charles Yeomans, Orinda, CA (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

(21) Appl. No.: 19/276,202

(22) Filed: Jul. 22, 2025

(65) Prior Publication Data

US 2025/0350297 A1 Nov. 13, 2025

Related U.S. Application Data

(63) Continuation-in-part of application No. 18/770,652, filed on Jul. 12, 2024, now Pat. No. 12,283,975, and a continuation-in-part of application No. 18/530,147, filed on Dec. 5, 2023, now Pat. No. 12,381,574, said application No. 18/770,652 is a continuation-in-part (Continued)

(51) Int. Cl.

*G06F 7/00* (2006.01)
*G06N 20/00* (2019.01)
*H03M 7/30* (2006.01)

(52) U.S. Cl.

CPC .......... *H03M 7/3059* (2013.01); *G06N 20/00* (2019.01); *H03M 7/6005* (2013.01)

(58) Field of Classification Search

CPC ............. H03M 7/3059; H03M 7/6005; H03M 7/4056; H03M 7/6052; H03M 7/3079; H03M 7/6035; H03M 7/607; H03M 7/30; G06F 16/27; G06F 16/178; G06F 16/275; G06F 16/1744

See application file for complete search history.

(56) References Cited

U.S. PATENT DOCUMENTS 5,963,642 A * 10/1999 Goldstein ........... G06F 16/2272 707/999.009
6,333,983 B1 * 12/2001 Enichen .................. H04L 9/088 380/273

(Continued)

*Primary Examiner* — Mohammed R Uddin

(74) *Attorney, Agent, or Firm* — GALVIN PATENT LAW LLC; Brian R. Galvin; Alec L. Perry

(57) ABSTRACT

A system and method for distributed node-based data compaction. The system uses machine learning on data chunks to generate codebooks which compact the data to be stored, processed, or sent with a smaller data profile than uncompacted data. The system uses a data compaction in an existing blockchain fork or implemented in a new blockchain protocol from which nodes that wish to or need to use the blockchain can do so with a reduced storage requirement. The system uses network data compaction across all nodes to increase the speed of and decrease the size of a blockchain's data packets. The system uses data compaction firmware to increase the efficiency at which mining rigs can computationally validate new blocks on the blockchain. The system can be implemented using any combination of the three data compaction services to meet the needs of the desired blockchain technology.

8 Claims, 48 Drawing Sheets

Related U.S. Application Data of application No. 18/503,135, filed on Nov. 6, 2023, now Pat. No. 12,237,848, which is a continuation of application No. 18/305,305, filed on Apr. 21, 2023, now Pat. No. 11,811,428, said application No. 18/530,147 is a continuation of application No. 18/303,399, filed on Apr. 19, 2023, now Pat. No. 11,838,034, said application No. 18/305,305 is a continuation-in-part of application No. 18/190,044, filed on Mar. 24, 2023, now Pat. No. 11,831,343, which is a continuation-in-part of application No. 17/875,201, filed on Jul. 27, 2022, now Pat. No. 11,700,013, said application No. 18/303,399 is a continuation-in-part of application No. 17/875,201, filed on Jul. 27, 2022, now Pat. No. 11,700,013, which is a continuation of application No. 17/514, 913, filed on Oct. 29, 2021, now Pat. No. 11,424,760, which is a continuation-in-part of application No. 17/404,699, filed on Aug. 17, 2021, now Pat. No. 11,385,794.

(60) Provisional application No. 63/485,518, filed on Feb. 16, 2023, provisional application No. 63/388,411, filed on Jul. 12, 2022, provisional application No. 63/332,533, filed on Apr. 19, 2022, provisional application No. 63/232,041, filed on Aug. 11, 2021.

(56) References Cited

U.S. PATENT DOCUMENTS

| | | | | |
|---|---|---|---|---|
| 9,524,392 | B2 | 12/2016 | Naehrig et al. | |
| 9,830,464 | B2 * | 11/2017 | Busch | H04L 9/0618 |
| 10,963,786 | B1 | 3/2021 | Taylor et al. | |
| 2004/0202322 | A1 | 10/2004 | Chavanne et al. | |
| 2014/0064479 | A1 | 3/2014 | Manikandan et al. | |
| 2017/0251212 | A1 | 8/2017 | Swaminathan et al. | |
| 2017/0316162 | A1 | 11/2017 | Wall Warner et al. | |
| 2018/0196609 | A1 | 7/2018 | Niesen | |
| 2020/0395955 | A1 | 12/2020 | Choi et al. | |
| 2021/0133577 | A1 | 5/2021 | Srinivasan et al. | |
| 2021/0287404 | A1 | 9/2021 | Chang et al. | |
| 2022/0376703 | A1 * | 11/2022 | Pope | G06N 3/0495 |

* cited by examiner

Storing Data

801 Receive data

802 Deconstruct data into sourceblocks

803 Pass sourceblocks to library management module

804 Receive reference codes from library management module

805 Create codewords

806 Store codewords

800

Receive input data
4001

Create a transformation matrix
4002

For each state in the input data, use the transformation matrix to determine the probability distribution for transforming the state to other states
4003

Use a secure random number generator to select a transformation based on the probabilities in the transformation matrix
4004

Reshape the data distribution to approach a dyadic distribution based on the selected transformation(s)
4005

Keep track of the applied transformations, generating a secondary data stream
4006

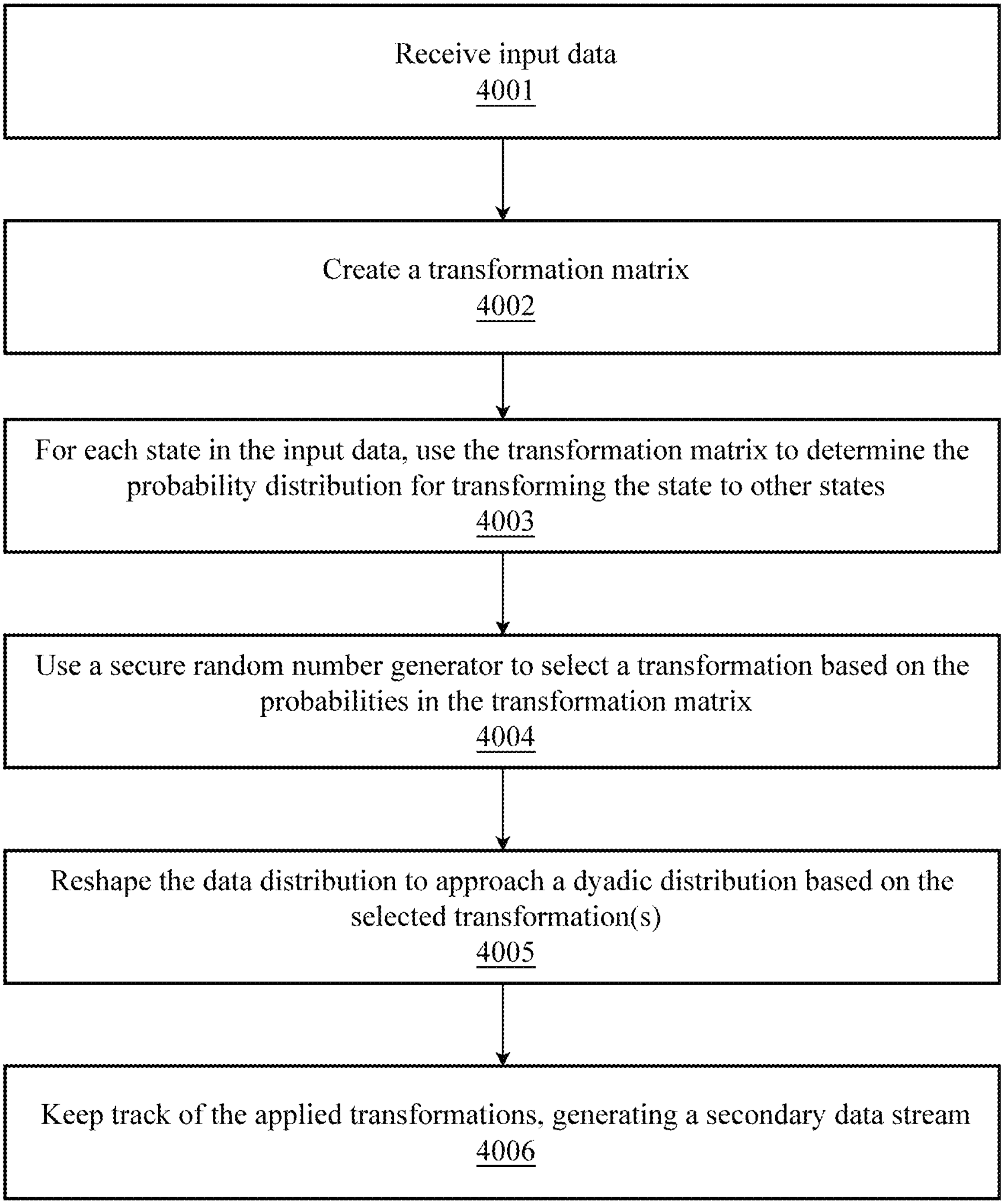

SYSTEM AND METHOD FOR DISTRIBUTED NODE-BASED DATA COMPACTION WITH DYADIC DISTRIBUTION-BASED COMPRESSION AND ENCRYPTION

CROSS-REFERENCE TO RELATED APPLICATIONS

Priority is claimed in the application data sheet to the following patents or patent applications, each of which is expressly incorporated herein by reference in its entirety:

Ser. No. 18/770,652
Ser. No. 18/503,135
Ser. No. 18/305,305
Ser. No. 18/190,044
Ser. No. 17/875,201
Ser. No. 17/514,913
Ser. No. 17/404,699
63/388,411
63/485,518
63/232,041
Ser. No. 18/530,147
Ser. No. 18/303,399
63/332,533

BACKGROUND OF THE INVENTION

Field of the Invention

The present invention is in the field of computer data processing, storage, and transmission, and in particular to the field of data compaction using a distributed node-based consensus pool.

Discussion of the State of the Art

Blockchain technology and the cryptocurrencies it supports are undoubtedly here to stay. However, adoption is slow, in part because of the energy consumption and network congestion it creates. While a few iterations and forks have attempted to lower the barriers to adoption, the energy consumption and congestion remain. Thus, blockchain still has a core problem: it requires a large throughput of network data and a large volume of storage capacity.

Data compression does not solve these problems with blockchain because speed and timing are everything in most of the incentivized proof systems, e.g., proof-of-work. Crypto-mining is a race to be first and anything that slows the mining process down is seen as undesirable.

What is needed is a fundamentally new approach to blockchain data transmission and proof validation systems, that allows for dramatically faster transfer rates and validation computations.

SUMMARY OF THE INVENTION

A system and method for distributed node-based data compaction with dyadic distribution-based compression and encryption. The system uses machine learning on data chunks to generate codebooks which is then used to compact the data. The data can then be stored, processed, or sent with a smaller data profile than that of uncompacted data. The system uses a data compaction layer on an existing blockchain fork or in a new blockchain protocol from which nodes that wish to or need to store the blockchain can do so with a significantly smaller storage requirement. The system uses data compaction across all nodes in the consensus pool to increase the speed of and decrease the size of a blockchain's data packets. The system uses data compaction firmware to increase the efficiency at which mining rigs can computationally validate new blocks on the blockchain. The system can be implemented using any combination of the three data compaction services to meet the needs of the desired blockchain technology.

According to a first preferred embodiment, A computer system comprising: a hardware memory, wherein the computer system is configured to execute software instructions stored on non-transitory machine-readable storage media that: store a unified codebook in memory, the unified codebook associating data patterns with both compression codes and encryption parameters; receive data along with processing requirements indicating a desired balance between compression efficiency and security level; select a processing mode from multiple available modes based on the processing requirements; deconstruct the received data into blocks for processing; when encryption is not required, compress the blocks using the unified codebook; when encryption is required; transform the blocks using mathematical operations that provide cryptographic properties while maintaining compressibility; generate output data that combines compression and encryption based on the selected processing mode; and optionally separate transformation information from compressed data based on security requirements; transmit or store the processed data; reconstruct original or approximate data from the processed data using mode-appropriate algorithms and the unified codebook; synchronize codebook updates across distributed processing nodes when operating in a distributed environment; and adapt processing parameters based on data characteristics and system performance metrics, is disclosed.

According to a second preferred embodiment, a method for distributed node-based data compaction with encryption, comprising the steps of: storing a unified codebook in memory, the unified codebook associating data patterns with both compression codes and encryption parameters; receiving data along with processing requirements indicating a desired balance between compression efficiency and security level; selecting a processing mode from multiple available modes based on the processing requirements; deconstructing the received data into blocks for processing; when encryption is not required, compressing the blocks using the unified codebook; when encryption is required; transforming the blocks using mathematical operations that provide cryptographic properties while maintaining compressibility; generating output data that combines compression and encryption based on the selected processing mode; and optionally separating transformation information from compressed data based on security requirements; transmitting or storing the processed data; reconstructing original or approximate data from the processed data using mode-appropriate algorithms and the unified codebook; synchronizing codebook updates across distributed processing nodes when operating in a distributed environment; and adapting processing parameters based on data characteristics and system performance metrics.

According to one aspect, the deconstruction of the blockchain block generates a sourceblock and association not in the second reference codebook, add the sourceblock and association to the second reference codebook.

According to one aspect, the blockchain compaction module further causes each of the multi-core processors to store a second reconstruction algorithm in the memory of each of the blockchain computing nodes, wherein the second reconstruction algorithm, when operating on each of the multi-core processors, causes the multi-core processors to reconstruct the blockchain block by decoding the second plurality of sourceblocks using the second reference codebook.

According to one aspect, the system further comprises a proof system compaction firmware, comprising a third plurality of programming instructions stored in the memory and operating on the multi-core processor on each of the blockchain computing nodes, wherein the third plurality of programming instructions, when operating on each of the multi-core processors, cause each of the multi-core processors to: store a third reference codebook embedded as firmware in the memory of each core in each of the multi-core processors, the third reference codebook pretrained by machine learning to determine sourceblocks and to associate codewords to each sourceblock; store a third deconstruction algorithm embedded as firmware in the memory of each core in each of the multi-core processors, wherein the third deconstruction algorithm, when operating on each core, cause the multi-core processors to: receive data intended for a different core; deconstruct the data intended for a different core into a third plurality of sourceblocks; encode the third plurality of sourceblocks into a third codeword using the third reference codebook; and send the third codeword to the intended core; and store a third reconstruction algorithm embedded as firmware in the memory of each core in each of the multi-core processors, wherein the third reconstruction algorithm, when operating on each core, cause the multi-core processors to: receive the third codeword at the intended core; and reconstruct the data intended for a different core by decoding the third plurality of sourceblocks using the third reference codebook.

According to one aspect, the deconstruction of data intended for a different core generates a sourceblock and association not in the third reference codebook, attach the sourceblock and association to the third codeword, the third reconstruction algorithm updating the third reference codebook.

According to one aspect, each reference codebook is stored as a blockchain.

According to one aspect, the blockchain data compaction system is implemented as a unique blockchain protocol.

According to one aspect, the blockchain data compaction system is implemented in a fork of an existing blockchain protocol.

According to one aspect, the blockchain compaction module permanently deletes a portion from one or more reference codebooks to redact information on the blockchain.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary, and are not to be considered as limiting of the scope of the invention or the claims herein in any way.

FIG. 40 is a flow diagram illustrating an exemplary method for implementing a dyadic distribution algorithm, according to an aspect.

Figure 44:
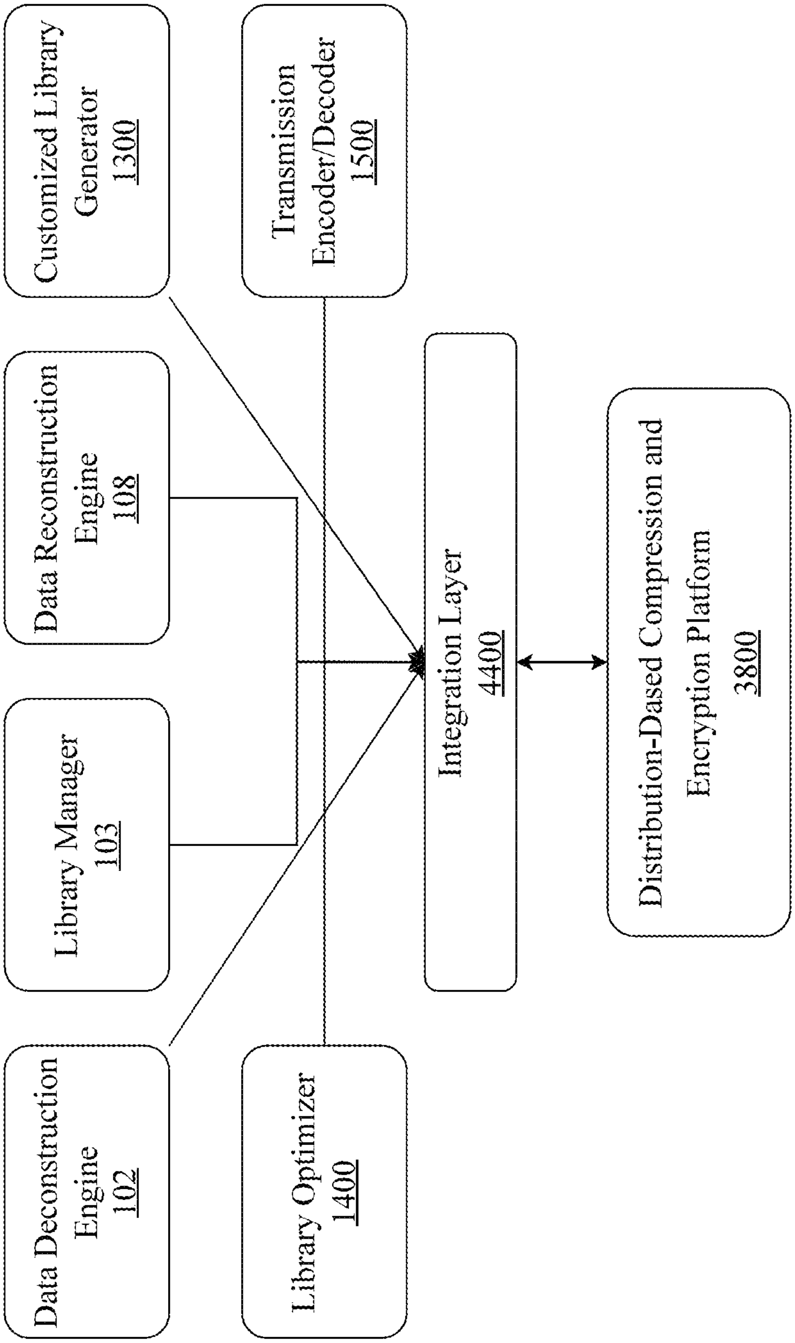
Figure 45:
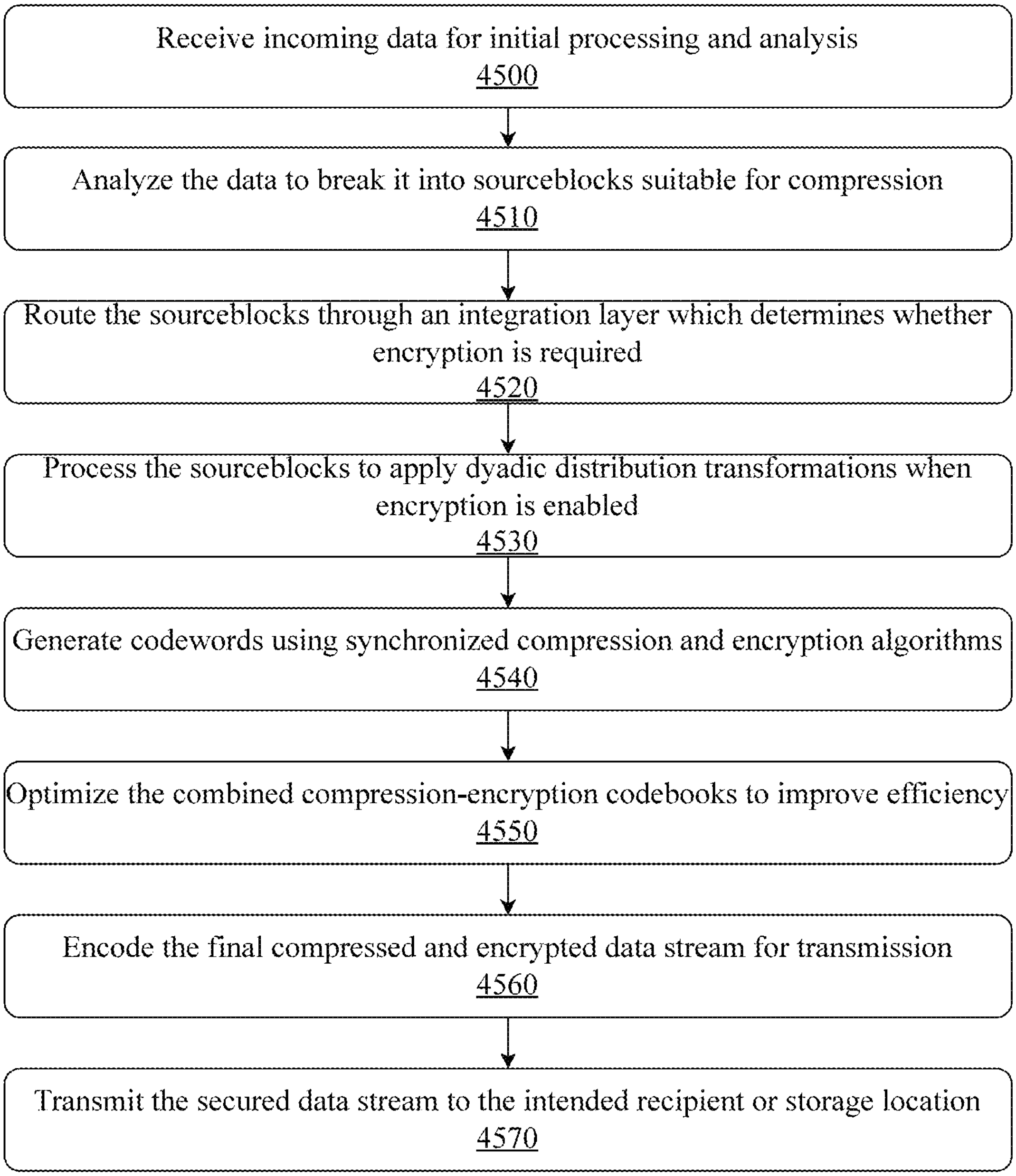

FIG. 44 a block diagram illustrating an exemplary system architecture for integrating a dyadic distribution-based compression and encryption platform with existing data compaction components FIG. 45 is a flow diagram illustrating an exemplary method for encrypted data compression and transmission.

Figure 46:
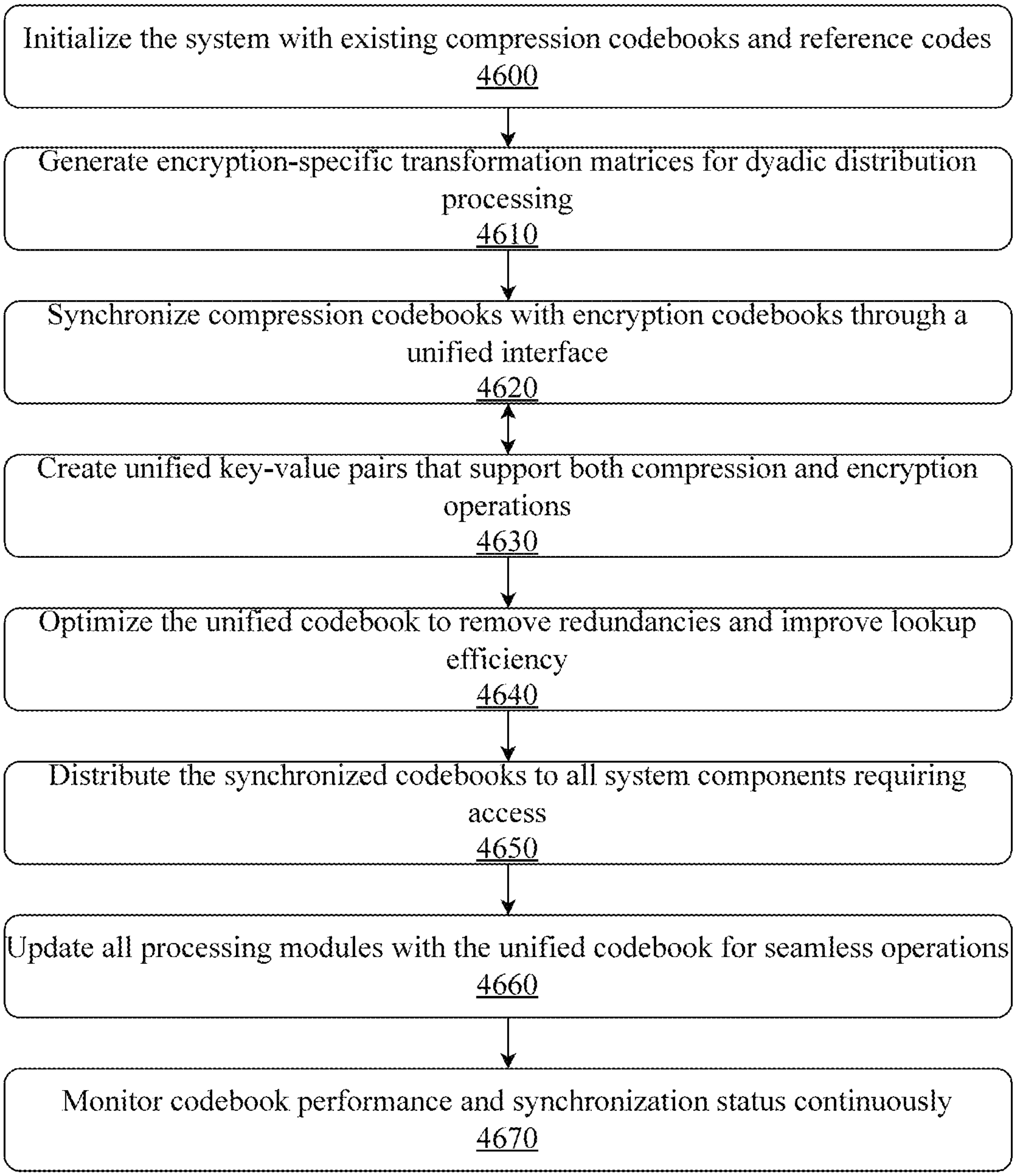

FIG. 46 is a flow diagram illustrating an exemplary method for unified codebook synchronization for compression and encryption.

Figure 47:
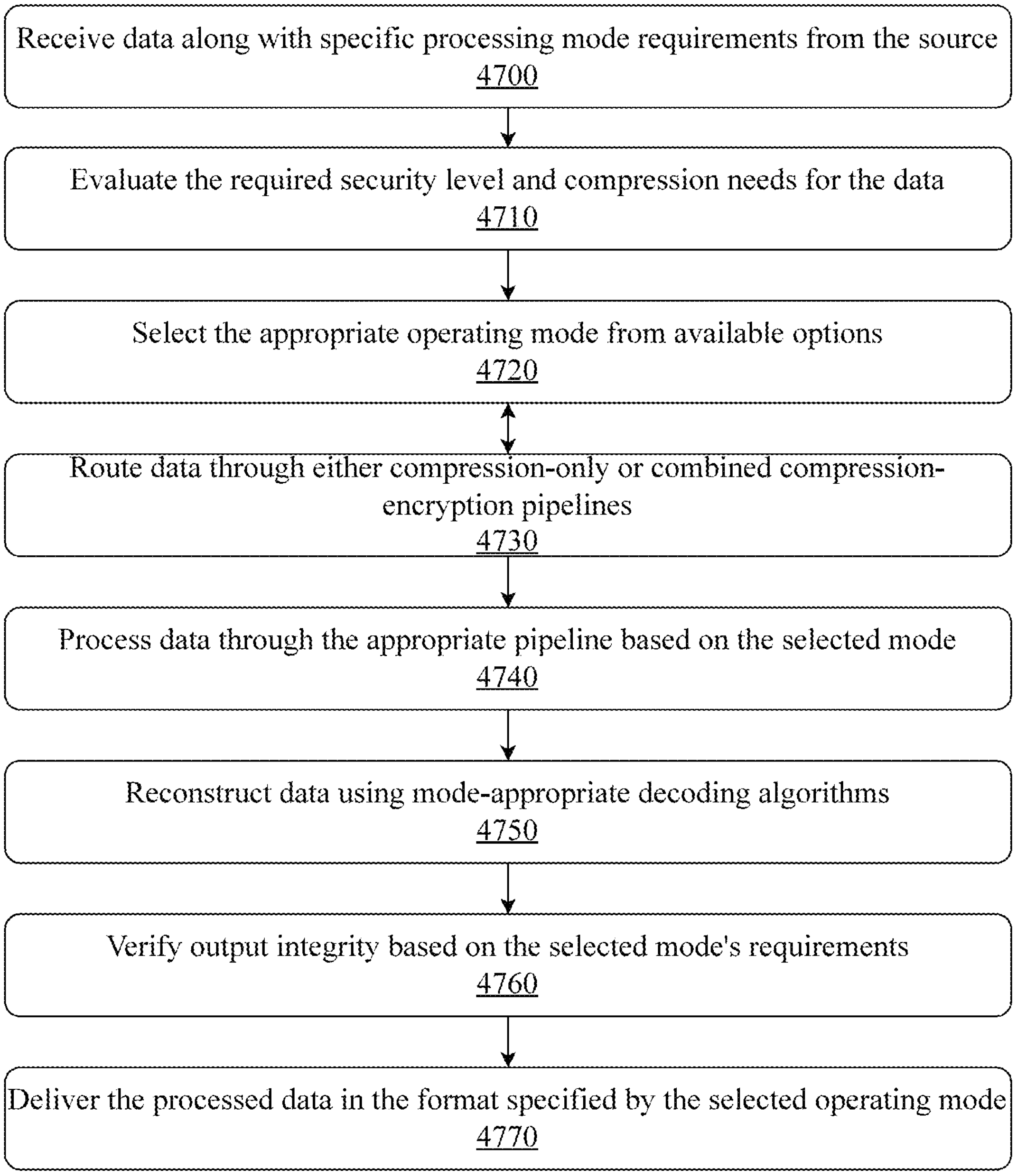

FIG. 47 is a flow diagram illustrating an exemplary method for selective mode-based data processing.

Figure 48:
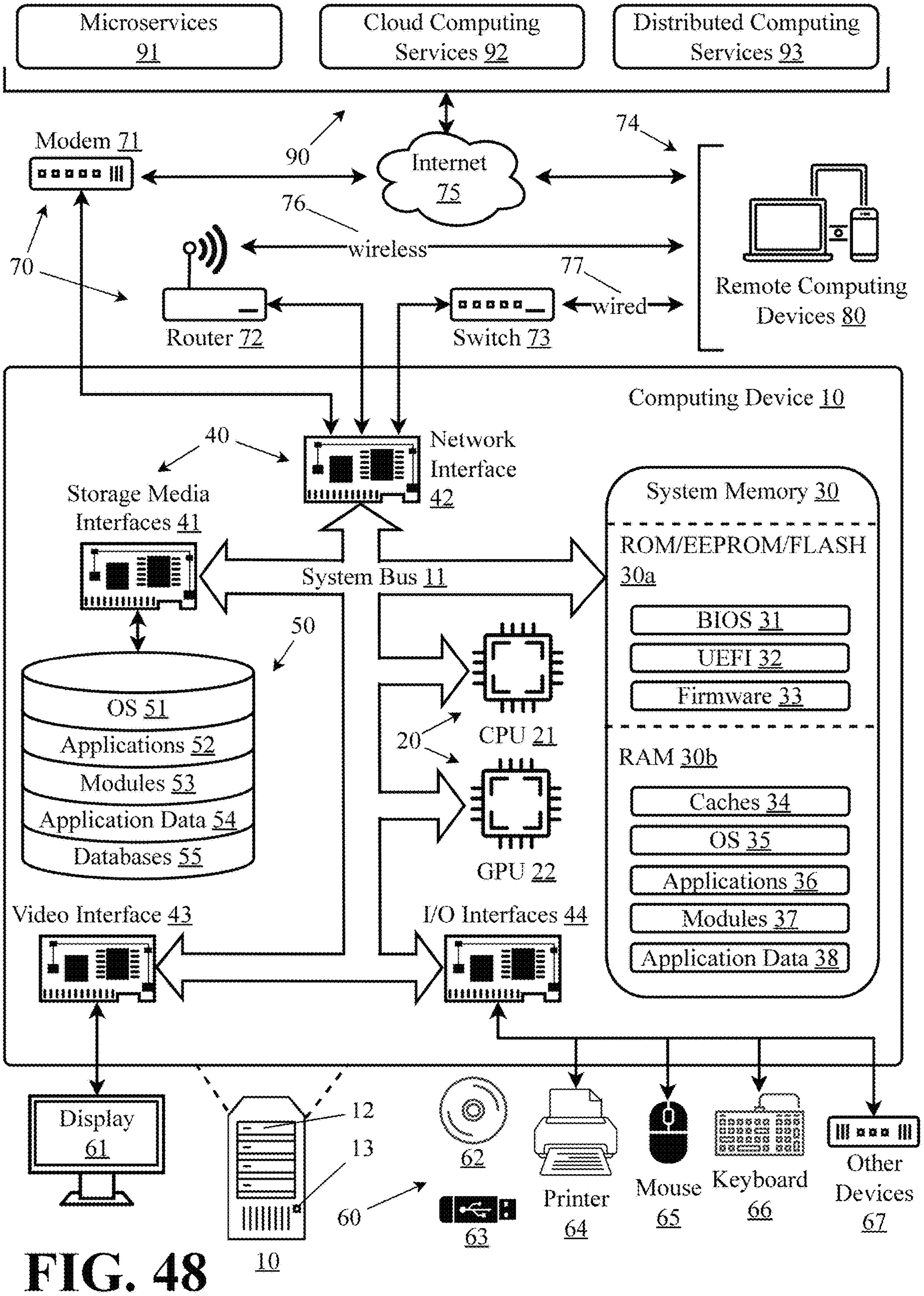

FIG. 48 illustrates an exemplary computing environment on which an embodiment described herein may be implemented, in full or in part.

DETAILED DESCRIPTION OF THE INVENTION

The inventor has conceived, and reduced to practice, a system and method for distributed node-based data compaction with dyadic distribution-based compression and encryption. The system uses machine learning on data chunks to generate codebooks which is then used to compact the data. The data can then be stored, processed, or sent with a smaller data profile than that of uncompacted data. The system uses a data compaction layer on an existing blockchain fork or in a new blockchain protocol from which nodes that wish to or need to store the blockchain can do so with a significantly smaller storage requirement. The system uses data compaction across all nodes in the consensus pool to increase the speed of and decrease the size of a blockchain's data packets. The system uses data compaction firmware to increase the efficiency at which mining rigs can computationally validate new blocks on the blockchain. The system can be implemented using any combination of the three data compaction services to meet the needs of the desired blockchain technology.

By using extremely low latency artificial intelligence—(AI-) driven encoding techniques, one may achieve large decreases in the number of bits that need to be transported in order to move the same data. The economic effect is greatest when encoding data that needs to move outside of a processor component onto other boards or racks, but even within a component, between die, or within the chip itself the economic effects are appreciable. According to various aspects, machine learning/AI data compaction technology provides a radically new way to reduce the size of data dramatically and securely; its architecture, lightweight code, speed, and high efficiency make it potentially useful for application to semiconductors. In some applications, the latency bound may be 400× faster than the speed of the fastest compression algorithms, and encoded machine-generated data may be 60-80% smaller than the original. Unlike traditional data compression, the invention according to an aspect may operate on very small data units of a few bytes, and the technology is instant-on; data files generated by the source are virtually simultaneously encoded, transported and regenerated at the destination.

According to an aspect, training data is used to identify patterns in data prior to embedding code or programming firmware in a semiconductor. These patterns and their associated, smaller indices, or codewords, are stored in a codebook that is replicated on both the sending and receiving bus, along with a light code according to an aspect. In processing live data, only codewords, much smaller than the original data, are transferred between buses. Compaction is a stepless process that operates as fast as the data is created, a key component of its extreme low latency performance. As source data is generated, it is encoded and the codewords are sent; at the destination, codewords are decoded and the original data is instantaneously rebuilt, even as the file is still being generated at the source. The computationally-intensive tasks of searching for patterns in data is performed in advance of embedding; in live semiconductor operation, the tasks involved consist primarily of lookups, which are light and fast.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods, and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

The term "bit" refers to the smallest unit of information that can be stored or transmitted. It is in the form of a binary digit (either 0 or 1). In terms of hardware, the bit is represented as an electrical signal that is either off (representing 0) or on (representing 1).

The term "byte" refers to a series of bits exactly eight bits in length.

The term "codebook" refers to a database containing sourceblocks each with a pattern of bits and reference code unique within that library. The terms "library" and "encoding/decoding library" are synonymous with the term codebook.

The terms "compression" and "deflation" as used herein mean the representation of data in a more compact form than the original dataset. Compression and/or deflation may be either "lossless", in which the data can be reconstructed in its original form without any loss of the original data, or "lossy" in which the data can be reconstructed in its original form, but with some loss of the original data.

The terms "compression factor" and "deflation factor" as used herein mean the net reduction in size of the compressed data relative to the original data (e.g., if the new data is 70% of the size of the original, then the deflation/compression factor is 30% or 0.3.)

The terms "compression ratio" and "deflation ratio", and as used herein all mean the size of the original data relative to the size of the compressed data (e.g., if the new data is 70% of the size of the original, then the deflation/compression ratio is 70% or 0.7.)

The term "data" means information in any computer-readable form.

The term "data set" refers to a grouping of data for a particular purpose. One example of a data set might be a word processing file containing text and formatting information.

The term "effective compression" or "effective compression ratio" refers to the additional amount data that can be stored using the method herein described versus conventional data storage methods. Although the method herein described is not data compression, per se, expressing the additional capacity in terms of compression is a useful comparison.

The term "sourcepacket" as used herein means a packet of data received for encoding or decoding. A sourcepacket may be a portion of a data set.

The term "sourceblock" as used herein means a defined number of bits or bytes used as the block size for encoding or decoding. A sourcepacket may be divisible into a number of sourceblocks. As one non-limiting example, a 1 megabyte sourcepacket of data may be encoded using 512 byte sourceblocks. The number of bits in a sourceblock may be dynamically optimized by the system during operation. In one aspect, a sourceblock may be of the same length as the block size used by a particular file system, typically 512 bytes or 4,096 bytes.

The term "codeword" refers to the reference code form in which data is stored or transmitted in an aspect of the system. A codeword consists of a reference code to a sourceblock in the library plus an indication of that sourceblock's location in a particular data set.

Conceptual Architecture

Figure 1:
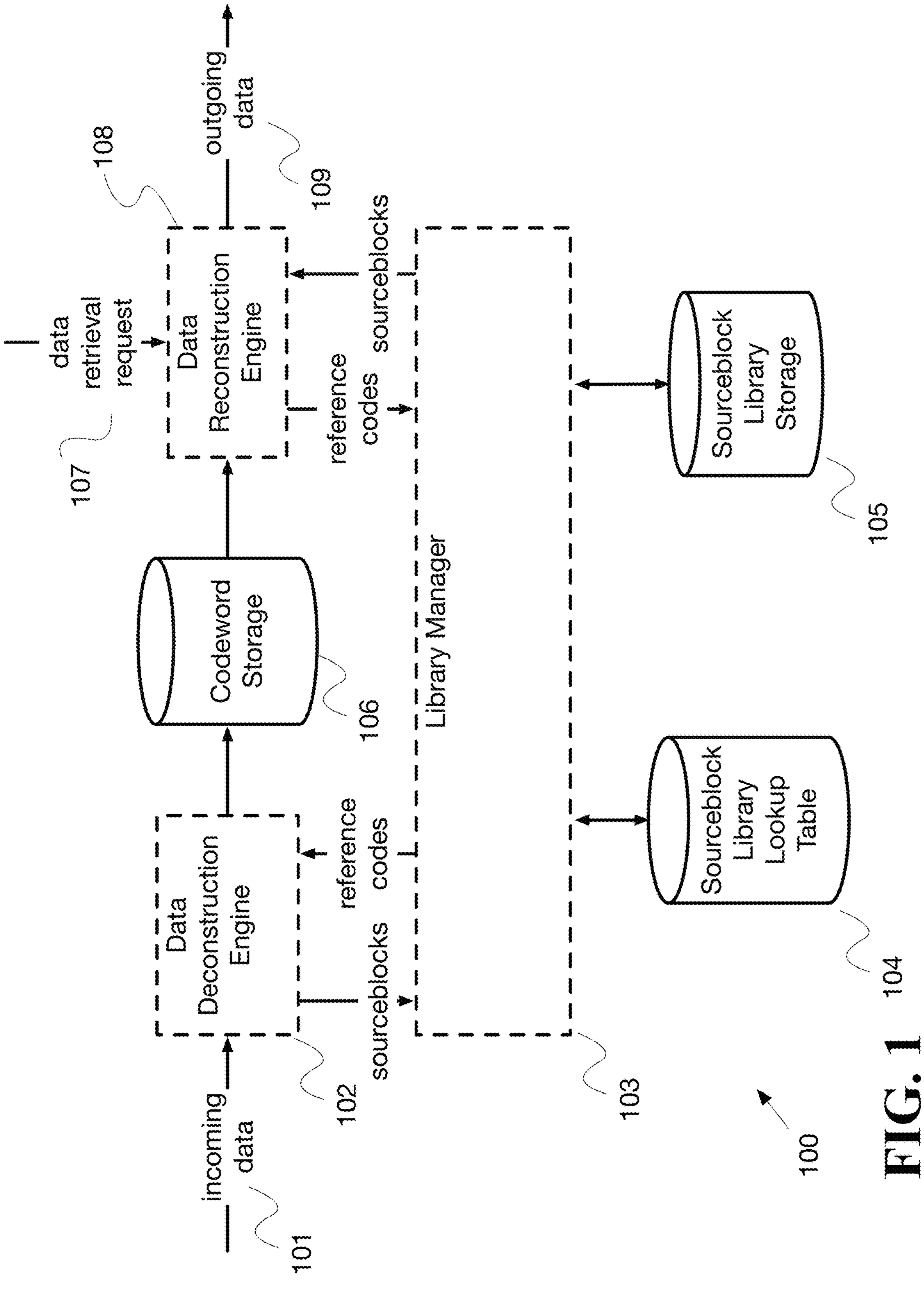
FIG. 1 is a diagram showing an embodiment of the system in which all components of the system are operated locally.

FIG. 1 is a diagram showing an embodiment 100 of the system in which all components of the system are operated locally. As incoming data 101 is received by data deconstruction engine 102. Data deconstruction engine 102 breaks the incoming data into sourceblocks, which are then sent to library manager 103. Using the information contained in sourceblock library lookup table 104 and sourceblock library storage 105, library manager 103 returns reference codes to data deconstruction engine 102 for processing into codewords, which are stored in codeword storage 106. When a data retrieval request 107 is received, data reconstruction engine 108 obtains the codewords associated with the data from codeword storage 106, and sends them to library manager 103. Library manager 103 returns the appropriate sourceblocks to data reconstruction engine 108, which assembles them into the proper order and sends out the data in its original form 109.

Figure 2:
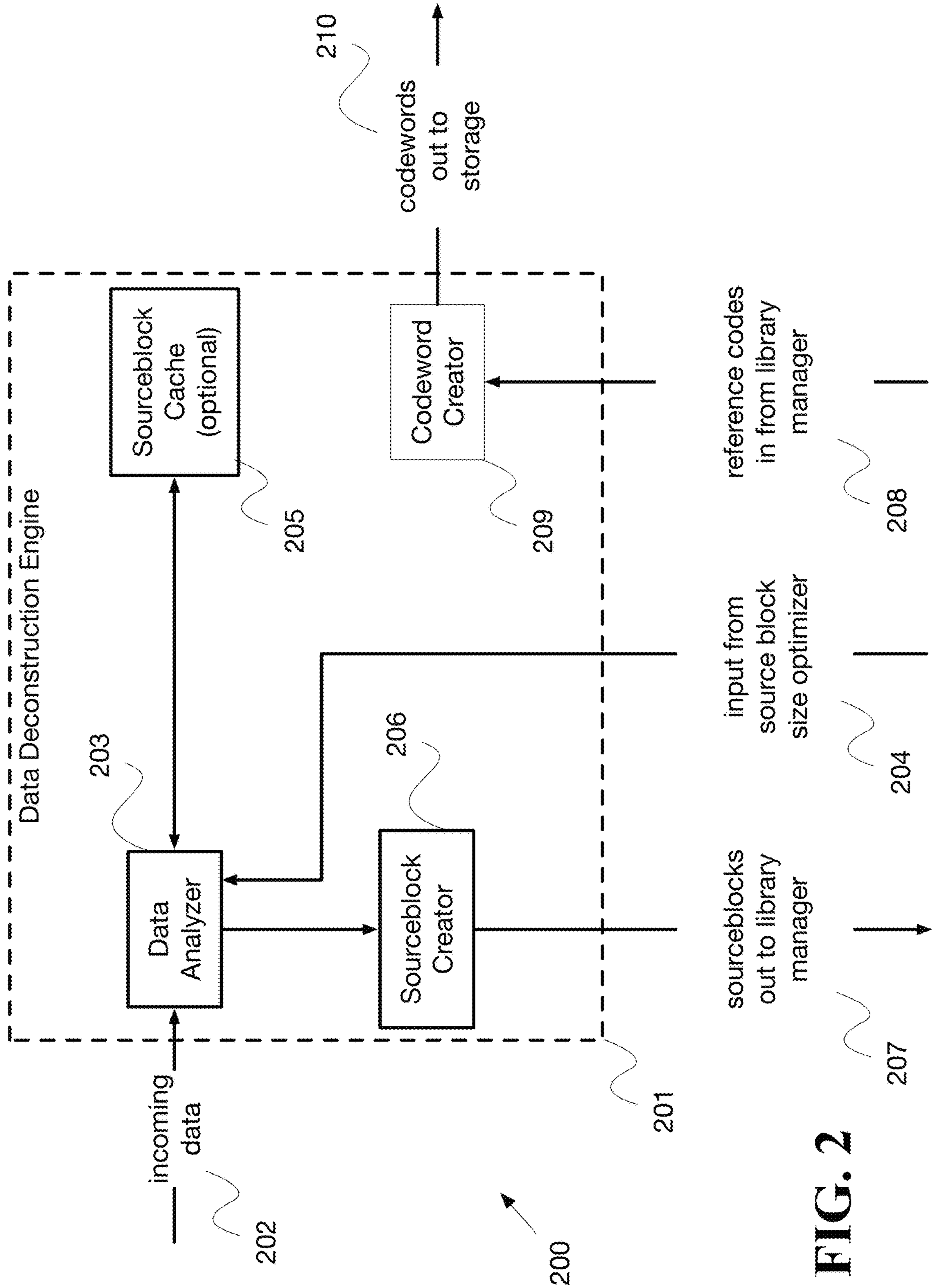
FIG. 2 is a diagram showing an embodiment of one aspect of the system, the data deconstruction engine.

FIG. 2 is a diagram showing an embodiment of one aspect 200 of the system, specifically data deconstruction engine 201. Incoming data 202 is received by data analyzer 203, which optimally analyzes the data based on machine learning algorithms and input 204 from a sourceblock size optimizer, which is disclosed below. Data analyzer may optionally have access to a sourceblock cache 205 of recently-processed sourceblocks, which can increase the speed of the system by avoiding processing in library manager 103. Based on information from data analyzer 203, the data is broken into sourceblocks by sourceblock creator 206, which sends sourceblocks 207 to library manager 203 for additional processing. Data deconstruction engine 201 receives reference codes 208 from library manager 103, corresponding to the sourceblocks in the library that match the sourceblocks sent by sourceblock creator 206, and codeword creator 209 processes the reference codes into codewords comprising a reference code to a sourceblock and a location of that sourceblock within the data set. The original data may be discarded, and the codewords representing the data are sent out to storage 210.

Figure 3:
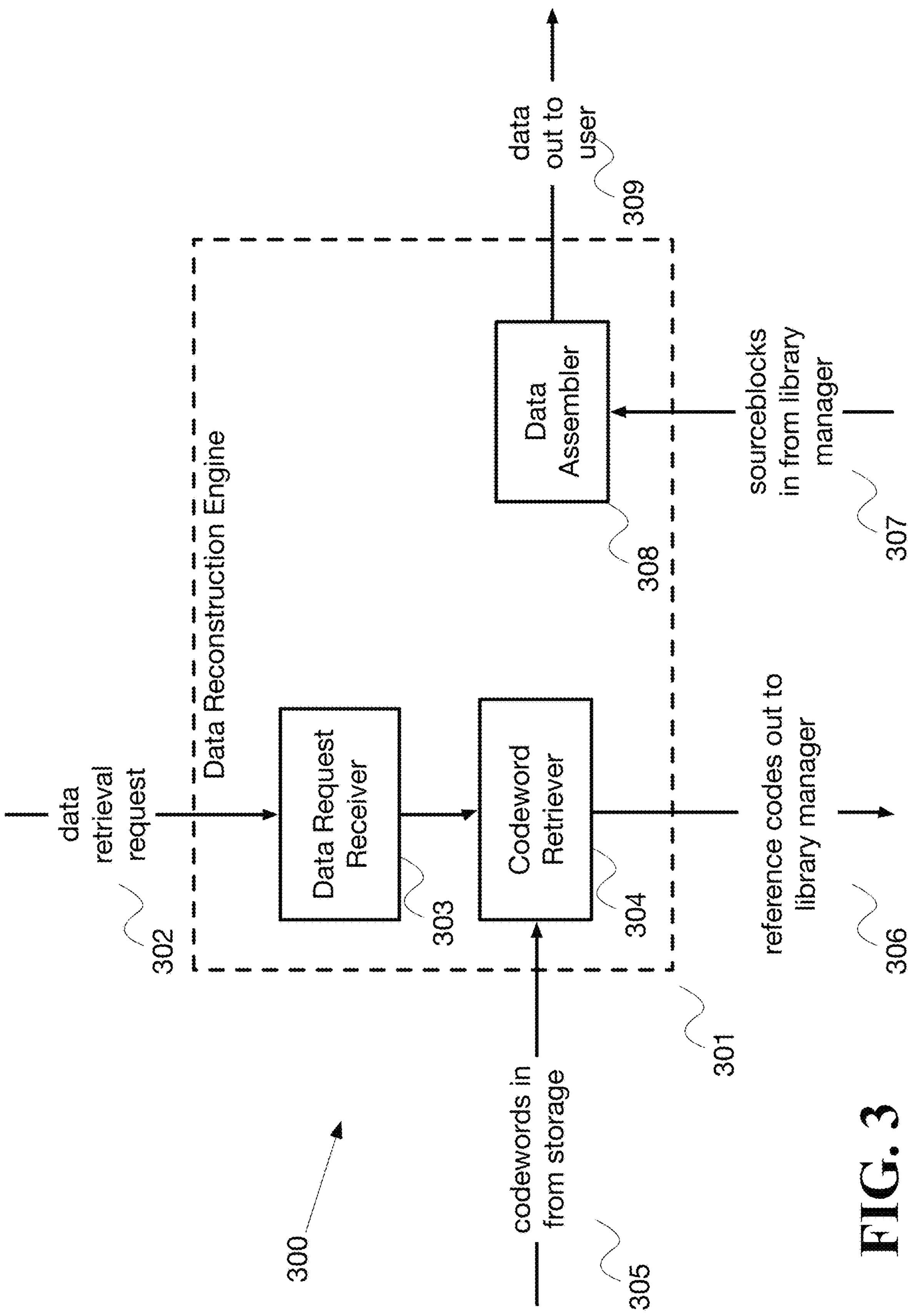
FIG. 3 is a diagram showing an embodiment of one aspect of the system, the data reconstruction engine.

FIG. 3 is a diagram showing an embodiment of another aspect of system 300, specifically data reconstruction engine 301. When a data retrieval request 302 is received by data request receiver 303 (in the form of a plurality of codewords corresponding to a desired final data set), it passes the information to data retriever 304, which obtains the requested data 305 from storage. Data retriever 304 sends, for each codeword received, a reference codes from the codeword 306 to library manager 103 for retrieval of the specific sourceblock associated with the reference code. Data assembler 308 receives the sourceblock 307 from library manager 103 and, after receiving a plurality of sourceblocks corresponding to a plurality of codewords, assembles them into the proper order based on the location information contained in each codeword (recall each codeword comprises a sourceblock reference code and a location identifier that specifies where in the resulting data set the specific sourceblock should be restored to. The requested data is then sent to user 309 in its original form.

Figure 4:
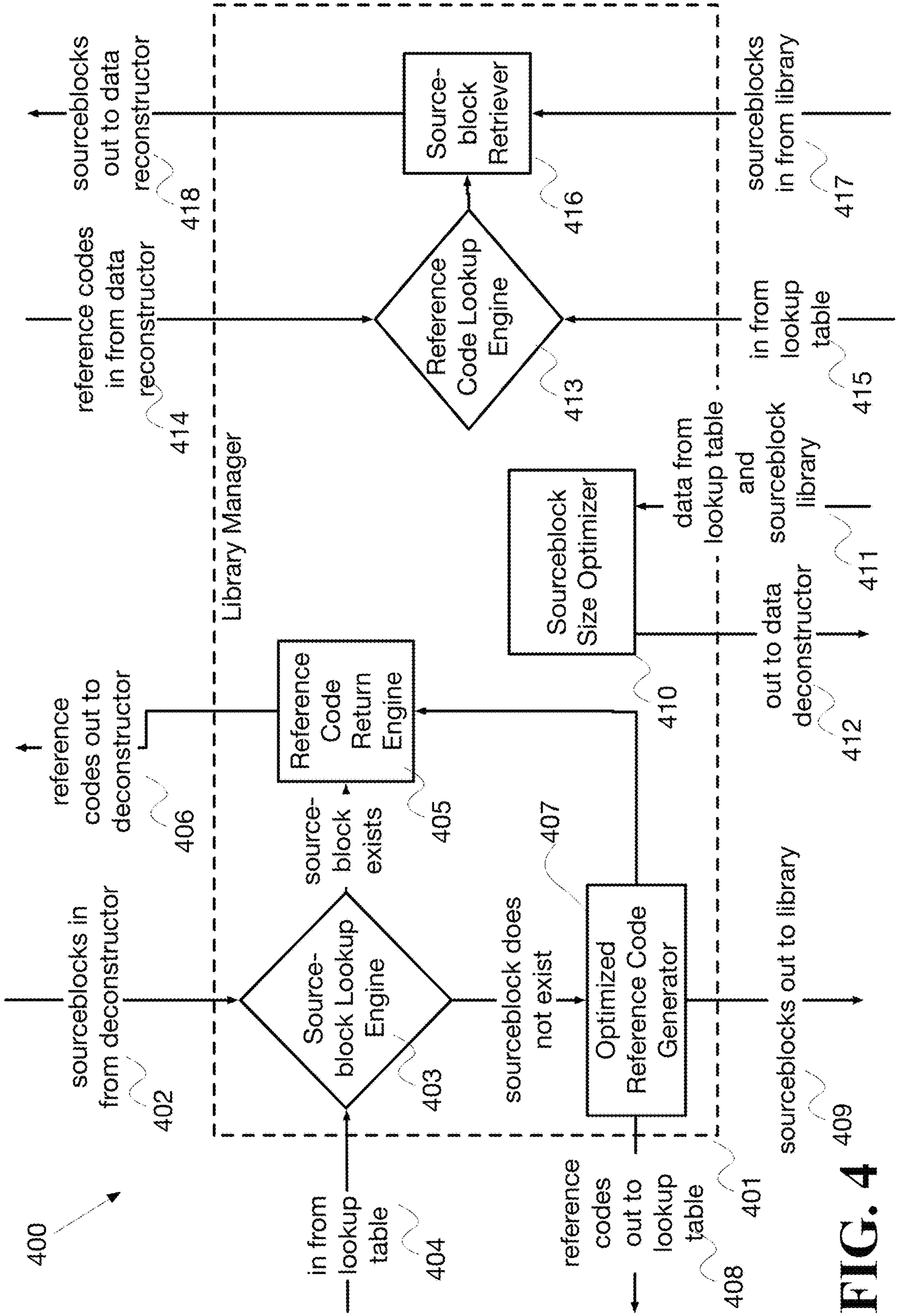
FIG. 4 is a diagram showing an embodiment of one aspect of the system, the library management module.

FIG. 4 is a diagram showing an embodiment of another aspect of the system 400, specifically library manager 401. One function of library manager 401 is to generate reference codes from sourceblocks received from data deconstruction engine 301. As sourceblocks are received 402 from data deconstruction engine 301, sourceblock lookup engine 403 checks sourceblock library lookup table 404 to determine whether those sourceblocks already exist in sourceblock library storage 105. If a particular sourceblock exists in sourceblock library storage 105, reference code return engine 405 sends the appropriate reference code 406 to data deconstruction engine 301. If the sourceblock does not exist in sourceblock library storage 105, optimized reference code generator 407 generates a new, optimized reference code based on machine learning algorithms. Optimized reference code generator 407 then saves the reference code 408 to sourceblock library lookup table 104; saves the associated sourceblock 409 to sourceblock library storage 105; and passes the reference code to reference code return engine 405 for sending 406 to data deconstruction engine 301. Another function of library manager 401 is to optimize the size of sourceblocks in the system. Based on information 411 contained in sourceblock library lookup table 104, sourceblock size optimizer 410 dynamically adjusts the size of sourceblocks in the system based on machine learning algorithms and outputs that information 412 to data analyzer 203. Another function of library manager 401 is to return sourceblocks associated with reference codes received from data reconstruction engine 301. As reference codes are received 414 from data reconstruction engine 301, reference code lookup engine 413 checks sourceblock library lookup table 415 to identify the associated sourceblocks; passes that information to sourceblock retriever 416, which obtains the sourceblocks 417 from sourceblock library storage 105; and passes them 418 to data reconstruction engine 301.

Figure 5:
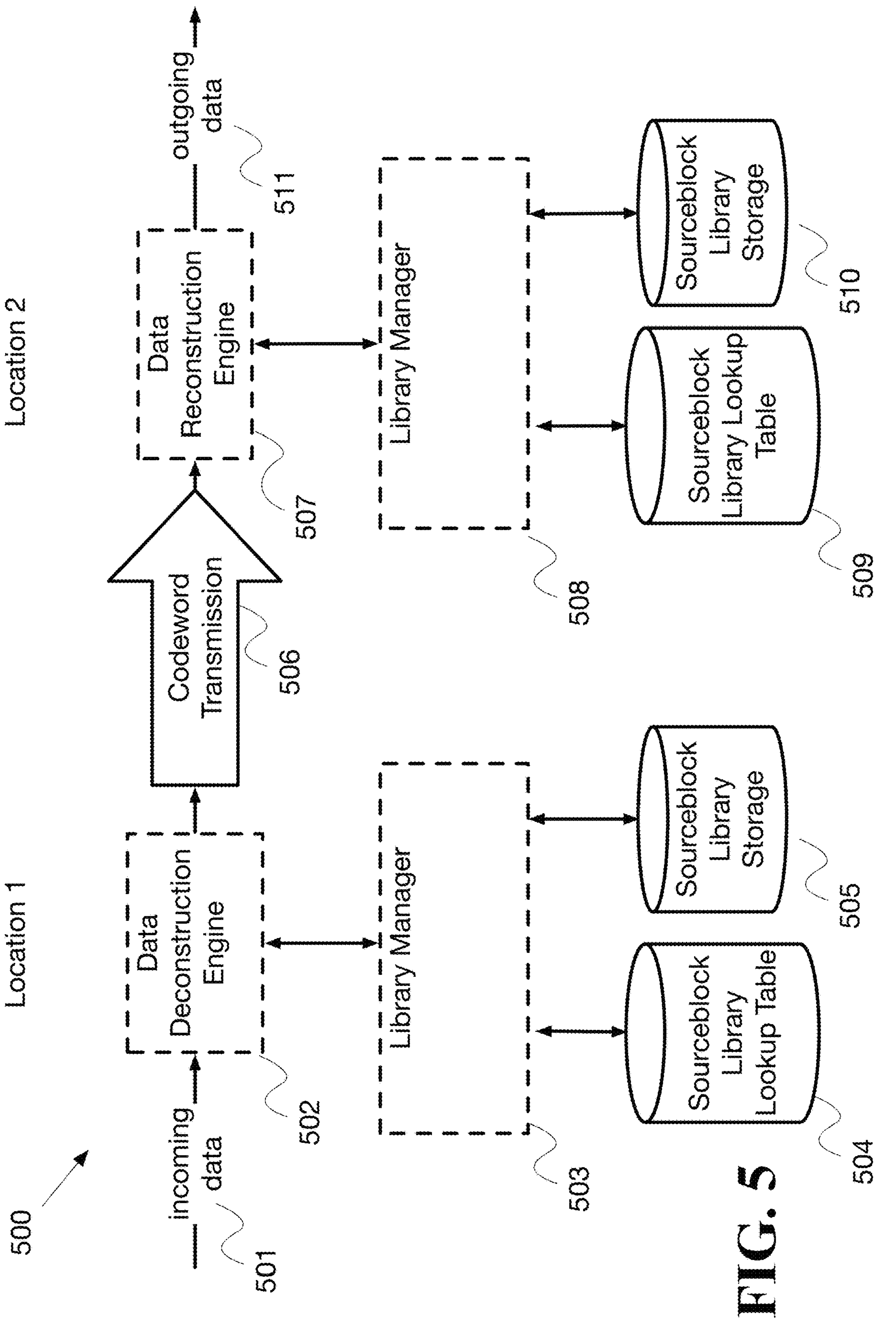
FIG. 5 is a diagram showing another embodiment of the system in which data is transferred between remote locations.

FIG. 5 is a diagram showing another embodiment of system 500, in which data is transferred between remote locations. As incoming data 501 is received by data deconstruction engine 502 at Location 1, data deconstruction engine 301 breaks the incoming data into sourceblocks, which are then sent to library manager 503 at Location 1. Using the information contained in sourceblock library lookup table 504 at Location 1 and sourceblock library storage 505 at Location 1, library manager 503 returns reference codes to data deconstruction engine 301 for processing into codewords, which are transmitted 506 to data reconstruction engine 507 at Location 2. In the case where the reference codes contained in a particular codeword have been newly generated by library manager 503 at Location 1, the codeword is transmitted along with a copy of the associated sourceblock. As data reconstruction engine 507 at Location 2 receives the codewords, it passes them to library manager module 508 at Location 2, which looks up the sourceblock in sourceblock library lookup table 509 at Location 2, and retrieves the associated from sourceblock library storage 510. Where a sourceblock has been transmitted along with a codeword, the sourceblock is stored in sourceblock library storage 510 and sourceblock library lookup table 504 is updated. Library manager 503 returns the appropriate sourceblocks to data reconstruction engine 507, which assembles them into the proper order and sends the data in its original form 511.

Figure 6:
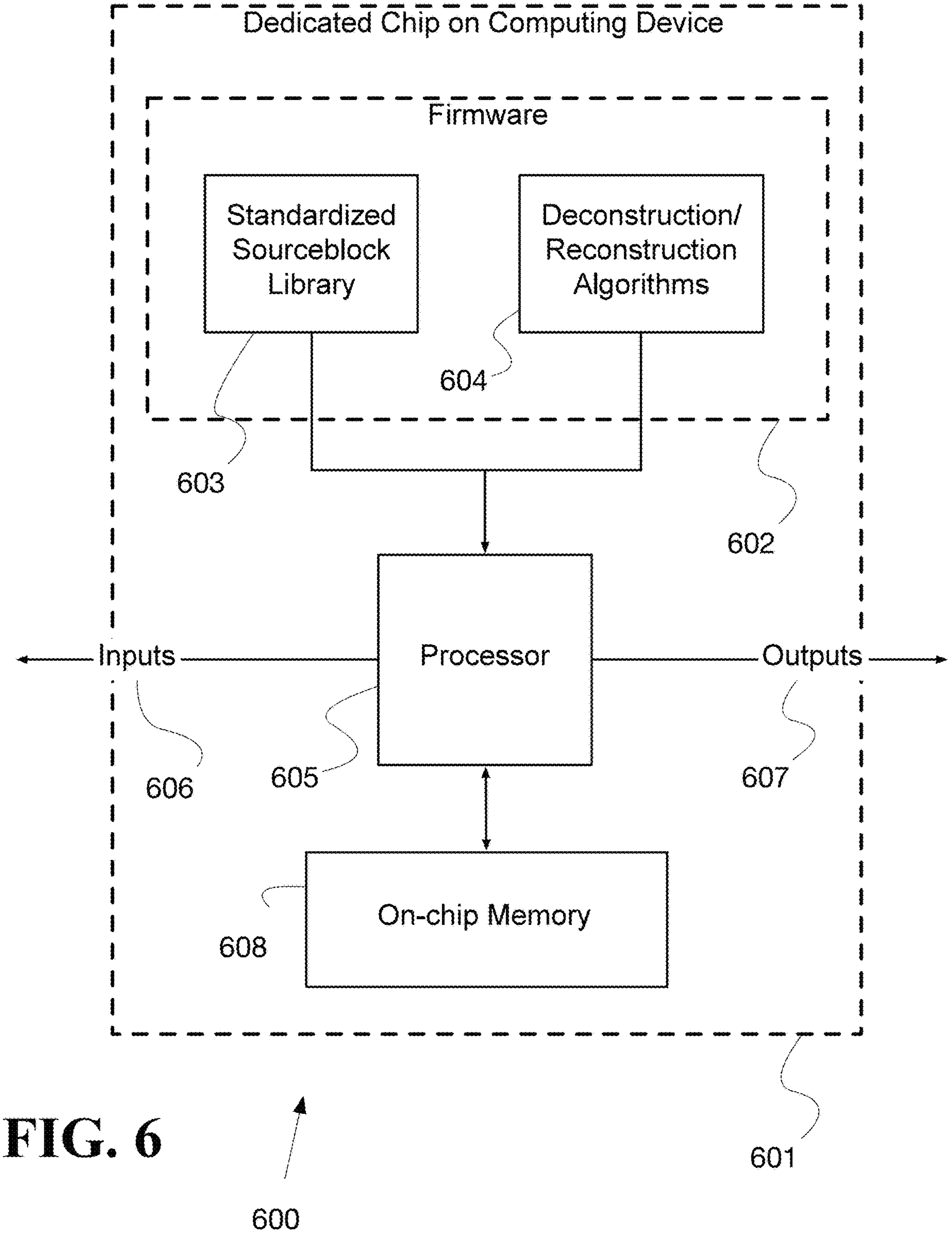
FIG. 6 is a diagram showing an embodiment in which a standardized version of the sourceblock library and associated algorithms would be encoded as firmware on a dedicated processing chip included as part of the hardware of a plurality of devices.

FIG. 6 is a diagram showing an embodiment 600 in which a standardized version of a sourceblock library 603 and associated algorithms 604 would be encoded as firmware 602 on a dedicated processing chip 601 included as part of the hardware of a plurality of devices 600. Contained on dedicated chip 601 would be a firmware area 602, on which would be stored a copy of a standardized sourceblock library 603 and deconstruction/reconstruction algorithms 604 for processing the data. Processor 605 would have both inputs 606 and outputs 607 to other hardware on the device 600. Processor 605 would store incoming data for processing on on-chip memory 608, process the data using standardized sourceblock library 603 and deconstruction/reconstruction algorithms 604, and send the processed data to other hardware on device 600. Using this embodiment, the encoding and decoding of data would be handled by dedicated chip 601, keeping the burden of data processing off device's 600 primary processors. Any device equipped with this embodiment would be able to store and transmit data in a highly optimized, bandwidth-efficient format with any other device equipped with this embodiment.

Figure 12:
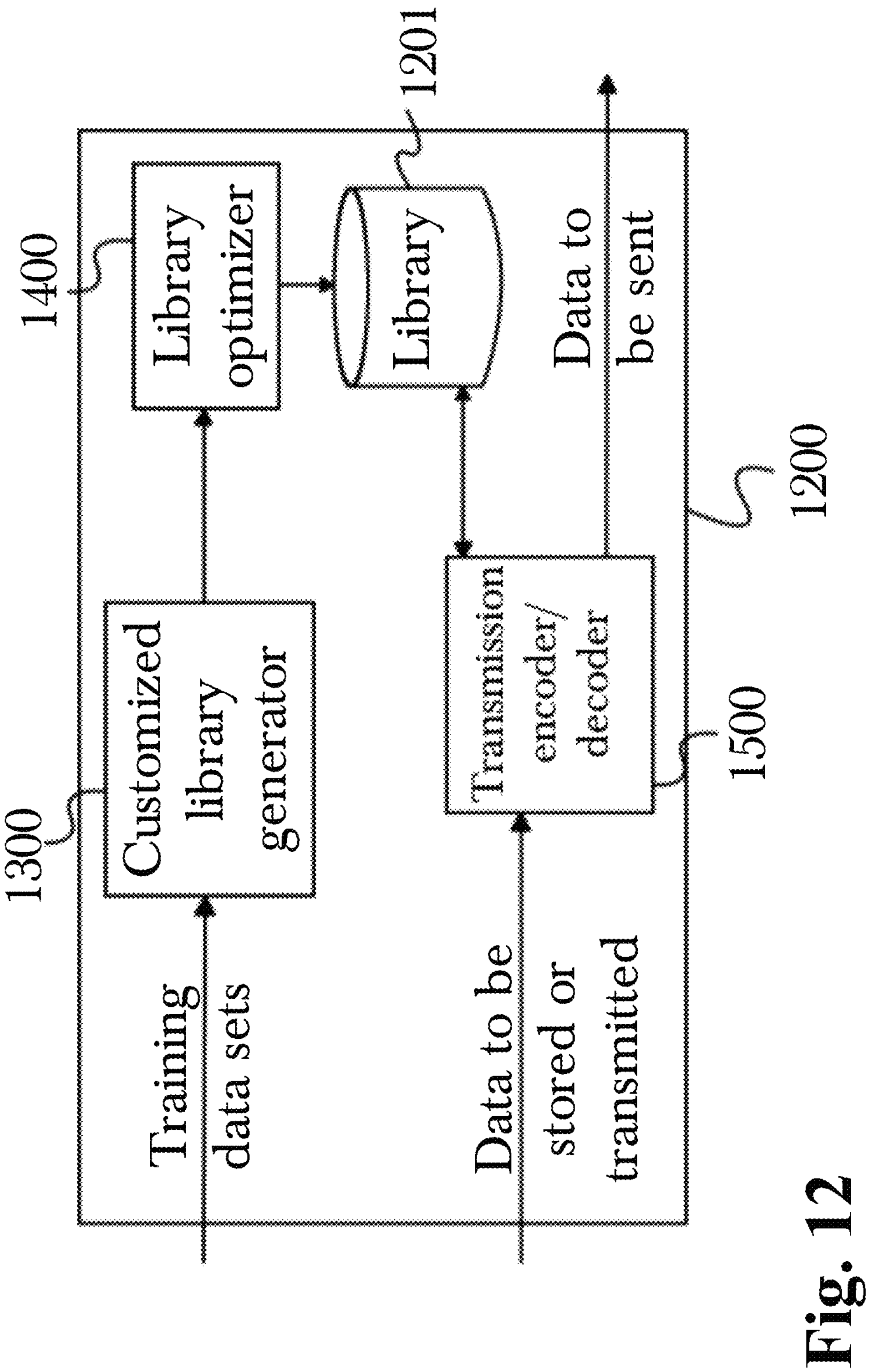
FIG. 12 is a diagram showing an exemplary data transmission system architecture, according to an embodiment.

FIG. 12 is a diagram showing an exemplary data transmission system architecture 1200, according to an embodiment. Incoming training data sets may be received at a customized library generator 1300 that processes training data to produce a customized word library 1201 comprising key-value pairs of data words (each comprising a string of bits) and their corresponding calculated binary Huffman codewords. The resultant word library 1201 may then be processed by a library optimizer 1400 to reduce size and improve efficiency, for example by pruning low-occurrence data entries or calculating approximate codewords that may be used to match more than one data word. A transmission encoder/decoder 1500 may be used to receive incoming data intended for storage or transmission, process the data using a word library 1201 to retrieve codewords for the words in the incoming data, and then append the codewords (rather than the original data) to an outbound data stream. Each of these components is described in greater detail below, illustrating the particulars of their respective processing and other functions, referring to FIGS. 2-4.

System 1200 provides near-instantaneous source coding that is dictionary-based and learned in advance from sample training data, so that encoding and decoding may happen concurrently with data transmission. This results in computational latency that is near zero but the data size reduction is comparable to classical compression. For example, if N bits are to be transmitted from sender to receiver, the compression ratio of classical compression is C, the ratio between the deflation factor of system 1200 and that of multi-pass source coding is p, the classical compression encoding rate is $R_C$ bit/s and the decoding rate is $R_D$ bit/s, and the transmission speed is S bit/s, the compress-send-decompress time will be $$T_{old} = \frac{N}{R_C} + \frac{N}{CS} + \frac{N}{CR_D}$$

while the transmit-while-coding time for system 1200 will be (assuming that encoding and decoding happen at least as quickly as network latency):

$$T_{new} = \frac{N_p}{CS}$$

so that the total data transit time improvement factor is $$\frac{T_{old}}{T_{new}} = \frac{\frac{CS}{R_C} + 1 + \frac{S}{R_D}}{p}$$

which presents a savings whenever $$\frac{CS}{R_C} + \frac{S}{R_D} > p - 1.$$

This is a reasonable scenario given that typical values in real-world practice are C=0.32, $R_C=1.1\cdot10^{12}$, $R_D=4.2\cdot10^{12}$, $S=10^{11}$, giving $$\frac{CS}{R_C} + \frac{S}{R_D} = 0.053\ \ldots,$$

such that system 1200 will outperform the total transit time of the best compression technology available as long as its deflation factor is no more than 5% worse than compression. Such customized dictionary-based encoding will also sometimes exceed the deflation ratio of classical compression, particularly when network speeds increase beyond 100 Gb/s.

The delay between data creation and its readiness for use at a receiving end will be equal to only the source word length t (typically 5-15 bytes), divided by the deflation factor C/p and the network speed S, i.e.

$$\text{delay}_{invention} = \frac{tp}{CS}$$

since encoding and decoding occur concurrently with data transmission. On the other hand, the latency associated with classical compression is $$\text{delay}_{priorart} = \frac{N}{R_C} + \frac{N}{CS} + \frac{N}{CR_D}$$

where N is the packet/file size. Even with the generous values chosen above as well as N=512K, t=10, and p=1.05, this results in $\text{delay}_{invention} \approx 3.3\cdot10^{-10}$ while $\text{delay}_{priorart} \approx 1.3\cdot10^{-7}$, a more than 400-fold reduction in latency.

A key factor in the efficiency of Huffman coding used by system 1200 is that key-value pairs be chosen carefully to minimize expected coding length, so that the average deflation/compression ratio is minimized. It is possible to achieve the best possible expected code length among all instantaneous codes using Huffman codes if one has access to the exact probability distribution of source words of a given desired length from the random variable generating them. In practice this is impossible, as data is received in a wide variety of formats and the random processes underlying the source data are a mixture of human input, unpredictable (though in principle, deterministic) physical events, and noise. System 1200 addresses this by restriction of data types and density estimation; training data is provided that is representative of the type of data anticipated in "real-world" use of system 1200, which is then used to model the distribution of binary strings in the data in order to build a Huffman code word library 1200.

Figure 13:
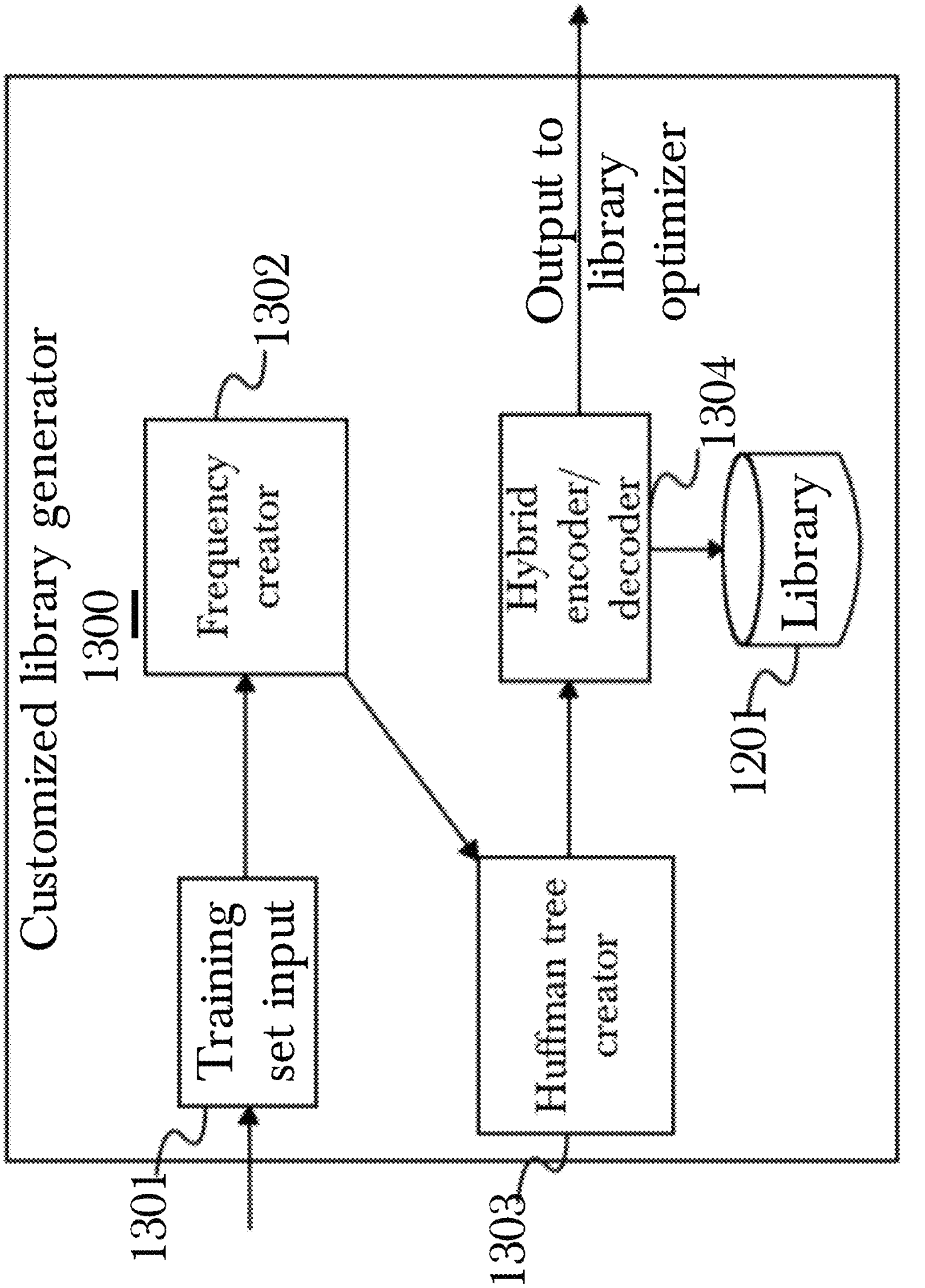
FIG. 13 is a diagram showing a more detailed architecture for a customized library generator.

FIG. 13 is a diagram showing a more detailed architecture for a customized library generator 1300. When an incoming training data set 1301 is received, it may be analyzed using a frequency creator 1302 to analyze for word frequency (that is, the frequency with which a given word occurs in the training data set). Word frequency may be analyzed by scanning all substrings of bits and directly calculating the frequency of each substring by iterating over the data set to produce an occurrence frequency, which may then be used to estimate the rate of word occurrence in non-training data. A first Huffman binary tree is created based on the frequency of occurrences of each word in the first dataset, and a Huffman codeword is assigned to each observed word in the first dataset according to the first Huffman binary tree. Machine learning may be utilized to improve results by processing a number of training data sets and using the results of each training set to refine the frequency estimations for non-training data, so that the estimation yield better results when used with real-world data (rather than, for example, being only based on a single training data set that may not be very similar to a received non-training data set). A second Huffman tree creator 1303 may be utilized to identify words that do not match any existing entries in a word library 1201 and pass them to a hybrid encoder/decoder 1304, that then calculates a binary Huffman codeword for the mismatched word and adds the codeword and original data to the word library 1201 as a new key-value pair. In this manner, customized library generator 1300 may be used both to establish an initial word library 1201 from a first training set, as well as expand the word library 1201 using additional training data to improve operation.

Figure 14:
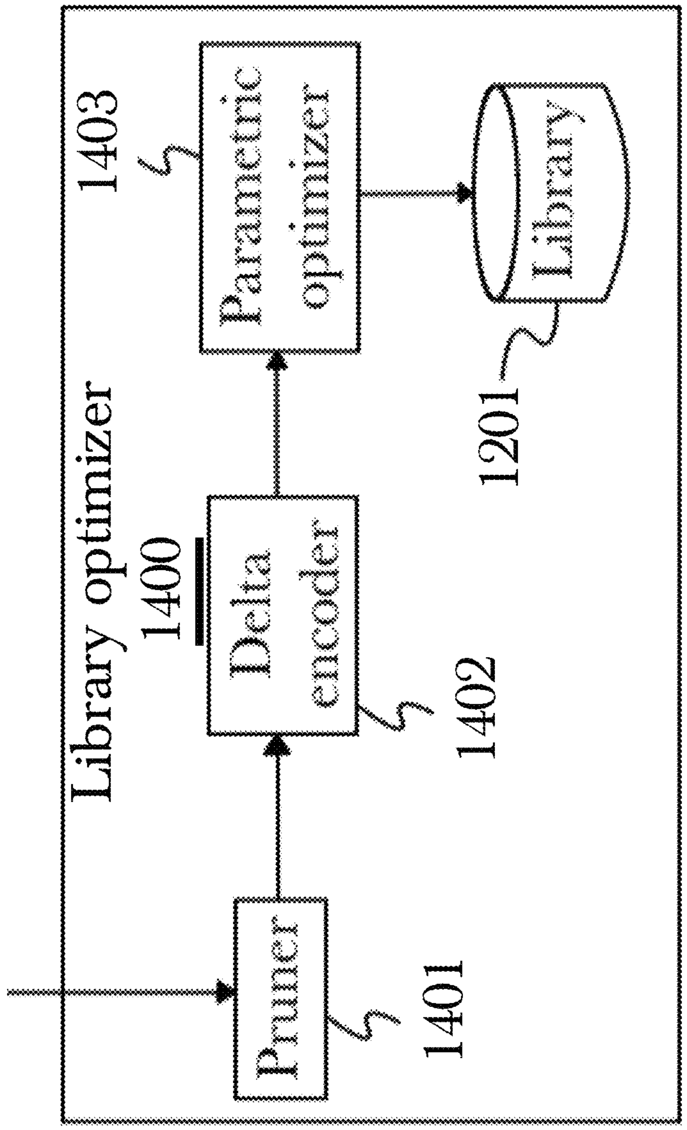
FIG. 14 is a diagram showing a more detailed architecture for a library optimizer.

FIG. 14 is a diagram showing a more detailed architecture for a library optimizer 1400. A pruner 1401 may be used to load a word library 1201 and reduce its size for efficient operation, for example by sorting the word library 1201 based on the known occurrence probability of each key-value pair and removing low-probability key-value pairs based on a loaded threshold parameter. This prunes low-value data from the word library to trim the size, eliminating large quantities of very-low-frequency key-value pairs such as single-occurrence words that are unlikely to be encountered again in a data set. Pruning eliminates the least-probable entries from word library 1201 up to a given threshold, which will have a negligible impact on the deflation factor since the removed entries are only the least-common ones, while the impact on word library size will be larger because samples drawn from asymptotically normal distributions (such as the log-probabilities of words generated by a probabilistic finite state machine, a model well-suited to a wide variety of real-world data) which occur in tails of the distribution are disproportionately large in counting measure. A delta encoder 1402 may be utilized to apply delta encoding to a plurality of words to store an approximate codeword as a value in the word library, for which each of the plurality of source words is a valid corresponding key. This may be used to reduce library size by replacing numerous key-value pairs with a single entry for the approximate codeword and then represent actual codewords using the approximate codeword plus a delta value representing the difference between the approximate codeword and the actual codeword. Approximate coding is optimized for low-weight sources such as Golomb coding, run-length coding, and similar techniques. The approximate source words may be chosen by locality-sensitive hashing, so as to approximate Hamming distance without incurring the intractability of nearest-neighbor-search in Hamming space. A parametric optimizer 1403 may load configuration parameters for operation to optimize the use of the word library 1201 during operation. Best-practice parameter/hyperparameter optimization strategies such as stochastic gradient descent, quasi-random grid search, and evolutionary search may be used to make optimal choices for all interdependent settings playing a role in the functionality of system 1200. In cases where lossless compression is not required, the delta value may be discarded at the expense of introducing some limited errors into any decoded (reconstructed) data.

Figure 15:
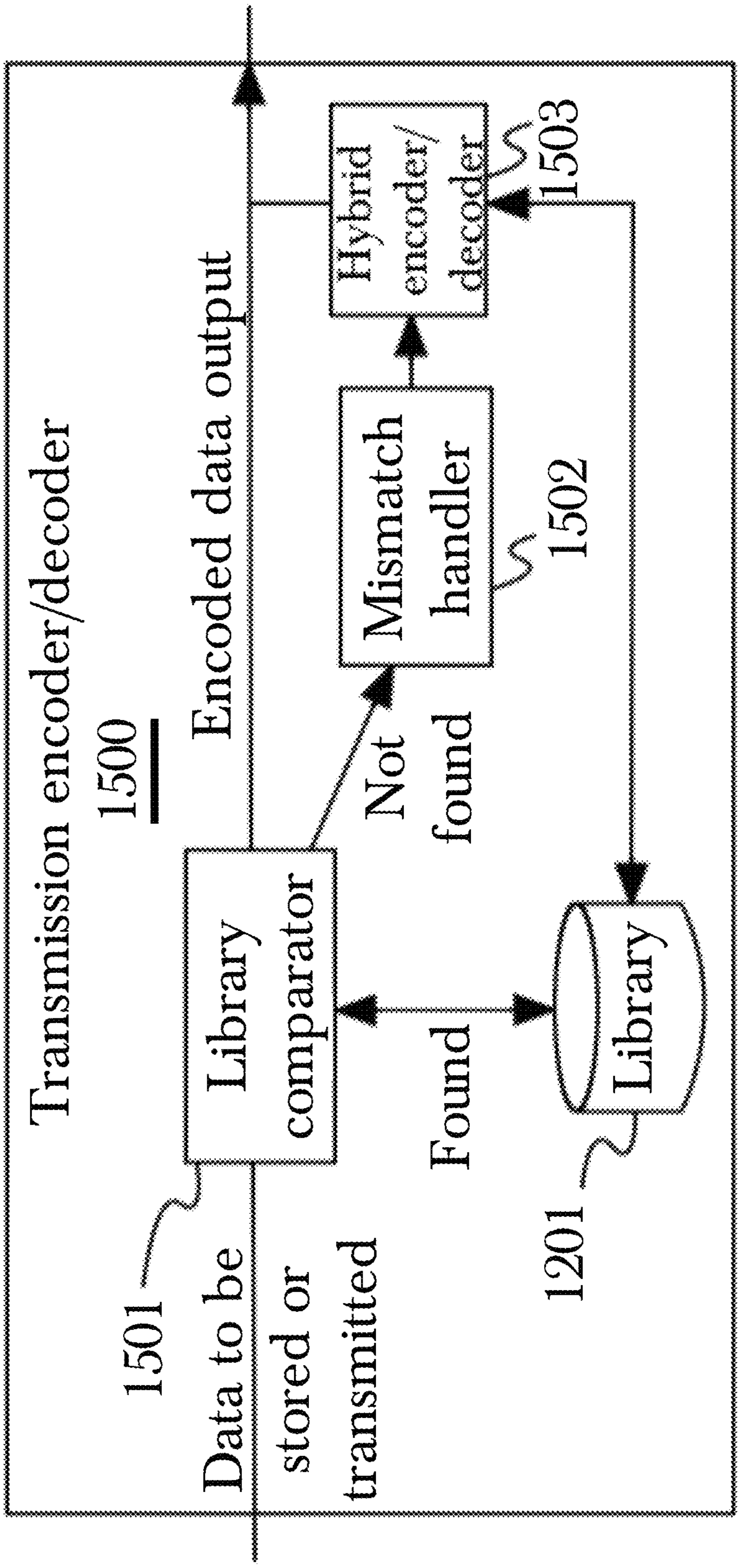
FIG. 15 is a diagram showing a more detailed architecture for a transmission and storage engine.

FIG. 15 is a diagram showing a more detailed architecture for a transmission encoder/decoder 1500. According to various arrangements, transmission encoder/decoder 1500 may be used to deconstruct data for storage or transmission, or to reconstruct data that has been received, using a word library 1201. A library comparator 1501 may be used to receive data comprising words or codewords, and compare against a word library 1201 by dividing the incoming stream into substrings of length t and using a fast hash to check word library 1201 for each substring. If a substring is found in word library 1201, the corresponding key/value (that is, the corresponding source word or codeword, according to whether the substring used in comparison was itself a word or codeword) is returned and appended to an output stream. If a given substring is not found in word library 1201, a mismatch handler 1502 and hybrid encoder/decoder 1503 may be used to handle the mismatch similarly to operation during the construction or expansion of word library 1201. A mismatch handler 1502 may be utilized to identify words that do not match any existing entries in a word library 1201 and pass them to a hybrid encoder/decoder 1503, that then calculates a binary Huffman codeword for the mismatched word and adds the codeword and original data to the word library 1201 as a new key-value pair. The newly-produced codeword may then be appended to the output stream. In arrangements where a mismatch indicator is included in a received data stream, this may be used to preemptively identify a substring that is not in word library 1201 (for example, if it was identified as a mismatch on the transmission end), and handled accordingly without the need for a library lookup.

Figure 19:
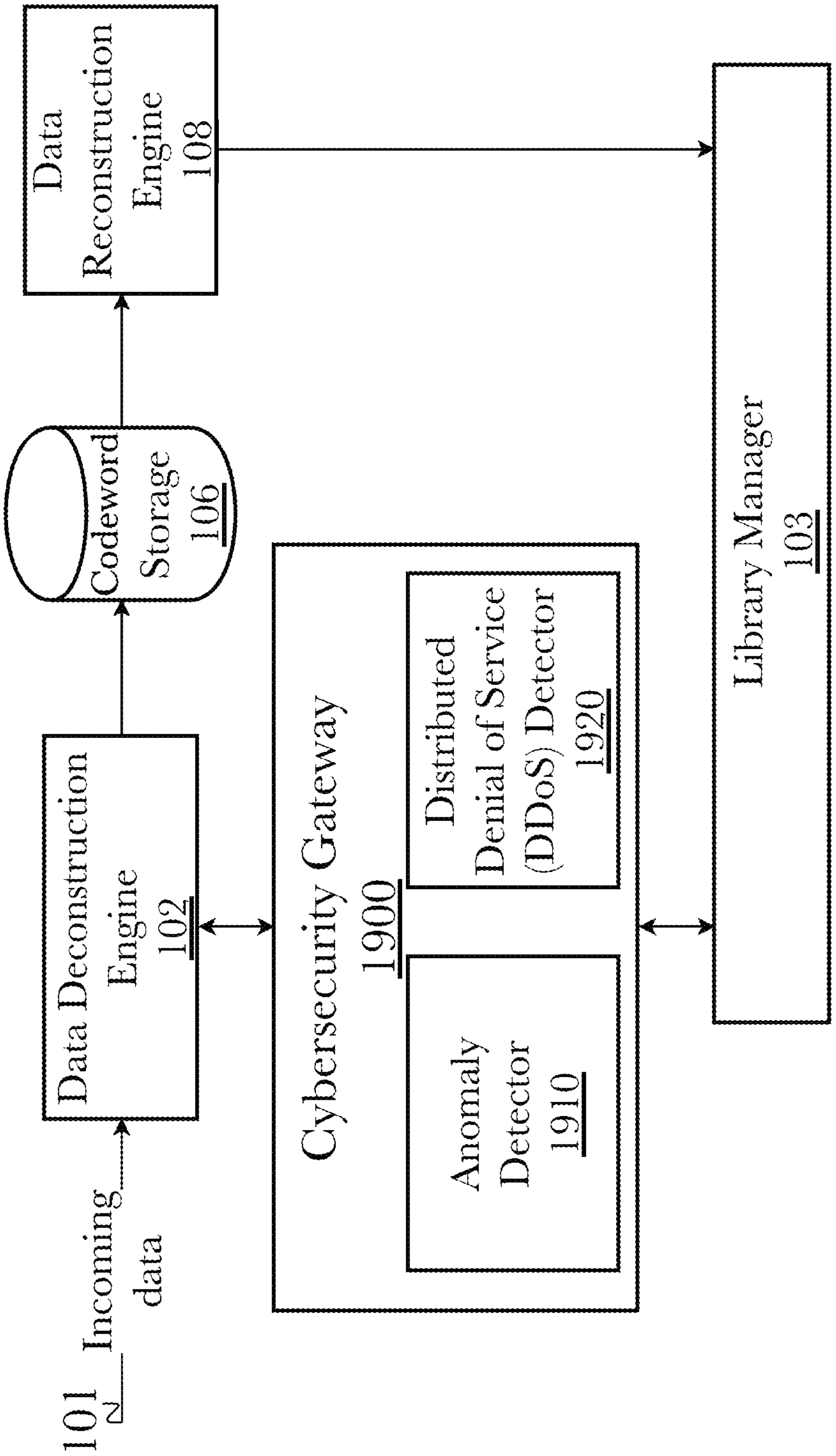
FIG. 19 is an exemplary system architecture of a data encoding system used for cyber security purposes.

FIG. 19 is an exemplary system architecture of a data encoding system used for cyber security purposes. Much like in FIG. 1, incoming data 101 to be deconstructed is sent to a data deconstruction engine 102, which may attempt to deconstruct the data and turn it into a collection of codewords using a library manager 103. Warplet storage 106 serves to store unique codewords from this process, and may be queried by a data reconstruction engine 108 which may reconstruct the original data from the codewords, using a library manager 103. However, a cybersecurity gateway 1900 is present, communicating in-between a library manager 103 and a deconstruction engine 102, and containing an anomaly detector 1910 and distributed denial of service (DDoS) detector 1920. The anomaly detector examines incoming data to determine whether there is a disproportionate number of incoming reference codes that do not match reference codes in the existing library. A disproportionate number of non-matching reference codes may indicate that data is being received from an unknown source, of an unknown type, or contains unexpected (possibly malicious) data. If the disproportionate number of non-matching reference codes exceeds an established threshold or persists for a certain length of time, the anomaly detector 1910 raises a warning to a system administrator. Likewise, the DDOS detector 1920 examines incoming data to determine whether there is a disproportionate amount of repetitive data. A disproportionate amount of repetitive data may indicate that a DDOS attack is in progress. If the disproportionate amount of repetitive data exceeds an established threshold or persists for a certain length of time, the DDOS detector 1910 raises a warning to a system administrator. In this way, a data encoding system may detect and warn users of, or help mitigate, common cyber-attacks that result from a flow of unexpected and potentially harmful data, or attacks that result from a flow of too much irrelevant data meant to slow down a network or system, as in the case of a DDOS attack.

Figure 22:
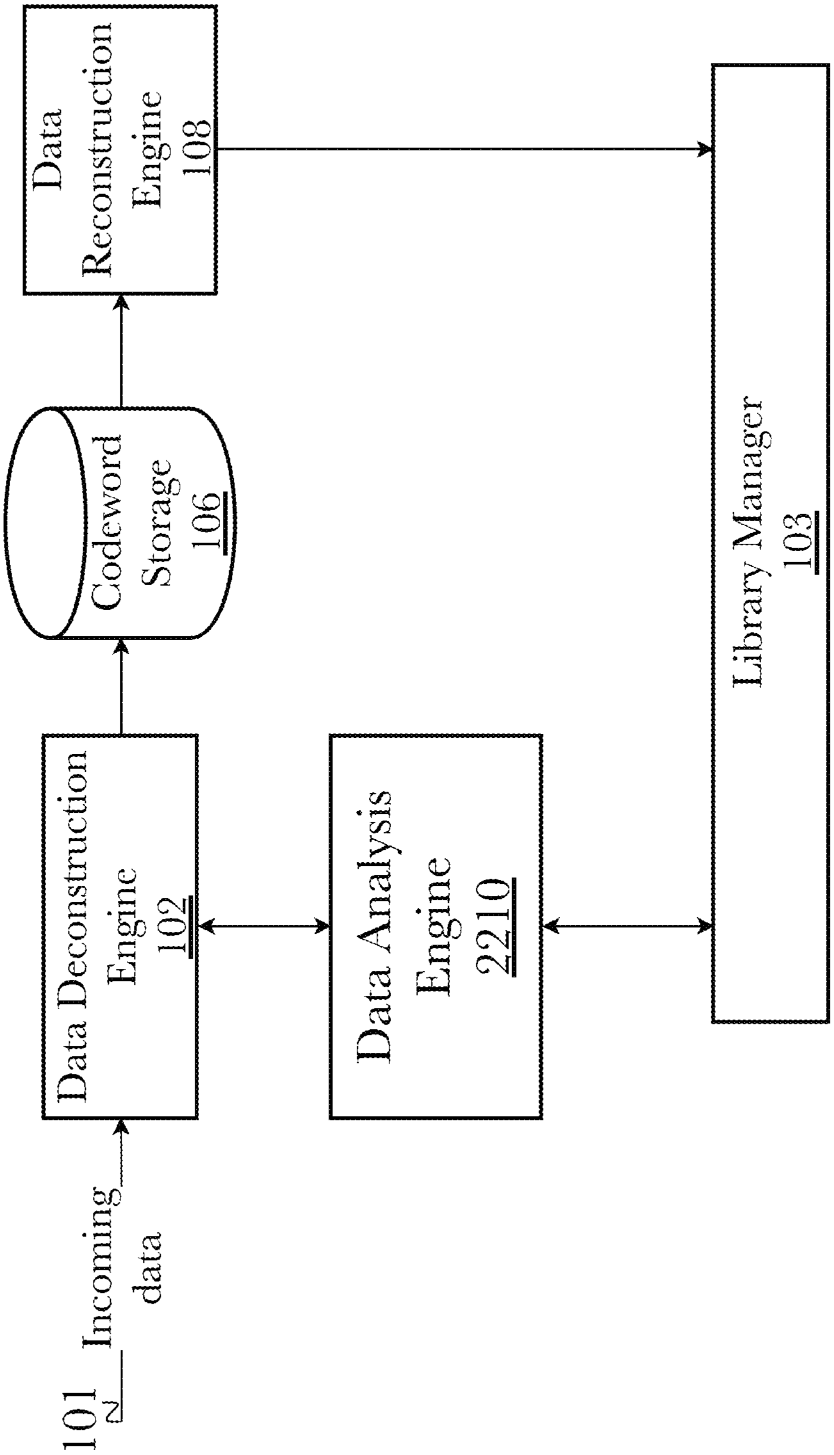
FIG. 22 is an exemplary system architecture of a data encoding system used for data mining and analysis purposes.

FIG. 22 is an exemplary system architecture of a data encoding system used for data mining and analysis purposes. Much like in FIG. 1, incoming data 101 to be deconstructed is sent to a data deconstruction engine 102, which may attempt to deconstruct the data and turn it into a collection of codewords using a library manager 103. Warplet storage 106 serves to store unique codewords from this process, and may be queried by a data reconstruction engine 108 which may reconstruct the original data from the codewords, using a library manager 103. A data analysis engine 2210, typically operating while the system is otherwise idle, sends requests for data to the data reconstruction engine 108, which retrieves the codewords representing the requested data from codeword storage 106, reconstructs them into the data represented by the codewords, and send the reconstructed data to the data analysis engine 2210 for analysis and extraction of useful data (i.e., data mining). Because the speed of reconstruction is significantly faster than decompression using traditional compression technologies (i.e., significantly less decompression latency), this approach makes data mining feasible. Very often, data stored using traditional compression is not mined precisely because decompression lag makes it unfeasible, especially during shorter periods of system idleness. Increasing the speed of data reconstruction broadens the circumstances under which data mining of stored data is feasible.

Figure 24:
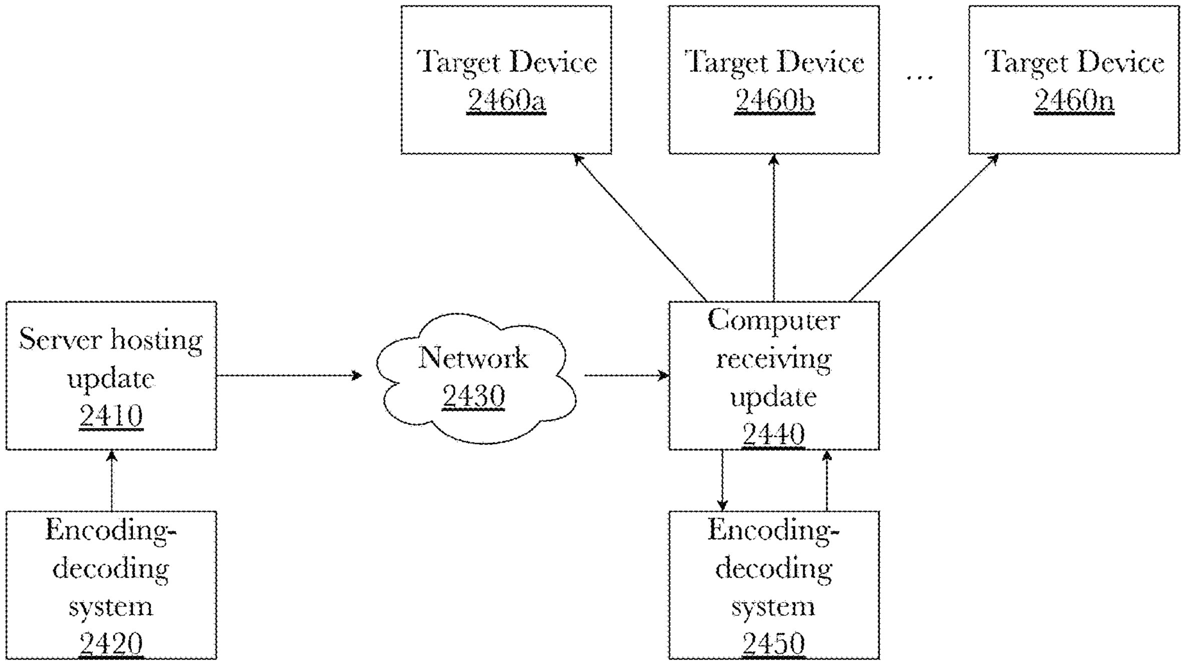
FIG. 24 is an exemplary system architecture of a data encoding system used for remote software and firmware updates.

FIG. 24 is an exemplary system architecture of a data encoding system used for remote software and firmware updates. Software and firmware updates typically require smaller, but more frequent, file transfers. A server which hosts a software or firmware update 2410 may host an encoding-decoding system 2420, allowing for data to be encoded into, and decoded from, sourceblocks or codewords, as disclosed in previous figures. Such a server may possess a software update, operating system update, firmware update, device driver update, or any other form of software update, which in some cases may be minor changes to a file, but nevertheless necessitate sending the new, completed file to the recipient. Such a server is connected over a network 2430, which is further connected to a recipient computer 2440, which may be connected to a server 2410 for receiving such an update to its system. In this instance, the recipient device 2440 also hosts the encoding and decoding system 2450, along with a codebook or library of reference codes that the hosting server 2410 also shares. The updates are retrieved from storage at the hosting server 2410 in the form of codewords, transferred over the network 2430 in the form of codewords, and reconstructed on the receiving computer 2440. In this way, a far smaller file size, and smaller total update size, may be sent over a network. The receiving computer 2440 may then install the updates on any number of target computing devices 2460*a-n*, using a local network or other high-bandwidth connection.

Figure 26:
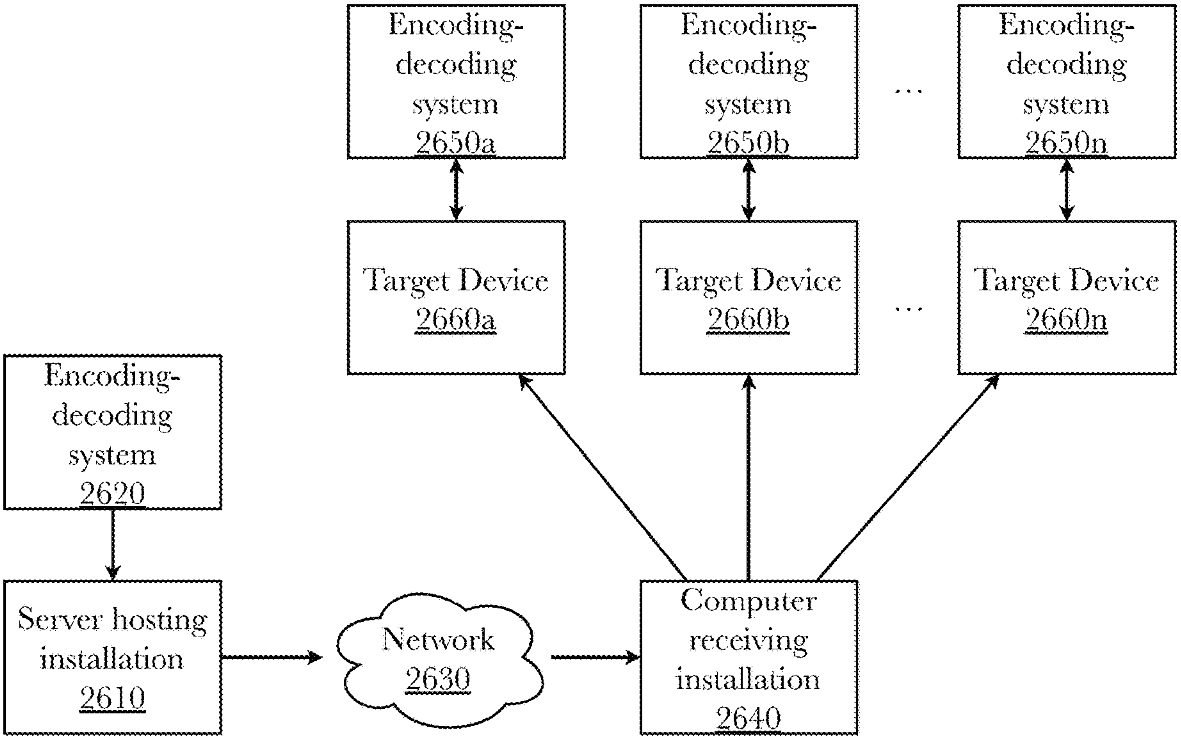
FIG. 26 is an exemplary system architecture of a data encoding system used for large-scale software installation such as operating systems.

FIG. 26 is an exemplary system architecture of a data encoding system used for large-scale software installation such as operating systems. Large-scale software installations typically require very large, but infrequent, file transfers. A server which hosts an installable software 2610 may host an encoding-decoding system 2620, allowing for data to be encoded into, and decoded from, sourceblocks or codewords, as disclosed in previous figures. The files for the large scale software installation are hosted on the server 2610, which is connected over a network 2630 to a recipient computer 2640. In this instance, the encoding and decoding system 2650*a-n* is stored on or connected to one or more target devices 2660*a-n*, along with a codebook or library of reference codes that the hosting server 2610 shares. The software is retrieved from storage at the hosting server 2610 in the form of codewords, and transferred over the network 2630 in the form of codewords to the receiving computer 2640. However, instead of being reconstructed at the receiving computer 2640, the codewords are transmitted to one or more target computing devices, and reconstructed and installed directly on the target devices 2660*a-n*. In this way, a far smaller file size, and smaller total update size, may be sent over a network or transferred between computing devices, even where the network 2630 between the receiving computer 2640 and target devices 2660*a-n* is low bandwidth, or where there are many target devices 2660*a-n*.

Figure 28:
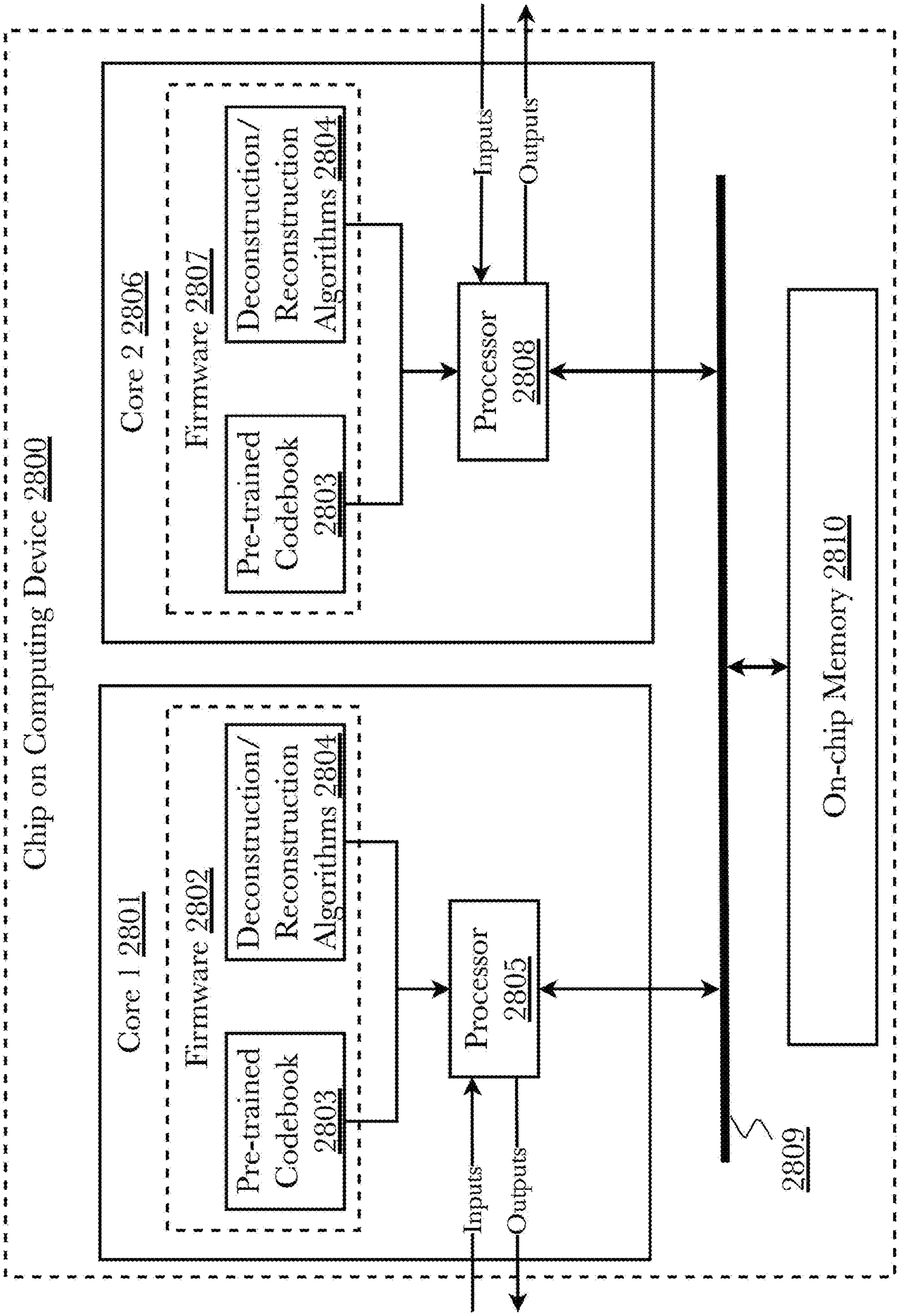
FIG. 28 is a diagram showing an embodiment in which a pre-trained version of the codebook library and associated algorithms would be encoded as firmware on an exemplary multi-core processing chip included as part of the hardware of a plurality of devices.

FIG. 28 is a diagram showing an exemplary embodiment in which a pre-trained version of the codebook library and associated algorithms would be encoded as firmware on a semiconductor multi-core processing chip 2800 included as part of the hardware of a plurality of devices. According to an embodiment, a semiconductor, such as a multi-core processing chip 2800, may have two or more processing cores 2801, 2806 which may pass data between and among the cores using a data bus 2809. As more and more processors are used to perform tasks, larger portion of the resources and cost is used to transport bits between processors. This cost is proportional to the number of bits/second that need to be transported. The cost is high for data transport between processor components where the data travels across circuit board traces. In order to reduce the cost of intra-chip (on-chip) data transportation between processing cores, a pre-trained codebook 2803 and algorithms 2804, which are lightweight code, may be embedded or programmed into firmware 2802, 2807 in a semiconductor. The system works by using training data to identify patterns in data prior to embedding code or programming firmware in a semiconductor. These patterns and their associated, smaller indices, or codewords, are stored in a codebook 2803 that is replicated on both the sending and receiving bus, along with lightweight code comprising the deconstruction and reconstruction algorithms 2804. In processing live data, only codewords, much smaller than the original data, are transferred between buses.

Data compaction is a stepless process that operates as fast as the data is created, a key component of the compaction process extreme low latency performance. As source data is generated, it is encoded by the deconstruction algorithm 2804 and the codewords are sent; at the destination (a different core), codewords are decoded via the reconstruction algorithm 2804 and the original data is instantaneously rebuilt, even as the file is still being generated at the source. The computationally intensive tasks of searching for patterns in data is performed in advance of embedding; in live semiconductor operation, the tasks involved consist primarily of lookups (e.g., codebook lookups), which are light and fast. The system and methods of compacting data disclosed may be especially suited to accelerate on-chip communications. Because the system and methods disclosed provide effective data reduction down to the scale of a few bytes and requires very limited instruction complexity to encode or decode, it can be deployed in on-chip computing environments with highly limited resources. There are various cost-saving and performance-enhancing applications when using a chip integrated with the disclosed system and method. First, it may help reduce bandwidth use of data buses/interconnects: by encoding data, the chip components send fewer bits, implying lower power demands, lower interconnect bandwidth/multiplexing requirements, and fast overall transmissions. Second, it may ameliorate data routing congestion: by increasing the information density of messages or packets in network-on-chip contexts, the delays, and pile-ups due to buffer congestion at on-chip routers can be substantially reduced, improving overall communications speed. Third, it may improve efficiency of memory resources: by compacting data that is being temporarily store during computation (e.g., registers, scratchpad, cache, etc.) the disclosed system and methods can pack more data into available on-chip memory and require fewer allocations, maker fewer accesses, and cause fewer misses. Furthermore, it may improve attenuation of crosstalk between components and interconnects/busses: the system integrated onto a chip may even be able to help with capacitive and inductive crosstalk by increasing the entropy rate of signals being transmitted on interconnection wires, thus decreasing periodicity and other patterns that contribute to coupling behavior. This use has the potential to enable denser wiring and more components per unit area.

According to an embodiment, contained on the multi-core chip 2800 for each core 2801, 2806 would be a firmware area 2802, 2807, on which would be a stored a copy of a pre-trained codebook 2803 and deconstruction/reconstruction algorithms 2804 for processing data. Processors 2805, 2808 would have both inputs and outputs to other hardware on the device. Processors 2805, 2808 would store incoming data for processing on on-chip memory 2810, process the data using the pre-trained codebook 2803 and deconstruction/reconstruction algorithms 2804, and the send the processed data to other hardware (e.g., another core) on the device. Any device equipped with this embodiment would be able to store and transmit data in a highly optimized, bandwidth-efficient format with any other device equipped with this embodiment.

Figure 29:
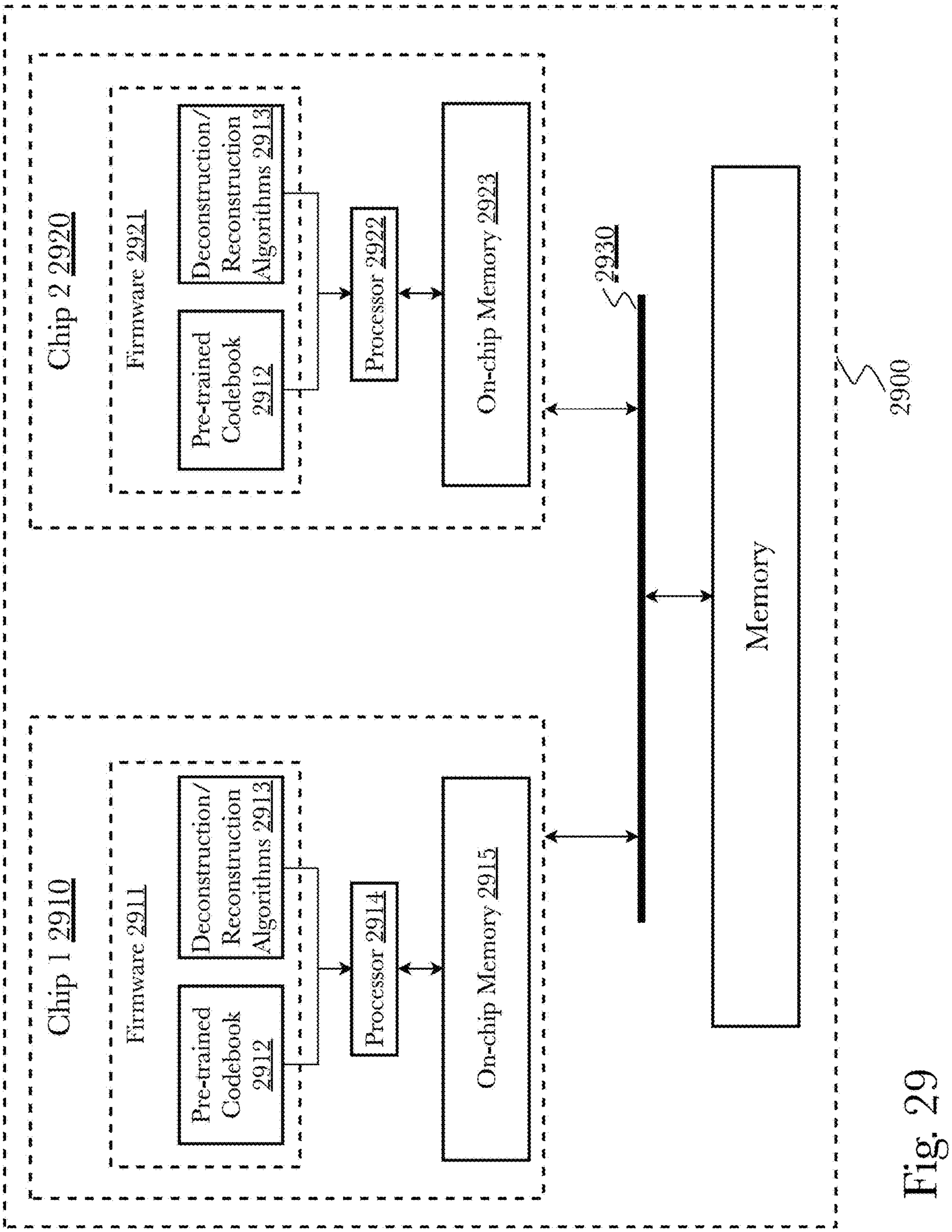
FIG. 29 is a diagram showing an embodiment in which a pre-trained version of the codebook library and associated algorithms would be encoded as firmware on an exemplary multi-chip module included as part of the hardware of a plurality of devices.

FIG. 29 is a diagram showing an embodiment in which a pre-trained version of the codebook library and associated algorithms would be encoded as firmware on an exemplary multi-chip module 2900 included as part of the hardware of a plurality of devices. A multi-chip module is generally designed by putting multiple processor semiconductor die (i.e., chips) inside very small packages. This means that processor-to-processor communication is more expensive than if all processors are on the same die. In order to reduce the cost of chip-to-chip data transportation between processing chips, a pre-trained codebook 2912 and algorithms 2913, which are lightweight code, may be embedded or programmed into firmware 2911, 2921 in a semiconductor. The system works by using training data to identify patterns in data prior to embedding code or programming firmware in a semiconductor. These patterns and their associated, smaller indices, or codewords, are stored in a codebook 2912 that is replicated on both the sending and receiving bus, along with lightweight code comprising the deconstruction and reconstruction algorithms 2913. In processing live data, only codewords, much smaller than the original data, are transferred between buses. If each processor were to encode and compact the data it receives and sends using the system and methods disclosed, then the multi-chip module components would send fewer bits, which may lead to lower power demands, lower interconnect bandwidth/multiplexing requirements, and faster overall transmissions. According to an embodiment, contained on the multi-chip module 2900 for each chip 2910, 2920 would be a firmware area 2911, 2921, on which would be a stored a copy of a pre-trained codebook 2912 and deconstruction/reconstruction algorithms 2913 for processing data. Processors 2914, 2922 would have both inputs and outputs to other hardware on the device. Processors 2914, 2922 would store incoming data for processing on on-chip memory 2915, 2923, process the data using the pre-trained codebook 2912 and deconstruction/reconstruction algorithms 2913, and then send the processed data to other hardware (e.g., another chip via a bus 2930) on the device. Any device equipped with this embodiment would be able to store and transmit data in a highly optimized, bandwidth-efficient format with any other device equipped with this embodiment.

Figure 30:
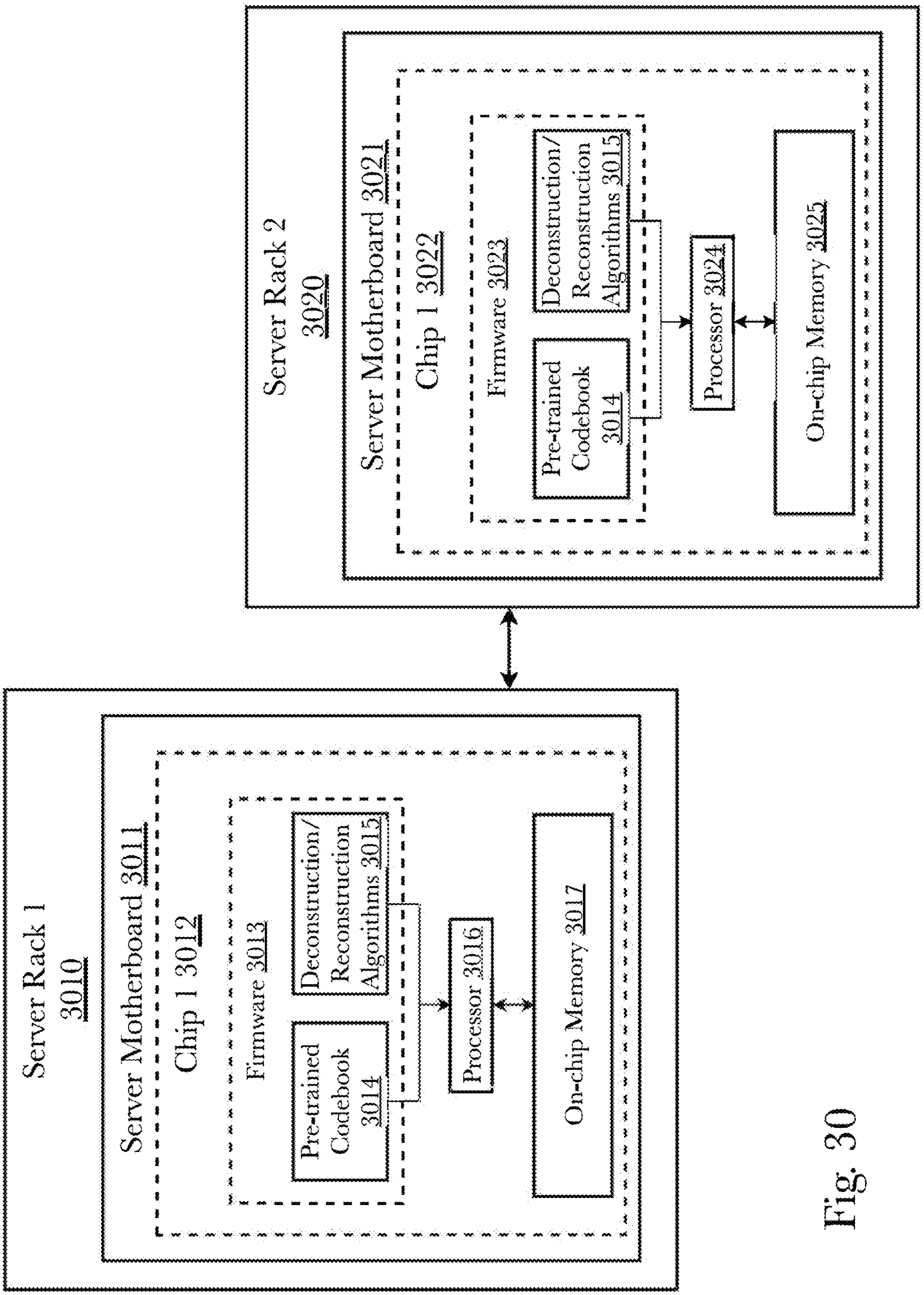
FIG. 30 is a diagram showing an embodiment in which a pre-trained version of the codebook library and associated algorithms would be encoded as firmware on an exemplary server motherboard operating within a server rack.

FIG. 30 is a diagram showing an embodiment in which a pre-trained version of the codebook library and associated algorithms would be encoded as firmware on an exemplary server motherboard 3011, 3021 operating within a server rack 3010, 3020. Enterprises or facilities that handle (e.g., receive, transmit, intercept, obtain, generate, process, etc.) large volumes of data, such as a data center, often utilize one or more servers for processing and routing data and requests. Transporting data between different boards contained within a single server rack, or from one rack to another increases the resources and cost of moving bits between the processors housed in the boards. In order to reduce the cost of intra-data center data transportation between board-to-board or rack-to-rack, a pre-trained codebook 3014 and algorithms 3015, which are lightweight code, may be embedded or programmed into firmware 3013, 3023 in a semiconductor located on the server motherboards 3011, 3021. The system works by using training data to identify patterns in data prior to embedding code or programming firmware in a semiconductor. These patterns and their associated, smaller indices, or codewords, are stored in a codebook 3014 that is replicated on both the sending and receiving bus, along with lightweight code comprising the deconstruction and reconstruction algorithms 3015. In processing live data, only codewords, much smaller than the original data, are transferred between buses. If each processor were to encode and compact the data it receives and sends using the system and methods disclosed, then the server components would send fewer bits, which may lead to lower power demands, lower interconnect bandwidth/multiplexing requirements, and faster overall transmissions.

According to an embodiment, contained on a server motherboard 3011, 3021 for each chip 3012, 3022 would be a firmware area 3013, 3023, on which would be a stored a copy of a pre-trained codebook 3014 and deconstruction/reconstruction algorithms 3015 for processing data. Processors 3016, 3024 would have both inputs and outputs to other hardware on the board 3011. Processors 3016, 3024 would store incoming data for processing on on-chip memory 3017, 3025, process the data using the pre-trained codebook 3014 and deconstruction/reconstruction algorithms 3015, and then send the processed data to other hardware (e.g., another chip on board, another board in rack, another rack). Any device equipped with this embodiment would be able to store and transmit data in a highly optimized, bandwidth-efficient format with any other device equipped with this embodiment.

Figure 32:
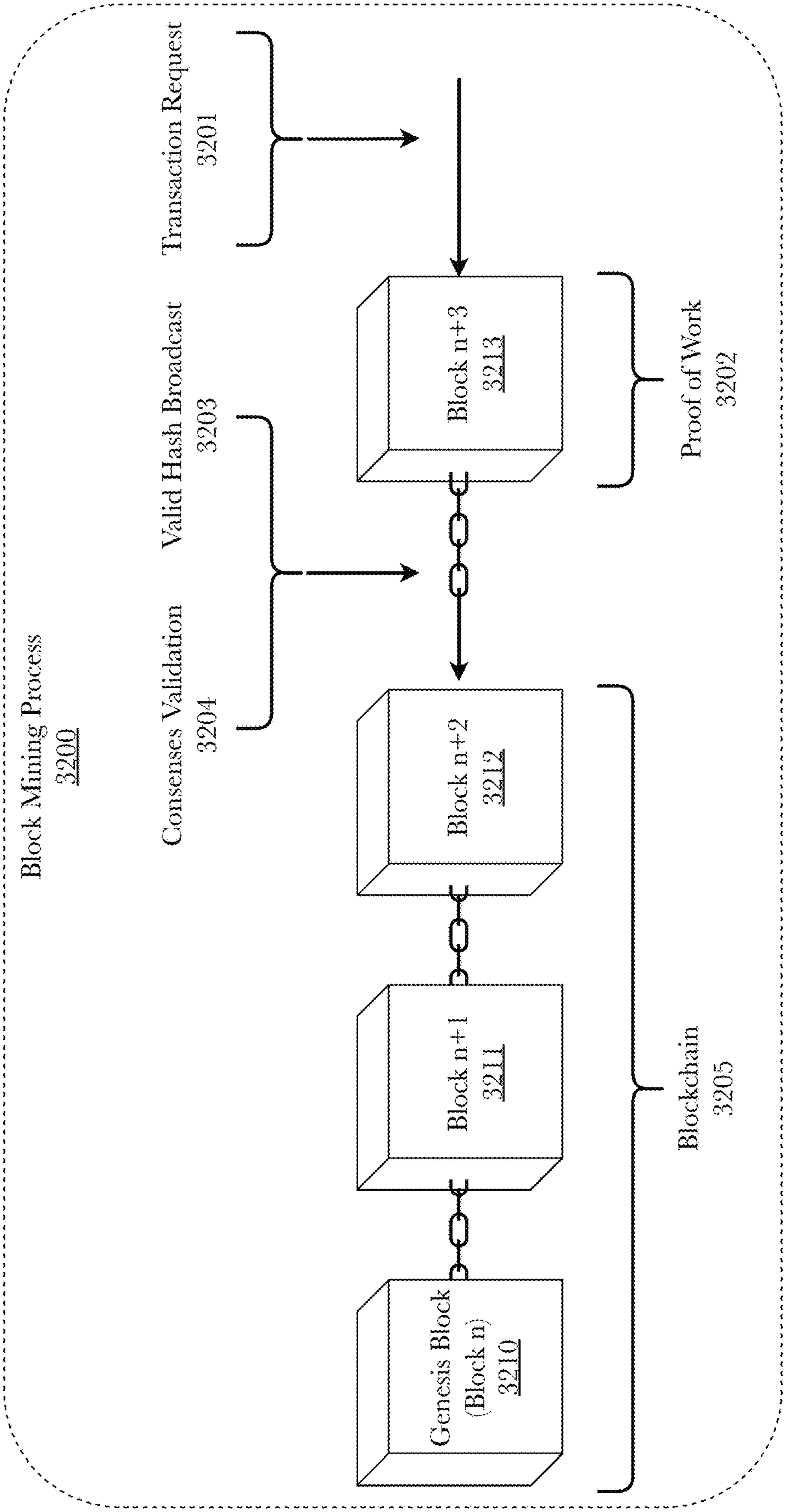
FIG. 32 (PRIOR ART) is a block diagram illustrating blockchain technology and the block mining process.

FIG. 32 (PRIOR ART) is a block diagram illustrating blockchain technology and the block mining process 3200. A blockchain 3205 is a distributed and immutable public ledger with blocks of transactions (smart contracts, etc.) 3210-3213. Adding entries into the ledger 3205 comprises forming a transaction agreement 3201 that is sent out to a peer-to-peer network of mining rigs, i.e., nodes on a network, that each work within the boundaries of a proof system (e.g., proof-of-work 3202 in the case of Bitcoin) to perform verification of the transaction. Each step in the mining process 3200 may make use of processes spanning three categories: sending, computing, and maintaining.

Sending blockchain data to the other nodes happens at least when a request is sent to verify a pending transaction 3201 by one node. Another instance is announcing the verification 3203 of a new block 3213 comprising transactions, i.e., finding the hash algorithm. Yet another instance of network transmissions is announcing the validation of the verification 3204 by a different node in the consensus pool. And yet another example is requesting a copy or stream of a blockchain 3205.

Computing processes happen when executing the computations set forth by the proof system 3202. For example, in the case of a proof-of-work system, each node is racing to guess the hash value of the new block 3213. When a node has the algorithm for the new block 3213, the algorithm is broadcast to the network where it is verified by the other nodes on the network 3204 in yet another computation step.

Nodes may maintain a full or partial copy of a blockchain 3205. Some nodes exist solely to store the blockchain 3205 for mining rigs to request. Some blockchains reduce their storage footprint by pruning the blockchain, but all blockchains still require an ever-growing need for more storage space. Some proof systems, e.g., proof-of-capacity, require large storage capacities as part of their blockchain verification.

The following embodiments contained in the figures below present systems and methods for compacting data in each of the blockchain processes 3200 of sending, computing, and maintaining.

Figure 33:
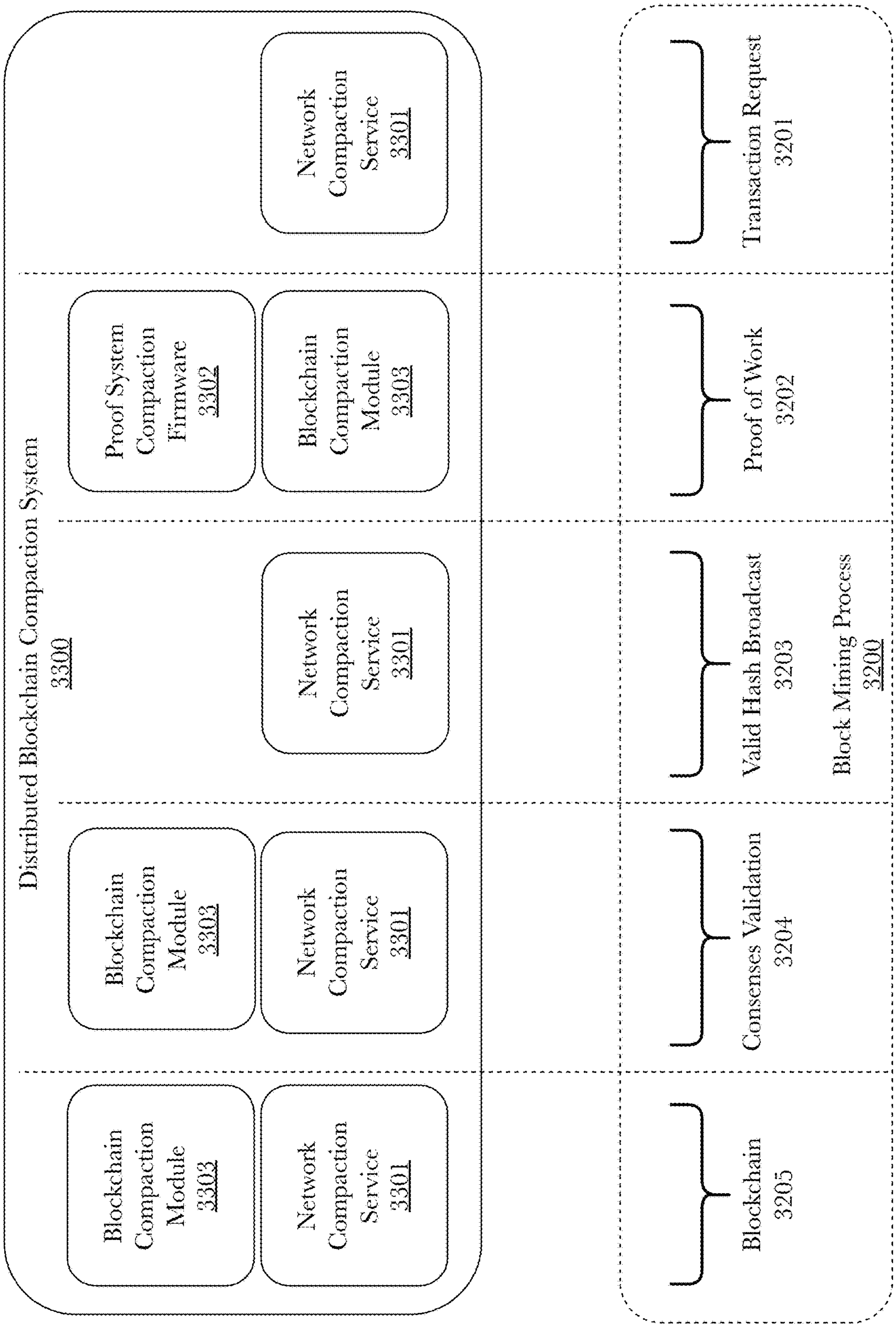
FIG. 33 is a block diagram illustrating an exemplary distributed blockchain data compaction system in reference to the blockchain mining process.

FIG. 33 is a block diagram illustrating an exemplary distributed blockchain data compaction system 3300 in reference to the blockchain mining process 3200. The system comprises three components: a network compaction service 3301, a proof system compaction firmware 3302, and a blockchain compaction module 3303.

A network compaction service 3301 may be used during any transmission 3201/3203/3204/3205 of blockchain data between the nodes on the blockchain network and resides on each node. According to some embodiments, a network compaction service 3301 may compact all network transmissions even data packets not related to blockchain. Thus the present embodiments herein also provide a system and method for a more efficient network transmission protocol.

A proof system compaction firmware 3302 resides on each core in every multi-core processer of a mining rig in the network, whether it be a CPU or GPU, according to a preferred embodiment. Although it is not required to be on every mining rig because most proof systems require each node to work in isolation from other nodes-unless they are part of a pool. Thus, it is beneficial for mining rigs to have the proof system compaction firmware 3302 because mining rigs who forgo the firmware 3302 will be slower to verify new blocks. A proof system compaction firmware 3302 compacts information between the cores thus increasing the computational speed of the multi-core processor. A proof system compaction firmware 3302 also compacts information from chip to chip and node to node.

A blockchain compaction module 3303 may exist in at least three forms: a storage container for the blockchain; a layer on top of an existing blockchain, i.e., a fork; or implemented at the start of a new blockchain/crypto protocol. In the storage container case, existing blockchains can be stored in a compacted form thus requiring less storage space. A more integrated and enforceable embodiment is a fork of an existing blockchain, whereby the data compaction of the blockchain is integrated into the protocol. Lastly, a new protocol may be developed to integrate data compaction from the genesis block, i.e., the beginning of the blockchain.

The embodiments concerning blockchain data compaction at any step—sending, computation, and maintaining—may make use of any combination of the above features. Not all embodiments use data compaction in each step, but a person having ordinary skill in the art will appreciate that the systems and methods herein may be implemented using any combination of data compaction regarding sending, computing, and maintaining a blockchain.

One or more of the three components 3301-3303 may make use of the locally operating aspects from the various embodiments within FIG. 1 and supporting details found in FIGS. 2-4 and FIGS. 7-11. One or more of the three components 3301-3303 may make use of the remote transmission of codewords found in embodiments of FIG. 5 and the data transmission aspects found in FIG. 12 with supporting FIGS. 13-18. One or more of the three components 3301-3303 may make use of the embedded firmware aspects of embodiments found in FIG. 6 and FIGS. 22-31. One or more of the three components 3301-3303 may make use of the security features of embodiments found in FIGS. 19-21.

Figure 34:
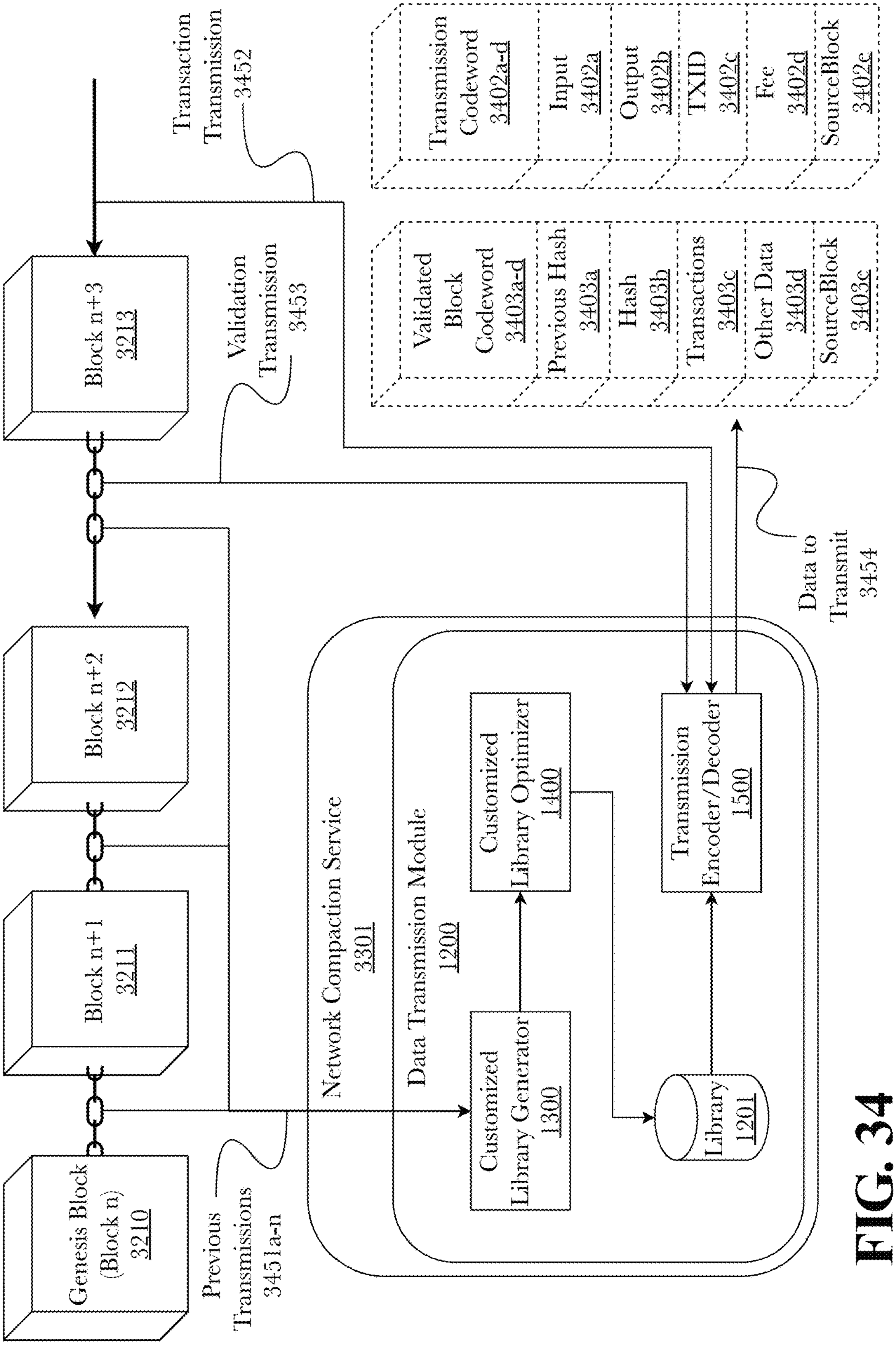
FIG. 34 is a block diagram illustrating an exemplary network compaction service for sending compacted data transmissions throughout a blockchain's peer-to-peer network.

FIG. 34 is a block diagram illustrating an exemplary network compaction service 3301 for sending compacted data transmissions throughout a blockchain's peer-to-peer network. Incoming training data in the form of previous blockchain data packets 3451*a*-*n* may be received at a customized library generator 1300 that processes the blockchain data packets to produce a customized word library 1201 comprising key-value pairs of data words (each comprising a string of bits) and their corresponding codewords. The resultant word library 1201 may then be processed by a library optimizer 1400 to reduce size and improve efficiency, for example by pruning low-occurrence data entries or calculating approximate codewords that may be used to match more than one data word. A transmission encoder/decoder 1500 may be used to receive incoming data 3452/3453 intended for storage or transmission 3454, process the data using a word library 1201 to retrieve codewords for the words in the incoming data, and then append the codewords (rather than the original data) to an outbound data stream. Each of these components is described in greater detail above, illustrating the particulars of their respective processing and other functions, referring to FIGS. 2-4.

Two exemplary transmissions are a transaction transmission 3452 and a validation transmission 3453. A transaction transmission 3452 happens when a pending transaction is broadcast to the network in order for nodes to validate the transaction in a new block 3213. The transmission transaction not yet in a block itself, comprises a transmission codeword 3402*a*-*d* and if needed, a sourceblock 3402*e* (in the case of new key-value pair). A validation transmission 3453 may be either the first node to verify the new block 3213 sending the derived hash from the proof of work to other nodes to validate the hash, or another of the network nodes broadcasting that the node has verified the hash sent from the first node. This codeword 3403*a-d* comprising the new block 3213, and a sourceblock 3403*e*—if necessary.

Figure 35:
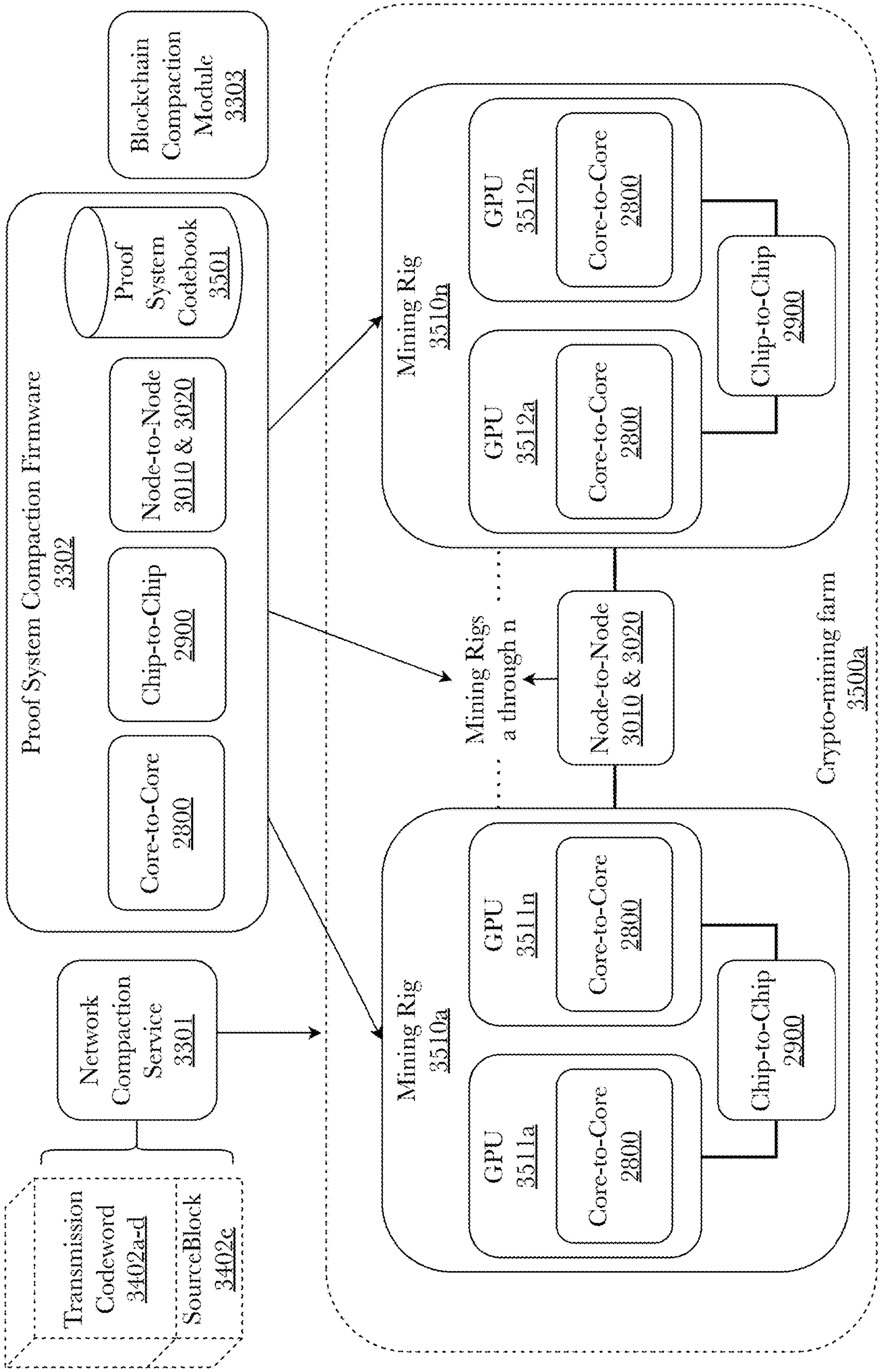
FIG. 35 is a block diagram illustrating an exemplary proof system compaction firmware embedded into the multi-core processors of a blockchain's consensus pool mining rigs.

FIG. 35 is a block diagram illustrating an exemplary proof system compaction firmware 3302 embedded into the multi-core processors of a blockchain's consensus pool mining rigs. This diagram also illustrates the process of mining a new block for a blockchain. Crypto-mining farms 3500*a* may scale from the smallest of mining operations—e.g., a sole computer at someone's home 3510*a*—to a large scale operation—a warehouse of hundreds or thousands of inter-connected and pooled mining rigs 3510*a-n*. In this example, the mining rigs 3510*a-n* have a multi-core CPU or GPU 3511*a-n*/3512*a-n*, at least one being used to mine a block-chain, and the data compaction firmware 3302 is installed/embedded into the CPUs/GPUs to more expeditiously solve for the new block hash, as is the case in a proof-of-work system.

In the case of a large scale operation, there may be stacks of mining rigs 3510*a-n*, each mining rig comprising multiple CPUs or GPUs 3511*a-n*/3512*a-n*, and where each mining rig 3510*a-n* is set up to mine one block, together as a pool. Thus, the core-to-core compaction firmware 2800 may be used within each CPU/GPU.

The chip-to-chip aspect 2900 may be used between each CPU/GPU within a mining rig. The system works by using training data to identify patterns in data prior to embedding code or programming firmware in a semiconductor. These patterns and their associated, smaller indices, or codewords, are stored in a codebook that is replicated on both the sending and receiving bus, along with lightweight code comprising the deconstruction and reconstruction algorithms. In processing live data, only codewords, much smaller than the original data, are transferred between buses. If each processor were to encode and compact the data it receives and sends using the system and methods disclosed, then the multi-chip module components would send fewer bits, which may lead to lower power demands, lower inter-connect bandwidth/multiplexing requirements, and faster overall transmissions.

The node-to-node aspect 3010/3020 enables the multi-rig pool to transfer compacted information. In order to reduce the cost of intra-rig data transportation between rig-to-rig, a pre-trained codebook and algorithms, which are lightweight code, may be embedded or programmed into firmware in a semiconductor located on the mining rig motherboards.

These three firmware aspects 2800, 2900, 3010, 3020 allows data compaction throughout the entire data flow process of blockchain mining on a small or large scale.

According to one aspect, the data relating to the mining of a new block may employ a single proof system codebook 3501 that is applicable to each data transfer 2800, 2900, 3010, 3020. If mining rigs pooled together utilize internet protocols (IP) for data transfer, such as a disperse mining pool, than a network compaction service 3301 may work in tandem to compact the IP header data, which may have other key-value pairs not present in the firmware reference code-book. It should be noted that a network compaction service 3301 may typically decide the transmission codeword 3402*a-d* before it is received by the proof system compaction firmware 3302. When a new block hash is found, a blockchain compaction module 3303 may encode—i.e., compact—the new block into the blockchain format (i.e., the blockchain reference codebook).

Figure 36:
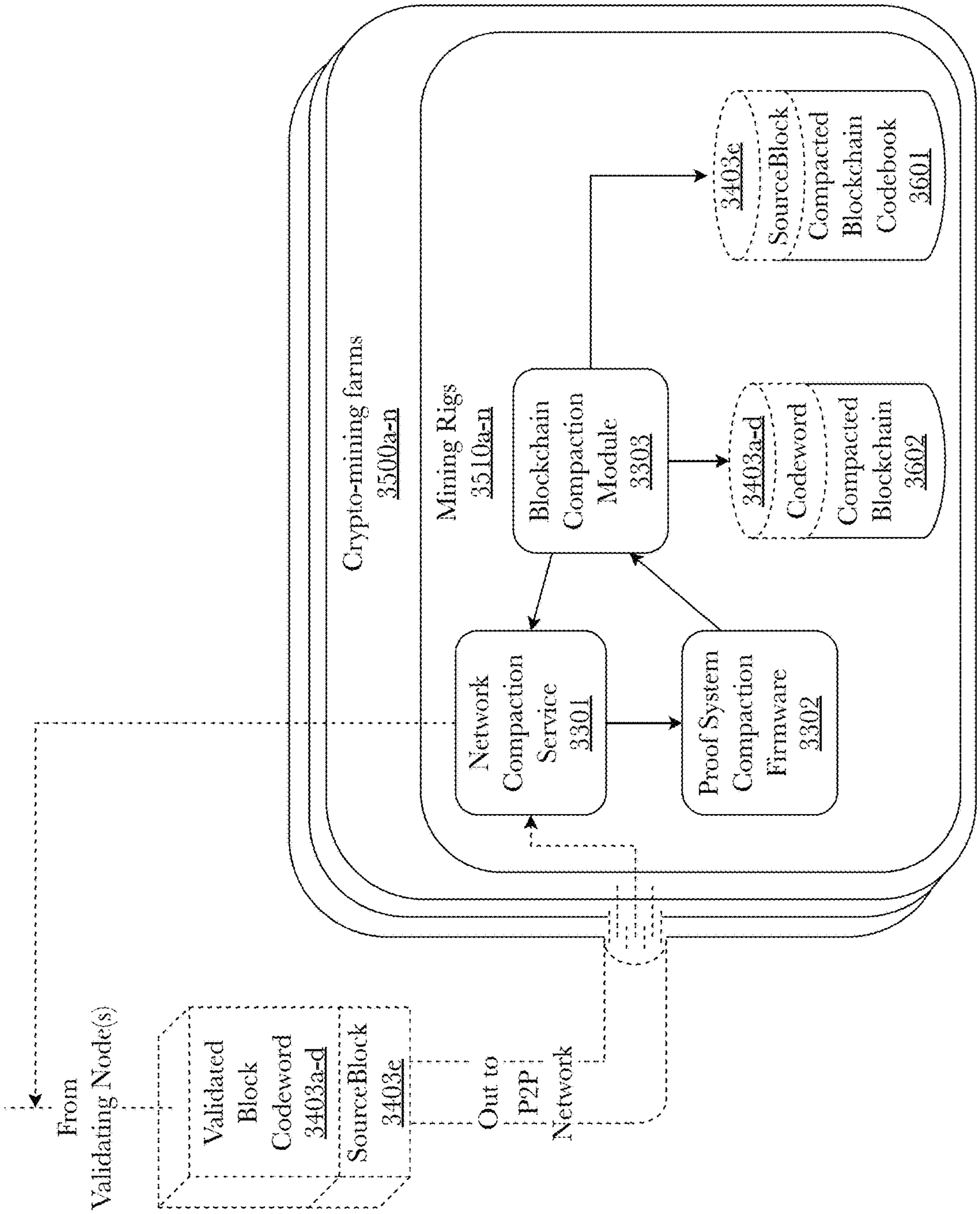
FIG. 36 is a block diagram illustrating an exemplary system implementation and process for validating blocks on a blockchain peer-to-peer network.

FIG. 36 is a block diagram illustrating an exemplary system implementation and process for validating blocks on a blockchain peer-to-peer network. After a new block is validated by a node, the validating node sends a validated block codeword 3403*a-d*—and sourceblock 3403*e* if necessary—to the other nodes of the network 35000*a-n*. The network compaction service 3301 decodes the validated block codeword 3403*a-d, e*, and the reconstructed block-chain block is validated by other nodes-using proof compaction firmware 3302, if available. Nodes need not have proof compaction firmware 3302 because the new block is already reconstructed, however it is preferred that nodes have the firmware 3302 to expedite the process of validation. If valid, that node also adds the block to its blockchain-preferably stored as a compacted blockchain 3602 with reference codebook 3601. That node then sends the valida-tion results back out to the network. Of note, it is common practice users of blockchain-based technologies to allow time from transaction request to validation from the con-sensus pool that way it is certain that the transaction is legitimate. For example, Bitcoin recommends that at least ten nodes verify the block containing a user's transaction before the user completes the trade of goods or services relating to that transaction. This time-to-wait is now reduced thanks to the systems and methods provide herein.

Additionally, and according to some embodiments, there may be three separate codebooks. One for LAN/WAN network transmission 1201, one for inter-core/chip/node 3501, and one for the actual blockchain 3601. It is antici-pated however that one or more of the preceding reference codebooks may be combined into one or two reference codebooks.

Figure 37:
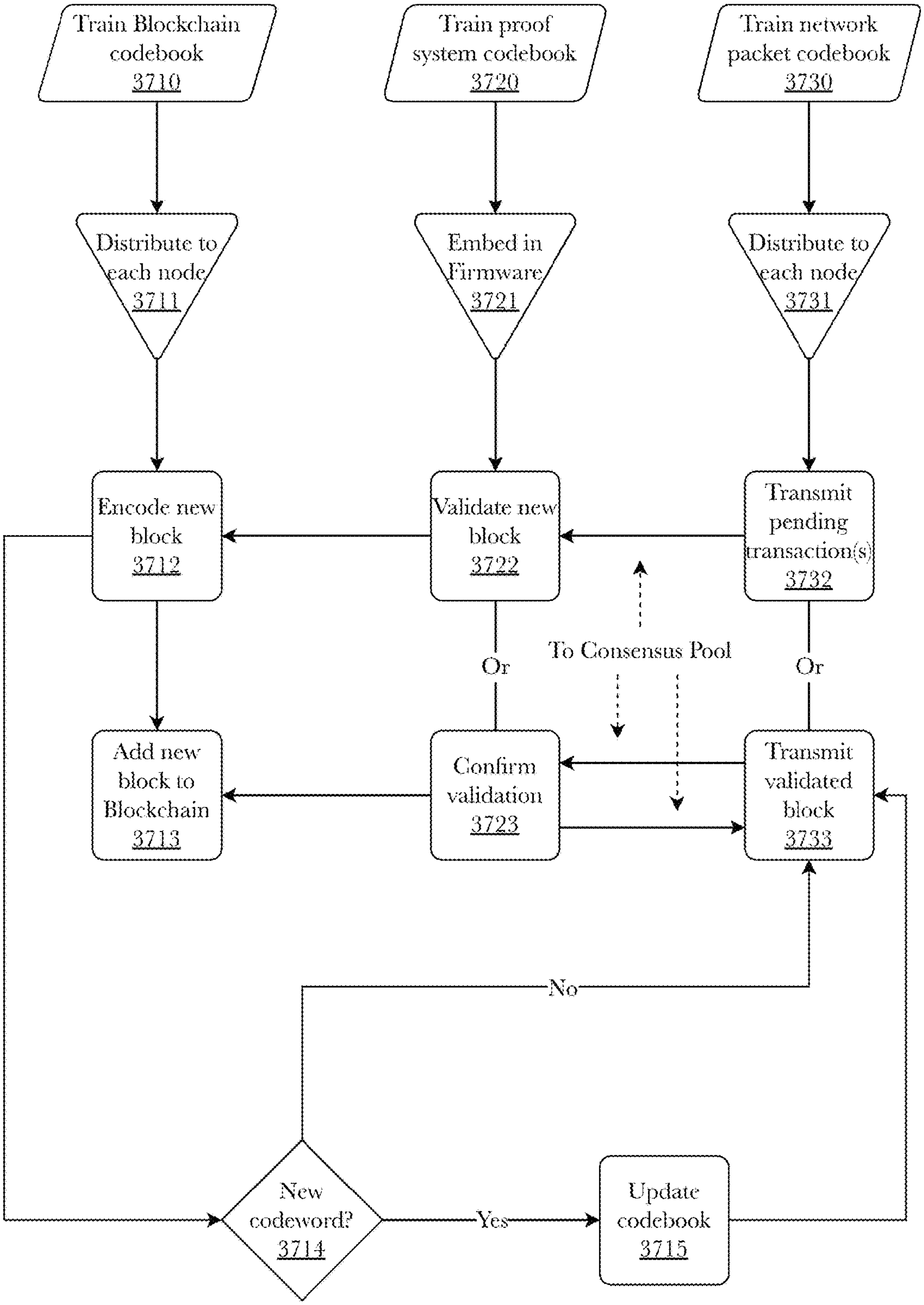
FIG. 37 is a flow diagram illustrating an exemplary method for compacting blockchains and blockchain related data on mining rigs and across the peer-to-peer network.

FIG. 37 is a flow diagram illustrating an exemplary method for compacting blockchains and blockchain related data on mining rigs and across the peer-to-peer network. According to one embodiment, a series of first steps for the method for blockchain data compaction comprises the steps of training a codebook for a blockchain 3710, a proof system 3720, and for network transmission 3730. Codebooks may be pretrained using training data or existing blockchain data either before the implementation of a new blockchain/crypto protocol or on an existing blockchain/crypto protocol.

In a series of second steps, deploy the system components comprising the codebooks and supporting elements to the appropriate location 3711/3731/3721. More specifically, dis-tributing the network compaction service and codebook to each node 3731 and using it comprises the steps of storing the network packet reference codebook, referred to also as a first reference codebook, in the memory of a blockchain computing node that is communicatively coupled to a plu-rality of other blockchain computing nodes, each blockchain computing node comprising a memory and at least one multi-core processor. The network of blockchain computing nodes creating a consensus pool for the blockchain.

Also store a first deconstruction algorithm in the memory of each of the blockchain computing nodes. The first decon-struction algorithm configured to receive network data intended for the consensus pool 3732/3733; deconstruct the network data intended for the consensus pool into a plurality of sourceblocks; encode the first plurality of sourceblocks into a first codeword using the first reference codebook; and send the first codeword to the consensus pool.

Nodes receiving the first codeword may use a first recon-struction algorithm stored in the memory of each of the blockchain computing nodes that causes the nodes to receive the first codeword and reconstruct the network data by decoding the first plurality of sourceblocks using the first reference codebook.

Distributing and executing the compacted blockchain and codebook 3711 comprises the steps of storing a second reference codebook—a proof system codebook—in the memory of each of the blockchain computing nodes, the second reference codebook pretrained by machine learning to determine sourceblocks and associated codewords of the blockchain 3710. Additionally, store a second deconstruction and second reconstruction algorithm in the memory of each of the blockchain computing nodes.

The first deconstruction algorithm receives a blockchain block 3722/3723; deconstructs the blockchain block into a second plurality of sourceblocks; encodes the second plurality of sourceblocks into a second codeword using the second reference codebook 3712; and appends the second codeword to a compacted blockchain 3713. The compacted blockchain comprises codewords for each block on the blockchain. To reconstruct the blockchain blocks, the second reconstruction algorithm reconstructs the blockchain block by decoding the second plurality of sourceblocks using the second reference codebook. The compacted blockchain and the blockchain codebook allow for less data to be sent over the network when transferring parts of or an entire blockchain.

The embedding of a proof system compaction firmware 3721 and the use thereof comprises the steps of storing a third reference codebook—a proof system codebook—embedded as firmware in the memory of each core in each of the multi-core processors of the mining rigs on the network. The third reference codebook pretrained by machine learning to determine sourceblocks and to associate codewords to each sourceblock 3720.

A third deconstruction algorithm when operating on each core causes the multi-core processors to receive data intended for a different core 3722/3723; deconstruct the data intended for a different core into a third plurality of sourceblocks; encode the third plurality of sourceblocks into a third codeword using the third reference codebook; and send the third codeword to the intended core.

Additionally, also store a third reconstruction algorithm embedded as firmware in the memory of each core in each of the multi-core processors. The third reconstruction algorithm is configured to receive the third codeword at the intended core and reconstruct the data intended for a different core by decoding the third plurality of sourceblocks using the third reference codebook.

According to one aspect, when the deconstruction of the various data generates a sourceblock and association not in the associated reference codebook 3714, update the appropriate reference codebook 3715.

Figure 38:
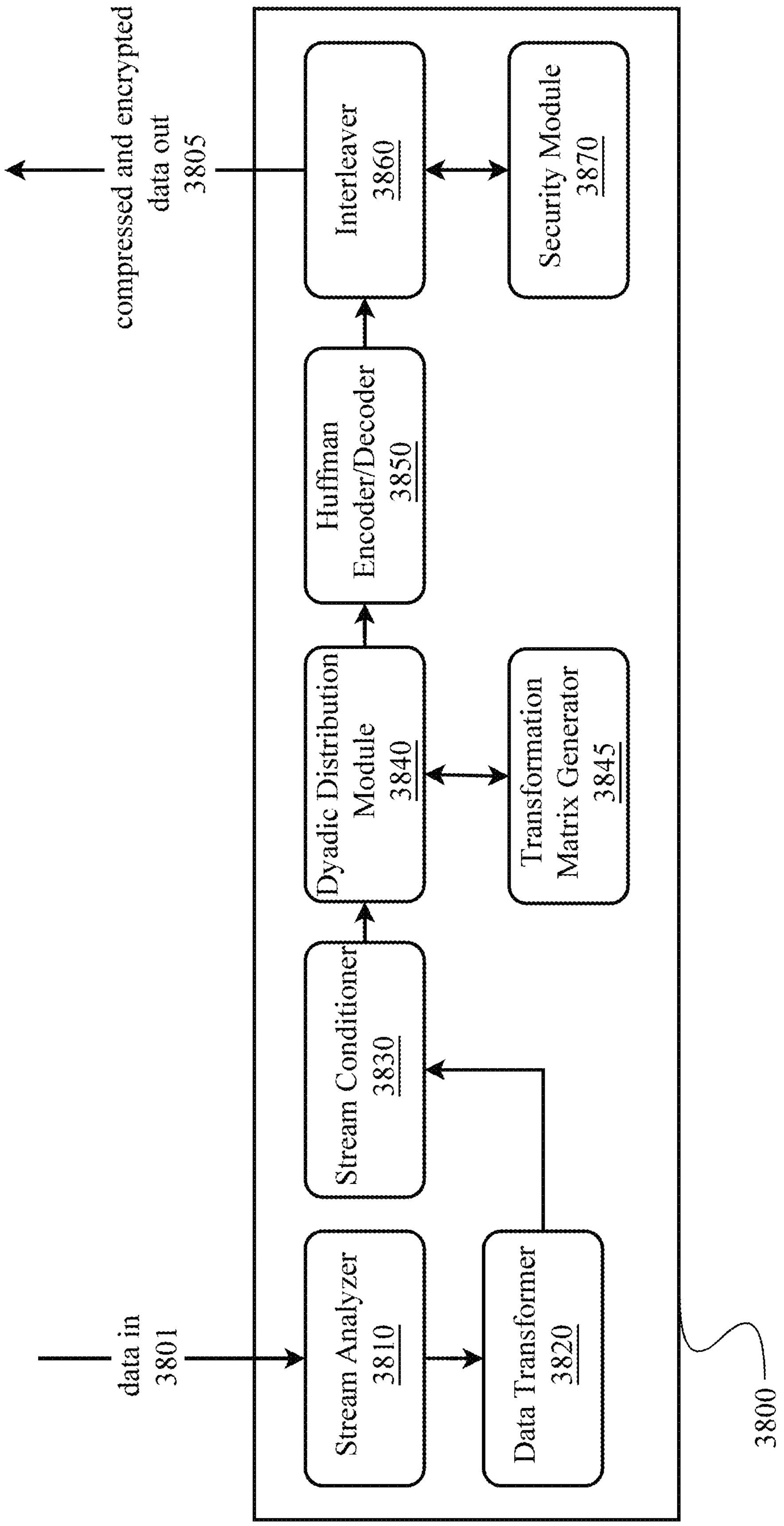
FIG. 38 is a block diagram illustrating an exemplary system architecture for a dyadic distribution-based compression and encryption platform, according to an embodiment.

FIG. 38 is a block diagram illustrating an exemplary system architecture for a dyadic distribution-based compression and encryption platform 3800, according to an embodiment. According to the embodiment, the platform 3800 comprises a stream analyzer 3810 which receives, retrieves, or otherwise obtains an input data stream 3801, a data transformer 3820, a stream conditioner 3830, an dyadic distribution algorithm subsystem module 3840 which integrates with a transformation matrix generator 3845, one or more Huffman encoder/decoders 3850, an interleaver 3860 which interfaces with a security subsystem module 3870 and which outputs a compressed and encrypted data stream 3805. In this exemplary architecture, data flows as illustrated. Stream analyzer 3810 first processes the input data 3801, passing its analysis to data transformer 3820. The stream conditioner 3830 then further processes the data before it's passed to dyadic distribution module 3840. The dyadic distribution module/subsystem 3840 works in conjunction with transformation matrix generator 3845 to apply the necessary transformations and generate a secondary transformation data stream. The Huffman encoder/decoder 3850 compresses the data into a compressed input data stream, which is then interleaved with the secondary transformation data stream by interleaver 3860. The security module 3870 interacts with interleaver 3860 to ensure the cryptographic properties of the output stream are maintained. This architecture allows for a modular implementation where each component can be optimized or replaced independently, while still maintaining the overall flow and functionality of the system.

In some implementations, platform 3800 may be implemented as a cloud-based service or system which hosts and/or supports various microservices or subsystems (e.g., components 3810-3870 implemented as microservices/subsystems). In some implementations, platform 3800 may be implemented as computing device comprising a memory and a processor, with computer readable programming instructions (or other computer-readable storage media) stored within the memory and operable/executable by/on the processor which cause the computing device to perform various operations associated with the execution of one or more platform tasks described herein.

According to the embodiment, stream analyzer 3810 is present and configured to analyze an input data stream to determine it statistical properties. This may comprise performing frequency analysis on data blocks within the input stream. It can determine the most frequent bytes or strings of bytes that occur at the beginning of each data block and designates these as prefixes. It may compile a prefix table based on the frequency distribution.

According to the embodiment, data transformer 3820 is present and configured to apply one or more transformations to the data to make it more compressible and secure. In an implementation, the platform applies the Burrows-Wheeler Transform (BWT) to the prefixes in the prefix table. This transformation makes the data more compressible while also providing a layer of encryption.

According to the embodiment, stream conditioner 3830 is present and configured to produce a conditioned data stream and an error stream. For example, for each data block, it compares the block's real frequency against an ideal frequency. If the difference exceeds a threshold, it applies a conditioning rule. It then applies a logical XOR operation and append the output to an error stream.

The dyadic distribution module 3840 receives the data stream and implements the core algorithm. This may comprise transforming the input data into a dyadic distribution whose Huffman encoding is close to uniform. It stores the transformations in a compressed secondary stream which may be (selectively) interwoven with the first, currently processing input stream.

Dyadic distribution module 3840 may integrate with transformation matrix generator 3845. The transformation matrix generator creates and manages the transformation matrix B. According to an aspect, the generator constructs a nonnegative, row-stochastic matrix where each entry represents the probability of transforming one state to another as an instance of matrix B. The matrix is configured to ensure that the transformation reshapes the data distribution while introducing controlled randomness.

According to an implementation, transformation matrix generator 3845 creates the transformation matrix B based on the initial analysis of the input data distribution provided by the stream analyzer. This matrix B is a component that dyadic distribution module 3840 will use throughout the process. As the dyadic distribution module receives each data block, it consults the transformation matrix B to determine how to transform the data. For each state (or symbol)

in the input data, the data transformer uses the corresponding row in matrix B to determine the probability distribution for transforming that state to other states. The dyadic distribution module may use a random number generator (such as provided by security module 3870) to select a transformation based on the probabilities in matrix B. This introduces controlled randomness into the process.

Through these transformations, the dyadic distribution module reshapes the data distribution to approach the dyadic distribution implied by the Huffman coding (as determined by the Huffman encoder/decoder). As transformations are applied, dyadic distribution module 3840 provides feedback to transformation matrix generator 3845 about the actual transformations performed. This allows the transformation matrix generator to refine matrix B if necessary. According to an embodiment, if the input data distribution changes over time, the transformation matrix generator can adapt matrix B based on new information from the stream analyzer. The dyadic distribution module will then use this updated matrix for subsequent transformations. The dyadic distribution module keeps track of the transformations it applies and generates a secondary data stream containing this information. This "transformation data" is important for the decoding process and may be interleaved with the main data stream by interleaver 3860. The transformation matrix generator continually works to optimize matrix B to minimize the amount of transformation data needed while maintaining the desired dyadic distribution.

Both transformation components (dyadic distribution module and matrix generator) work together to ensure that the transformations contribute to the cryptographic security of the system. The transformation matrix generator designs matrix B to make prediction of future states difficult, while the dyadic distribution module applies these transformations in a way that passes the modified next-bit test. In essence, the dyadic distribution module and transformation matrix generator form a tight feedback loop. The transformation matrix generator provides the rules for transformation (in the form of matrix B), while the dyadic distribution module applies these rules to the actual data. The results of these transformations then inform potential updates to the transformation rules, allowing the system to maintain optimal compression and security as it processes the data stream. This close interaction allows the system to dynamically balance compression efficiency and cryptographic security, adapting to changes in the input data characteristics while maintaining the core properties that make the dyadic distribution algorithm effective.

The input data then flows into a Huffman encoder/decoder 3850 which is configured to perform Huffman coding for compression and decoding for decompression. This may comprise constructing a Huffman tree based on the probability distribution of the input data, and assigning shorter codewords to more frequent symbols for compression. For decompression, it reverses the process.

According to the embodiment, interleaver 3860 is present and configured to interleave the compressed and encrypted data streams. This may comprise combining the main data stream (e.g., the input data stream that has been processed by one or more platform components) with the secondary "transformation data" stream according to a specific partitioning scheme to create the final output. This scheme is designed to maximize security while maintaining efficient compression. Interleaver 3860 may integrate with security module 3870 during data processing.

In an embodiment, security module implements security features such as the modified next-bit test. For example, the interleaver works with the security module to determine how many bits from each stream should be included in each block of the output. This allocation may be dynamic and based on security requirements and the current state of the data. In some implementations, before interleaving, the security module encrypts the transformation data using a cryptographic algorithm. This adds an extra layer of security to the sensitive information about how the data was transformed. In some implementations, the security module provides cryptographically secure random numbers to the interleaver (or other platform components such as dyadic distribution module). These may be used to introduce controlled randomness into the interleaving process, making it harder for an adversary to separate the two streams.

As the interleaver combines the streams, the security module performs ongoing checks to ensure the resulting stream maintains the required cryptographic properties, such as passing the modified next-bit test. According to an aspect, security module 3870 monitors the entropy of the interleaved stream. If the entropy drops below a certain threshold, it signals the interleaver to adjust its strategy, possibly by including more bits from the transformation data stream. In embodiments where the system uses cryptographic keys (e.g., for encrypting the transformation data), the security module manages these keys and provides them to the interleaver as needed. According to an aspect, based on feedback from the security module about the cryptographic strength of recent output, interleaver 3860 may adaptively change its interleaving strategy.

In an implementation, the security module advises the interleaver on how to maintain consistent timing in its operations to prevent timing-based attacks. This might involve adding deliberate delays or dummy operations. The interleaver may consult the security module on how to securely include any necessary headers or metadata in the output stream. This ensures that even auxiliary data doesn't compromise the system's security. According to an aspect, security module 3870 provides integrity check values (e.g., hash values or MAC codes) to interleaver 3860, which are then incorporated into the output stream. These allow the receiver to verify the integrity of the received data. According to another aspect, security module 3870 guides the interleaver in implementing techniques to resist side-channel attacks, such as ensuring that the power consumption or electromagnetic emissions during interleaving don't leak information about the data being processed.

In an implementation, if the interleaver encounters any issues during the interleaving process, it may consult the security module on how to handle these errors securely without leaking information about the underlying data or transformation process. In an implementation, the interleaver, guided by the security module, can include secure hints or markers in the output stream that will assist in the decoding process without compromising security. The interleaver and security module work in tandem to produce an output stream that is both compressed and securely encrypted. The interleaver focuses on efficiently combining the data streams, while the security module ensures that every step of this process maintains the cryptographic properties of the system. This close cooperation allows the platform to achieve its dual goals of data compression and encryption in a single, efficient process.

Figure 39:
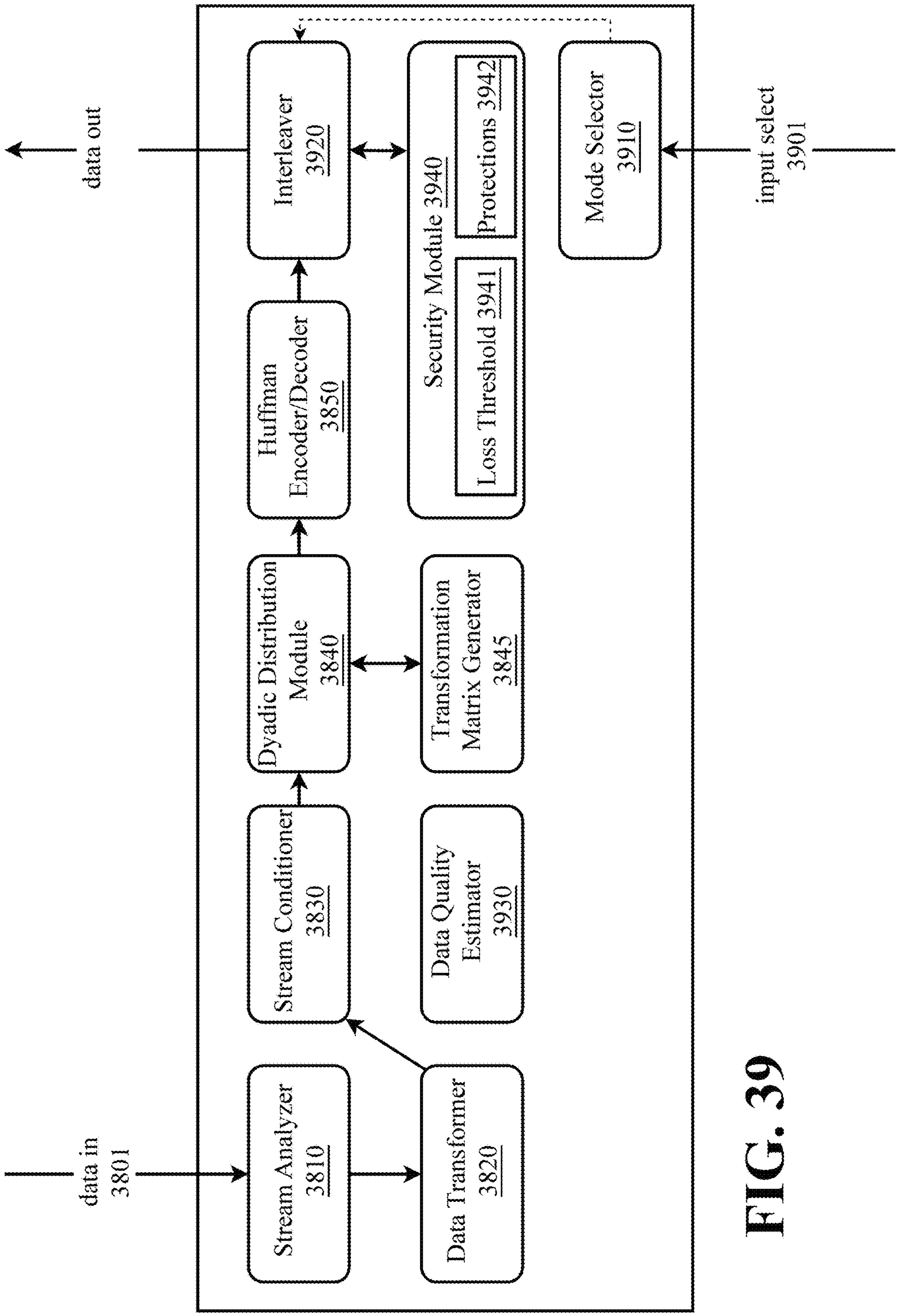
FIG. 39 is a block diagram illustrating another exemplary system architecture for a dyadic distribution-based compression and encryption platform, according to an embodiment.

FIG. 39 is a block diagram illustrating another exemplary system architecture for a dyadic distribution-based compression and encryption platform 3900, according to an embodiment. According to an embodiment, a modification to the compression and encryption platform 3900 could be implemented as an optional mode within the existing platform architecture, allowing for flexibility in its application. For example, this may require the addition of a mode selector component 3910, which can determine whether to operate in the original lossless mode, the new lossy, high-security mode, in a modified lossless mode. Mode selector 3910 may receive input data 3901 which selects or otherwise sets the mode of operation of platform 3900. Input select data may be received from various sources such as, for example, a platform user (human or computer implemented agent), or an external application, service, or computing resource.

According to an embodiment, the platform may be modified to only send the modified stream without the secondary stream containing the modification information. This alteration fundamentally changes the nature of the compression from lossless to lossy, while simultaneously strengthening the encryption aspect of the system. The dyadic distribution module, guided by transformation matrix generator 3840, would still modify the input data to achieve a dyadic distribution. However, without the accompanying transformation data stream, perfect reconstruction of the original data becomes impossible, even with possession of the codebook used by Huffman encoder/decoder 3850.

Interleaver 3920 may receive from mode selector 3910 a signal and/or instruction (illustrated as the dotted line) on what process to apply to the one or more input data streams. If the platform is configured to perform the original lossless mode, interleaver 3920 interleaves the compressed input data stream and the secondary transformation data stream. If the platform is configured to perform lossy compression, interleaver 3920 does not interleave the two data streams, but instead transmits only the compressed input data stream. If the platform is configured to perform a modified lossless compression, interleaver 3920 can transmit the compressed input data stream by itself in a first transmission session, and then it may transmit the secondary transformation data stream by itself in a second transmission session. In some embodiments, the secondary transformation data stream may be encrypted according to a suitable data encryption technique prior to transmission. Encryption techniques that may be implemented can include, but are not limited to, advance encryption standard (AES), asymmetric encryption (e.g., RSA), symmetric encryption (e.g., Twofish), and/or the like.

Security module's 3940 role becomes even more critical in the implementation of lossy modified system. It ensures that the encrypted data stream maintains its cryptographic strength, potentially approaching perfect encryption. The absence of the secondary stream eliminates a potential attack vector, as the transformation information is never transmitted. Interleaver's 3920 function would be simplified, focusing solely on managing the primary data stream, but it would still work closely with the security module to maintain the stream's cryptographic properties.

This approach presents a compelling trade-off between data integrity and transmission efficiency coupled with enhanced security. The stream analyzer's role remains the same in analyzing the input data characteristics, allowing the platform to optimize the compression and transformation processes. The loss of data introduced by this method is directly related to the transformations applied by the data transformer, guided by the transformation matrix generator.

Potential applications for this modified system include scenarios where perfect data reconstruction is not critical, but high compression ratios and stringent security requirements are paramount. Examples may include certain types of media streaming, sensor data transmission in IoT environments, or secure transmission of non-critical telemetry data.

According to an embodiment, to address concerns about data integrity, platform 3900 may incorporate a configurable loss threshold 3941 managed by security module 3940. This threshold can allow users to set a maximum acceptable level of data loss. If the estimated loss exceeds this threshold, the platform could automatically revert to the lossless mode or alert the user.

Additionally, the platform may be extended to include a data quality estimator component 5630. This component may work in conjunction with various components (e.g., stream analyzer, data transformer, dyadic distribution module) to provide real-time estimates of the quality of the compressed and encrypted data compared to the original. This could be particularly useful in applications like media streaming, where maintaining a certain level of perceptual quality is crucial.

Finally, it's worth noting that the lossy, high-security mode could potentially offer resistance to certain types of side-channel attacks, as the lack of perfect reconstruction could mask some of the subtle correlations that these attacks often exploit. In an embodiment, security module 3940 can be expanded to include specific protections 3942 against such attacks, further enhancing the overall security profile of the system. These protections would aim to mitigate various types of side-channel vulnerabilities that could potentially leak information about the encryption process or the data being processed. For example, some specific protections that may be implemented can include, but are not limited to, timing attack mitigation, power analysis countermeasures, electromagnetic emission protection, cache attack prevention, branch prediction attack mitigation, fault injection resistance, memory access patter obfuscation, randomization techniques, microarchitectural attack mitigations, side-channel resistant algorithms, runtime monitoring, and adaptive countermeasures.

FIG. 40 is a flow diagram illustrating an exemplary method 4000 for implementing a dyadic distribution algorithm, according to an aspect. The method may be performed, in whole or in part, by one or more dyadic distribution-based compression and encryption platforms. According to the aspect, the process begins at step 4001 when dyadic distribution module 3840 receives input data. The input data may have been previously analyzed and processed by other platform components (e.g., stream analyzer, data transformer). At step 4002, the platform creates a transformation matrix using a transformation matrix generator 3845. The transformation matrix may be referred to herein as matrix B. At step 4003, for each state in the input data, module 3840 consults matrix B to determine the probability distribution for transforming that state to other states. According to the aspect, at step 4004 the platform uses a secure random number generator to select a transformation based on the probabilities in the transformation matrix. At step 4005, the platform reshapes the data distribution to approach the dyadic distribution of Huffman encoding based on the selected transformations. At step 4006, the platform keeps track of the applied transformations and generates a secondary data stream.

Figure 41:
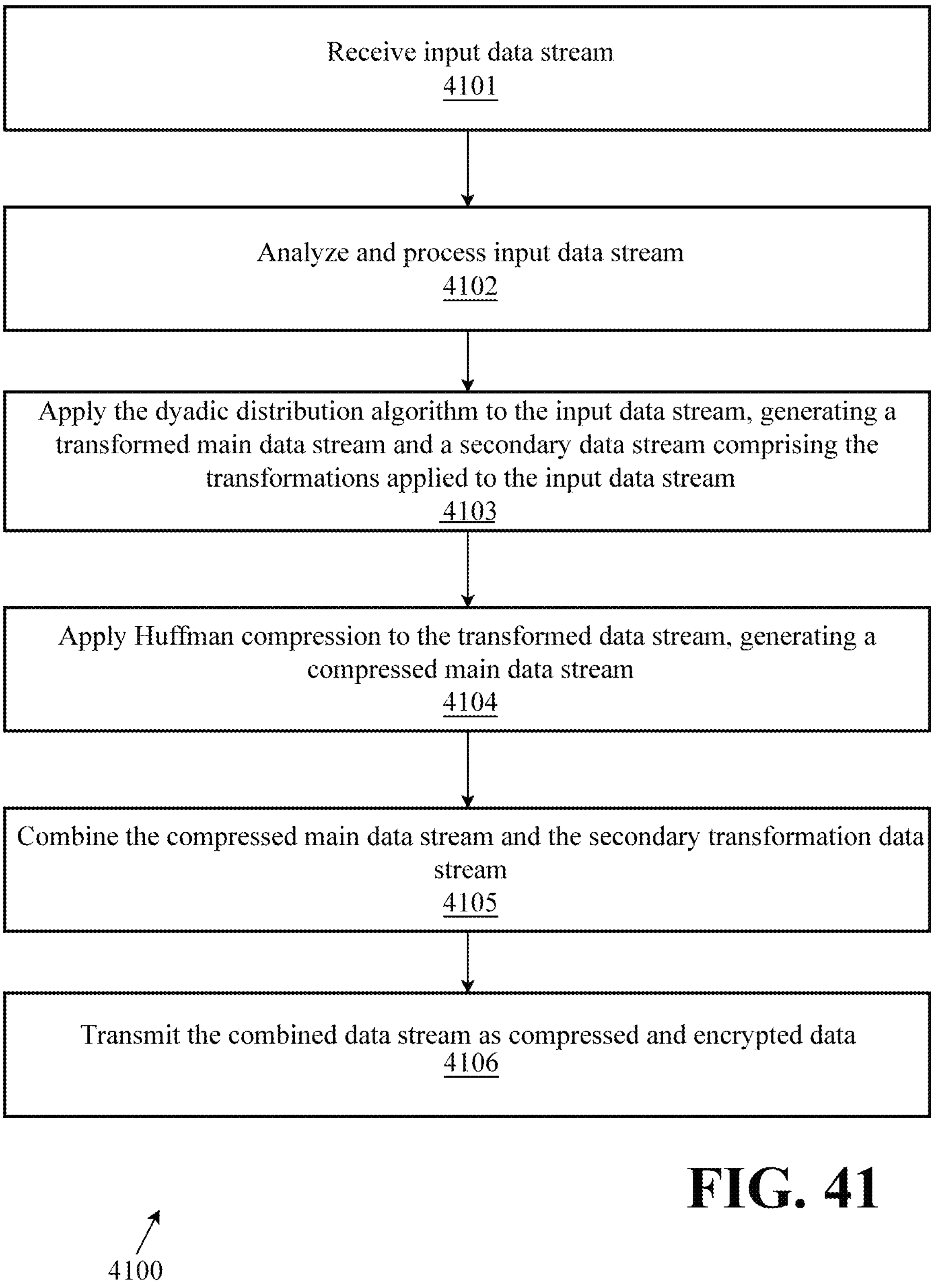
FIG. 41 is a flow diagram illustrating an exemplary method for providing lossless, dyadic distribution-based compression and encryption, according to an aspect.

FIG. 41 is a flow diagram illustrating an exemplary method 4100 for providing lossless, dyadic distribution-based compression and encryption, according to an aspect. According to the aspect, the process begins at step 4101 when platform 3800, 3900, receives, retrieves, or otherwise obtains an input data stream. At step 4102, the platform analyzes and processes the input data stream. This may comprise frequency analysis as performed by a stream analyzer subsystem and processing performed by a data transformer and/or a stream conditioner. At step 4103, the platform applies the dyadic distribution algorithm to the input data stream (which may have been processed at step 4102), generating a transformed main data stream and a secondary data stream comprising the transformations applied to the input data stream. The secondary data stream may be sent to an interleaver subsystem for transmission. At step 4104, the platform applies Huffman compression to the transformed main data stream, generating a compressed main data stream. The interleaver can obtain both data streams and combine them into an interleaved data stream at step 4105. At step 4106, the platform transmits the combined data stream as a compressed and encrypted data stream. The transmitted data may be received on the receiving end with a platform configured with a Huffman decoder which can decompress the received main data stream using the attached secondary stream and the proper codebook.

Figure 42:
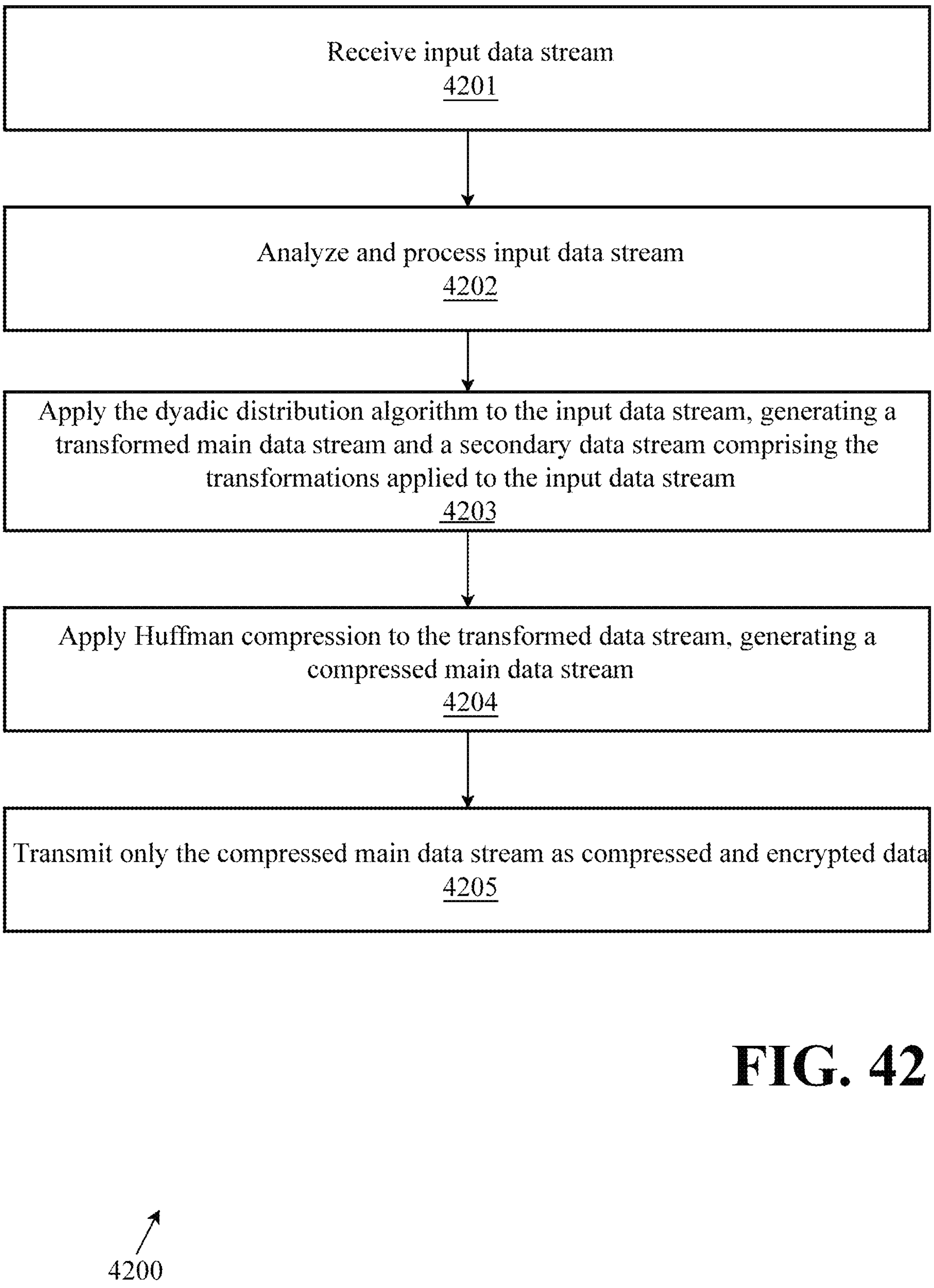
FIG. 42 is a flow diagram illustrating an exemplary method for providing lossy, dyadic distribution-based compression and encryption, according to an aspect.

FIG. 42 is a flow diagram illustrating an exemplary method 4200 for providing lossy, dyadic distribution-based compression and encryption, according to an aspect. According to the aspect, the process begins at step 4201 when platform 3800, 3900, receives, retrieves, or otherwise obtains an input data stream. At step 4202, the platform analyzes and processes the input data stream. This may comprise frequency analysis as performed by a stream analyzer subsystem and processing performed by a data transformer and/or a stream conditioner. At step 4203, the platform applies the dyadic distribution algorithm to the input data stream (which may have been processed at step 4202), generating a transformed main data stream and a secondary data stream comprising the transformations applied to the input data stream. At step 4204, the platform applies Huffman compression to the transformed main data stream, generating a compressed main data stream. In this embodiment, the platform may have obtained a mode of operation command which indicates the platform is to perform lossy compression. In such an embodiment, the interleaver does not obtain both data streams and combine them into an interleaved data stream at step. At step 4205, the platform transmits only the compressed main data stream as a compressed and encrypted data stream. The transmitted data may be received on the receiving end with a platform configured with a Huffman decoder which can decompress the received main data stream, however because there is no accompanying secondary data stream, the decompressed main data stream would be considered lossy because it cannot be reconstructed due to the dyadic transformations applied at step 4203.

Figure 43:
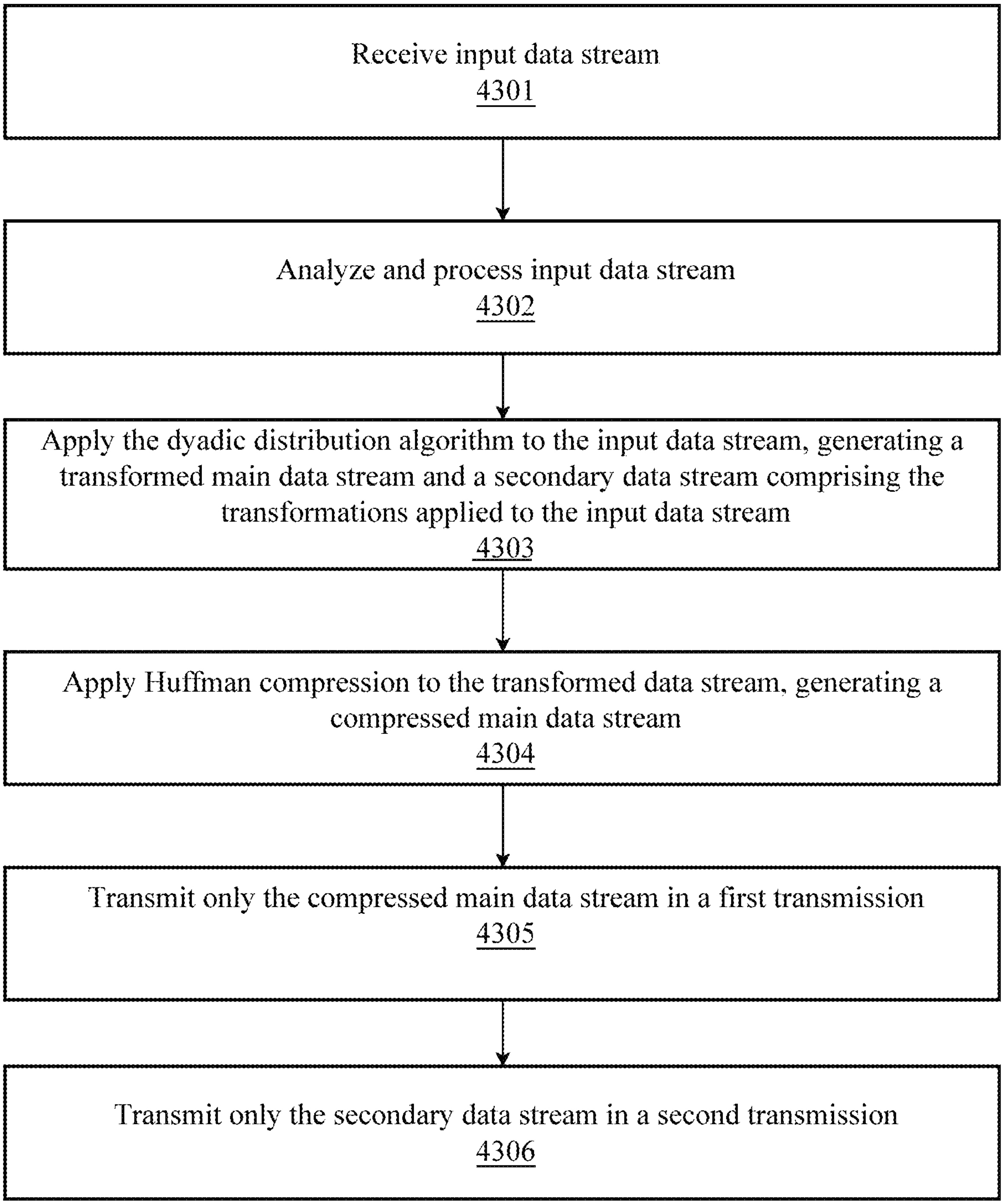
FIG. 43 is a flow diagram illustrating an exemplary method for providing modified lossless, dyadic distribution-based compression and encryption, according to an aspect.

FIG. 43 is a flow diagram illustrating an exemplary method 4300 for providing modified lossless, dyadic distribution-based compression and encryption, according to an aspect. According to the aspect, the process begins at step 4301 when platform 3800, 3900, receives, retrieves, or otherwise obtains an input data stream. At step 4302, the platform analyzes and processes the input data stream. This may comprise frequency analysis as performed by a stream analyzer subsystem and processing performed by a data transformer and/or a stream conditioner. At step 4303, the platform applies the dyadic distribution algorithm to the input data stream (which may have been processed at step 4302), generating a transformed main data stream and a secondary data stream comprising the transformations applied to the input data stream. The secondary data stream may be sent to an interleaver subsystem for transmission. At step 4304, the platform applies Huffman compression to the transformed main data stream, generating a compressed main data stream. In this embodiment, the platform may have obtained a mode of operation command which indicates the platform is to perform modified lossless compression. In such an embodiment, the interleaver does not combine both data streams into an interleaved data stream at step. At step 4305, the platform transmits only the compressed main data stream as a compressed and encrypted data stream. At step 4306, the platform transmits only the secondary data stream in a second transmission. The transmitted data may be received on the receiving end with a platform configured with a Huffman decoder which can decompress the received main data stream using the secondary data stream and the codebook.

FIG. 44 a block diagram illustrating an exemplary system architecture for integrating a dyadic distribution-based compression and encryption platform with existing data compaction components. The system demonstrates how encryption capabilities can be seamlessly added to core compression functionality through a modular integration approach that preserves the efficiency of the original compression system while adding cryptographic security.

Data deconstruction engine 102 operates as the initial processing point for incoming data, breaking down data streams into manageable sourceblocks that can be efficiently compressed. When encryption is enabled, these sourceblocks are routed through an integration layer 4400, which determines whether the data requires encryption based on system configuration, security policies, or user preferences. Integration layer 4400 acts as an intelligent router and coordinator, managing data flow between the compression components and the encryption platform while maintaining backward compatibility for scenarios where encryption is not required. This routing decision can be based on multiple factors: the data type (medical records might always require encryption), the destination (internal storage versus external transmission), or explicit user settings (a "secure mode" toggle).

Integration layer 4400 implements several key mechanisms to facilitate seamless operation between compression and encryption. First, it maintains a state machine that tracks the current processing mode for each data stream, allowing different streams to be processed with different security levels simultaneously. For instance, one data stream containing financial records could be processed with full encryption while another stream containing public web content could use compression-only mode for maximum speed. Second, integration layer 4400 includes buffer management capabilities that handle the different processing speeds of compression and encryption operations. Since encryption typically adds computational overhead, integration layer 4400 can buffer compressed data waiting for encryption, preventing bottlenecks in the processing pipeline. Third, it provides a unified API that allows the existing compression components to operate without modification, translating calls and data formats as needed to interface with encryption platform 3800.

Library manager 103 functions within the system by managing both compression codebooks and encryption-related transformation matrices. In traditional operation, library manager 103 maintains a database of sourceblock-to-codeword mappings. When operating in encrypted mode, library manager 103 coordinates with distribution-based compression and encryption platform 3800 to ensure that compression codewords and encryption transformations are properly synchronized. This synchronization prevents conflicts between compression and encryption operations and ensures that data can be efficiently processed through both stages without degradation in compression ratios or security properties. For example, if the compression system assigns codeword “0x1234” to a particular sourceblock pattern, library manager 103 ensures that this mapping is preserved through the encryption process, allowing for proper reconstruction even after encryption transformations have been applied.

Library manager 103 maintains a version control system for codebooks, ensuring that both the sending and receiving ends of a communication channel are using compatible versions. When a codebook is updated with new patterns, library manager 103 generates a differential update that can be efficiently transmitted to remote systems. Additionally, library manager 103 implements a cross-reference table that maps compression codewords to their encrypted equivalents, allowing for rapid translation during data processing. This cross-reference table is dynamically updated as new patterns are encountered and encoded, ensuring that the system can adapt to changing data characteristics without manual intervention.

Customized library generator 1300 and library optimizer 1400 work in tandem to create and refine the codebooks used by both compression and encryption operations. Customized library generator 1300 analyzes training data to identify patterns that can be efficiently encoded, using machine learning algorithms to predict which patterns are likely to occur frequently in future data. For instance, when processing source code files, the generator might identify that certain programming constructs occur frequently enough to warrant their own codewords. Library optimizer 1400 then prunes redundant entries and optimizes the codebook structure for fast lookups, potentially using techniques like Huffman coding to assign shorter codewords to more frequent patterns. When integrated with encryption platform 3800, these components also consider the cryptographic properties of the generated codewords, ensuring that the resulting codebooks support both efficient compression and strong encryption. This might involve avoiding codeword assignments that could create patterns vulnerable to frequency analysis attacks, or ensuring that the codeword space is distributed in a way that supports the dyadic distribution requirements of the encryption algorithm.

Transmission encoder/decoder 1500 handles the final encoding of data for transmission or storage, implementing sophisticated multiplexing and formatting algorithms to prepare data for various transmission media. In the integrated system, this component can produce either standard compressed output or encrypted compressed output, depending on the mode selected through integration layer 4400. When operating in standard compressed mode, transmission encoder/decoder 1500 might produce a data stream where each original 512-byte sourceblock is replaced with a 32-bit codeword, achieving a compression ratio of 128:1 for repeated blocks. In encrypted compressed mode, these codewords are further processed through encryption platform 3800, which applies dyadic distribution transformations that reshape the statistical properties of the data to achieve cryptographic security. The flexibility of this approach allows the system to adapt to different use cases, from high-speed data transmission where encryption overhead must be minimized, to high-security applications where maximum protection is required even at the cost of some performance.

Distribution-based compression and encryption platform 3800 implements the dyadic distribution algorithm and associated encryption techniques described in the invention, utilizing a mathematical framework to achieve both compression and encryption in a unified process. This platform can operate in multiple modes, including lossless encryption where both the main data stream and transformation information are transmitted, lossy encryption where only the main stream is sent for maximum security, and modified lossless where the streams are sent separately. For example, in lossless mode, a 1 megabyte compressed file might result in a 1.1 megabyte encrypted output (including the transformation stream), while in lossy mode, the same file might produce only 1 megabyte of output but without the ability to perfectly reconstruct the original. The platform integrates with the existing compression components through integration layer 4400, which manages mode selection, data routing, and synchronization between the compression and encryption operations.

Integration layer 4400 and distribution-based compression and encryption platform 3800 indicate may share a data pipeline, allowing for feedback and adaptive optimization. For example, the encryption platform can provide information about the cryptographic strength of the current data stream back to the integration layer, which can then adjust compression parameters or suggest alternative processing modes to maintain the desired balance between compression efficiency and security. This feedback mechanism might detect that certain compression patterns are creating vulnerabilities in the encrypted output and dynamically adjust the compression algorithm to avoid these patterns. Additionally, performance metrics such as throughput, latency, and compression ratios are continuously monitored and fed back to integration layer 4400, which can make real-time adjustments to optimize system performance. For instance, if encryption is causing excessive latency for a real-time video stream, integration layer 4400 might automatically switch to a faster encryption mode or temporarily disable encryption for non-critical frames while maintaining full encryption for keyframes.

The entire integrated system is designed with modularity and extensibility in mind, allowing for future enhancements and adaptations to new security requirements or compression techniques. The clean separation between compression and encryption functions, mediated by integration layer 4400, ensures that improvements to either subsystem can be implemented without requiring extensive modifications to the other. This architecture also supports gradual migration scenarios, where existing systems using only compression can be upgraded to support encryption by adding integration layer 4400 and encryption platform 3800 without modifying the core compression components. The system's ability to operate in multiple modes ensures that it can meet diverse requirements, from embedded systems with limited computational resources to high-performance data centers requiring maximum throughput, while maintaining the flexibility to balance compression efficiency and cryptographic security according to specific application needs.

FIG. 45 is a flow diagram illustrating an exemplary method for encrypted data compression and transmission. In a first step 4500, incoming data is received for initial processing and analysis. This step involves accepting data from various sources, which could include file systems, network streams, real-time sensors, or application outputs. The received data may be in any format, from structured database records to unstructured multimedia content, and the receiving process establishes initial parameters such as data size, format type, and any metadata that accompanies the data. During this initial reception, preliminary analysis may identify characteristics that will influence subsequent processing decisions, such as whether the data appears to contain repetitive patterns, its general entropy level, and any specific requirements for handling.

In a step 4510, the data is analyzed to break it into sourceblocks suitable for compression. This analysis process examines the data structure to determine optimal block sizes that balance compression efficiency with processing overhead. The analysis may employ various techniques including sliding window algorithms to identify repeating patterns, statistical analysis to determine optimal block boundaries, and adaptive sizing that adjusts block dimensions based on data characteristics. For instance, highly repetitive data might benefit from larger blocks to capture longer patterns, while random data might use smaller blocks to minimize overhead. The sourceblock creation process ensures that each block is self-contained and can be independently processed, which enables parallel processing and improves fault tolerance.

In a step 4520, the sourceblocks are routed through an integration layer which determines whether encryption is required. This routing decision is based on multiple factors including predefined security policies, data classification levels, destination requirements, and performance constraints. The integration layer evaluates each sourceblock or group of sourceblocks against these criteria, potentially consulting configuration files, security policies, or real-time system conditions. The routing mechanism may implement intelligent decision-making, such as recognizing that certain data patterns (like credit card numbers or personal identifiers) always require encryption, while other data types might be processed based on current system load or network conditions. This step ensures that only data requiring encryption undergoes the additional processing, optimizing overall system performance.

In a step 4530, the sourceblocks are processed to apply dyadic distribution transformations when encryption is enabled. This processing involves sophisticated mathematical transformations that reshape the statistical distribution of the data to approach a dyadic distribution, which provides cryptographic properties while maintaining compressibility. The transformation process utilizes a carefully constructed transformation matrix that maps input symbols to output symbols according to probability distributions that ensure security. Each sourceblock undergoes transformation where its symbols are systematically replaced according to the transformation matrix, with the specific transformations being recorded for later reconstruction. The process may involve multiple passes to achieve the desired distribution properties, with each pass refining the cryptographic characteristics while preserving the ability to compress the data effectively.

In a step 4540, codewords are generated using synchronized compression and encryption algorithms. This generation process involves creating compact representations of the sourceblocks that incorporate both compression and encryption properties. The synchronization ensures that compression codebooks and encryption transformations work harmoniously, preventing conflicts that could reduce efficiency or security. The codeword generation may employ various techniques including Huffman coding for compression efficiency, with modifications to ensure cryptographic security. Each sourceblock is mapped to a codeword that represents both its compressed form and its encrypted state, with the mapping process considering factors such as frequency of occurrence, cryptographic strength, and decoding efficiency. The synchronized approach ensures that frequently occurring patterns receive efficient encodings while maintaining unpredictability from a security perspective.

In a step 4550, the combined compression-encryption codebooks are optimized to improve efficiency. This optimization process analyzes the generated codewords and their mappings to identify opportunities for improvement. Optimization techniques may include consolidating similar codewords, removing redundant entries, rebalancing code lengths based on actual usage patterns, and ensuring that the codebook structure supports fast lookup operations.

The optimization process also considers the dual requirements of compression and encryption, potentially making trade-offs between compression ratio and cryptographic strength. For example, the optimization might identify that certain codeword assignments create detectable patterns and reassign them to maintain security, even if this slightly reduces compression efficiency. The optimization may be performed periodically as new data patterns are encountered, ensuring that the codebooks remain efficient for current data characteristics.

In a step 4560, the final compressed and encrypted data stream is encoded for transmission. This encoding process packages the codewords and any necessary metadata into a format suitable for the intended transmission medium or storage system. The encoding handles various technical requirements such as byte alignment, error detection codes, synchronization markers, and protocol-specific headers. The process ensures that the encoded stream can be reliably transmitted across various media, from high-speed fiber optic networks to wireless connections with potential packet loss. The encoding may include provisions for partial reconstruction, where portions of the data can be decoded independently, and may incorporate forward error correction to handle transmission errors without requiring retransmission.

In a step 4570, the secured data stream is transmitted to the intended recipient or storage location. This transmission process handles the actual movement of data across networks or to storage systems, implementing appropriate protocols for reliable delivery. The transmission may employ various strategies depending on the requirements, such as streaming for real-time applications where data is sent as it becomes available, or batch transmission for efficiency when latency is not a concern. The process includes mechanisms for confirming successful delivery, handling transmission errors, and potentially retransmitting lost portions. For storage scenarios, this step ensures that the compressed and encrypted data is properly written to persistent storage with appropriate indexing and metadata to enable later retrieval. The transmission process maintains the security properties established in earlier steps while optimizing for the specific characteristics of the transmission medium or storage system.

FIG. 46 is a flow diagram illustrating an exemplary method for unified codebook synchronization for compression and encryption. In a first step 4600, initialization occurs with existing compression codebooks and reference codes. This initialization process involves loading previously established compression mappings that associate data patterns with their compressed representations. The existing codebooks may contain thousands or millions of entries accumulated through prior training on representative data sets, with each entry consisting of a source pattern and its corresponding compressed reference code. During initialization, these codebooks are validated for integrity, checked for version compatibility, and loaded into memory structures optimized for rapid lookup operations. The initialization process also establishes baseline metrics for compression performance, including average compression ratios, lookup speeds, and memory utilization, which will be used to evaluate the effectiveness of the unified codebook approach.

In a step 4610, encryption-specific transformation matrices are generated for dyadic distribution processing. This generation process creates mathematical structures that will guide how data is transformed to achieve cryptographic security while maintaining compressibility. The transformation matrices are designed as row-stochastic matrices where each row sums to one, representing probability distributions for symbol transformations. The generation process considers cryptographic requirements such as diffusion and confusion, ensuring that small changes in input produce large, unpredictable changes in output. Multiple matrices may be generated for different security levels or data types, with each matrix carefully constructed to reshape data distributions toward dyadic properties that enable both compression and encryption. The generation algorithm ensures that the transformations are reversible, allowing for data reconstruction while maintaining cryptographic strength against various attack vectors.

In a step 4620, compression codebooks are synchronized with encryption codebooks through a unified interface. This synchronization process establishes mappings between compression codes and their encrypted equivalents, ensuring that both subsystems can operate on the same data without conflicts. The unified interface provides abstraction layer that allows compression and encryption operations to share data structures and lookup mechanisms while maintaining their distinct functionalities. During synchronization, each compression codebook entry is analyzed to determine how it will interact with the encryption transformations, with potential conflicts identified and resolved. The process may involve creating intermediate mapping tables that translate between compression-optimized and encryption-optimized representations, ensuring that neither function is compromised by the integration.

In a step 4630, unified key-value pairs are created that support both compression and encryption operations. This creation process generates composite data structures where each entry simultaneously serves compression and encryption purposes. Each unified key-value pair contains the original data pattern as the key, with the value containing both the compressed representation and the encryption transformation parameters. The creation process carefully balances the requirements of both operations, potentially using multi-dimensional optimization to find representations that are both compact and cryptographically secure. For frequently occurring patterns, the process may generate multiple encryption variants to prevent frequency analysis attacks while maintaining compression efficiency. The unified pairs are structured to support fast bidirectional lookups, enabling both encoding and decoding operations to proceed efficiently.

In a step 4640, the unified codebook is optimized to remove redundancies and improve lookup efficiency. This optimization process analyzes the complete set of unified key-value pairs to identify opportunities for consolidation and performance improvement. Redundancy removal involves identifying entries that produce identical or near-identical results and consolidating them into single entries with appropriate mapping logic. The optimization also restructures the codebook for faster access, potentially using techniques such as hash tables for exact matches, tries for prefix matching, or bloom filters for quick existence checks. Memory layout optimization ensures that frequently accessed entries are co-located to improve cache performance, while less common entries may be compressed or moved to secondary storage. The optimization process maintains the cryptographic properties of the encryption transformations while maximizing compression efficiency and lookup speed.

In a step 4650, the synchronized codebooks are distributed to all components requiring access. This distribution process ensures that every processing element has access to the current version of the unified codebook, maintaining consistency across distributed operations. The distribution may employ various strategies depending on the deployment architecture, including full replication for small codebooks, differential updates for large codebooks, or on-demand loading for resource-constrained environments. The process includes mechanisms for atomic updates to prevent inconsistencies during distribution, version tracking to ensure all components use compatible codebooks, and rollback capabilities in case of distribution failures. For distributed systems, the distribution process may utilize gossip protocols, hierarchical distribution trees, or centralized push mechanisms to efficiently propagate codebook updates while minimizing network overhead.

In a step 4660, all processing modules are updated with the unified codebook for seamless operations. This update process ensures that compression and encryption operations throughout the processing pipeline use the new unified codebook consistently. The update mechanism is designed to minimize disruption to ongoing operations, potentially using techniques such as blue-green deployment where new codebooks are loaded alongside existing ones before switching. Each processing module validates the new codebook against its operational requirements, performs any necessary internal restructuring to accommodate the unified format, and updates its processing algorithms to utilize the new key-value pairs effectively. The update process includes verification steps to ensure that each module can correctly encode and decode data using the unified codebook before committing to the update.

In a step 4670, codebook performance and synchronization status are monitored continuously. This monitoring process tracks various metrics to ensure that the unified codebook continues to meet performance and security requirements over time. Performance monitoring includes measuring compression ratios, encryption/decryption speeds, lookup times, and memory utilization across all processing modules. Synchronization monitoring verifies that all components maintain consistent codebook versions and that updates propagate correctly throughout the system. The monitoring process may detect anomalies such as degrading compression ratios that indicate the need for codebook retraining, or synchronization delays that could impact system consistency. Based on monitoring results, the process can trigger automatic optimizations, initiate codebook updates, or alert administrators to potential issues requiring intervention. Continuous monitoring ensures that the unified approach maintains its effectiveness as data patterns evolve and system requirements change.

FIG. 47 is a flow diagram illustrating an exemplary method for selective mode-based data processing. In a first step 4700, data is received along with specific processing mode requirements from the source. This reception process involves accepting both the data payload and associated metadata that specifies how the data should be processed. The processing mode requirements may be explicitly defined through header fields, configuration parameters, or API calls, or they may be implicitly determined based on data type, source identity, or destination requirements. The requirements might specify preferences for compression ratio versus processing speed, security level requirements ranging from no encryption to maximum security, latency constraints for real-time applications, or quality requirements that determine whether lossy processing is acceptable. The reception process ensures that both data and requirements are properly captured and validated before processing begins, establishing the foundation for appropriate mode selection.

In a step 4710, the required security level and compression needs for the data are evaluated. This evaluation process performs a comprehensive analysis of multiple factors to determine optimal processing parameters. Security level evaluation considers the sensitivity of the data content, regulatory compliance requirements such as HIPAA for medical data or PCI-DSS for payment information, the trustworthiness of the transmission channel, and the security capabilities of the intended recipient. Compression needs assessment examines the data's inherent compressibility through entropy analysis, the acceptable trade-off between compression ratio and processing time, available computational resources for compression operations, and storage or bandwidth constraints that might prioritize higher compression. The evaluation process may employ rule-based systems, machine learning models, or hybrid approaches to make intelligent decisions based on the combination of requirements and constraints.

In a step 4720, the appropriate operating mode is selected from available options. This selection process chooses among multiple processing modes based on the evaluation results from the previous step. Available modes typically include compression-only mode for maximum speed with no encryption, lossless compression with encryption where data can be perfectly reconstructed, lossy compression with encryption for maximum security at the cost of perfect reconstruction, modified lossless mode where compression and encryption streams are handled separately, and potentially hybrid modes that apply different processing to different portions of the data. The selection algorithm weighs various factors including security requirements, performance constraints, resource availability, and quality requirements to choose the optimal mode. The process may implement intelligent defaults for common scenarios while allowing override capabilities for special cases.

In a step 4730, data is routed through either compression-only or combined compression-encryption pipelines. This routing process directs data flow based on the selected operating mode, implementing efficient switching mechanisms to minimize overhead. For compression-only mode, data is routed directly to compression algorithms, bypassing encryption-related processing entirely to maximize throughput. For combined modes, data flows through integrated pipelines where compression and encryption operations are coordinated to optimize both functions. The routing mechanism may implement parallel processing paths where different data chunks can be processed simultaneously through different pipelines, dynamic load balancing to distribute processing across available resources, and buffering strategies to smooth out processing rate differences between pipeline stages. The routing infrastructure ensures that data maintains proper ordering and that mode switches can occur seamlessly between different data segments if required.

In a step 4740, data is processed through the appropriate pipeline based on the selected mode. This processing implements the actual compression and/or encryption operations according to the selected mode's specifications. In compression-only mode, processing applies optimal compression algorithms such as dictionary-based encoding, statistical compression, or specialized algorithms for specific data types. In combined compression-encryption modes, processing coordinates both operations to achieve synergistic benefits, such as applying compression before encryption to reduce the data volume requiring cryptographic processing, or using unified algorithms that achieve both compression and encryption simultaneously. The processing adapts to data characteristics in real-time, potentially switching between different algorithms or parameters based on observed compression ratios or processing speeds. For lossy modes, the processing includes controlled information reduction that maintains essential data characteristics while maximizing compression and security.

In a step 4750, data is reconstructed using mode-appropriate decoding algorithms. This reconstruction process reverses the compression and/or encryption operations to recover the original or approximate data. For lossless modes, reconstruction perfectly recovers the original data by applying inverse operations in the correct sequence, using stored transformation information to reverse encryption operations, and decompressing data using the inverse of the compression algorithm. For lossy modes, reconstruction produces an approximation of the original data within acceptable quality bounds, using error correction or interpolation to smooth artifacts introduced by lossy compression. The reconstruction process handles mode-specific requirements such as separate handling of compression and encryption streams in modified lossless mode, or quality validation in lossy modes to ensure output meets minimum requirements. Error handling mechanisms detect and respond to corruption or missing data according to mode-specific policies.

In a step 4760, output integrity is verified based on the selected mode's requirements. This verification process ensures that the reconstructed data meets the quality and integrity standards appropriate for the selected operating mode. For lossless modes, verification confirms bit-perfect reconstruction through checksums, cryptographic hashes, or direct comparison with test vectors. For lossy modes, verification ensures that quality metrics fall within acceptable ranges, using perceptual quality measures for multimedia data, statistical similarity measures for numerical data, or application-specific validation for specialized data types. The verification process may also validate that security properties have been maintained, such as confirming that encrypted data shows appropriate randomness characteristics or that compression has not introduced patterns that could compromise security. Failed verifications trigger appropriate error handling, which might include retransmission requests, fallback to more conservative processing modes, or error reporting to higher-level systems.

In a step 4770, the processed data is delivered in the format specified by the selected operating mode. This delivery process packages the reconstructed data according to the requirements and expectations established during initial reception. The delivery format accommodates mode-specific characteristics such as including quality indicators for lossy modes, providing separate streams for modified lossless mode, or adding authentication tokens for encrypted modes. The delivery mechanism ensures proper formatting for the destination system, including appropriate headers, metadata, and structure markers that identify the processing mode used and any relevant parameters for future processing. For streaming applications, delivery may occur incrementally as data is processed, while batch applications might accumulate complete results before delivery. The delivery process includes confirmation mechanisms to ensure successful receipt and may maintain temporary copies to support retransmission if required. The final delivery completes the processing cycle, providing data in the exact format required by the destination application or system.

Detailed Description of Exemplary Aspects

Since the library consists of re-usable building sourceblocks, and the actual data is represented by reference codes to the library, the total storage space of a single set of data would be much smaller than conventional methods, wherein the data is stored in its entirety. The more data sets that are stored, the larger the library becomes, and the more data can be stored in reference code form.

As an analogy, imagine each data set as a collection of printed books that are only occasionally accessed. The amount of physical shelf space required to store many collections would be quite large, and is analogous to conventional methods of storing every single bit of data in every data set. Consider, however, storing all common elements within and across books in a single library, and storing the books as references codes to those common elements in that library. As a single book is added to the library, it will contain many repetitions of words and phrases. Instead of storing the whole words and phrases, they are added to a library, and given a reference code, and stored as reference codes. At this scale, some space savings may be achieved, but the reference codes will be on the order of the same size as the words themselves. As more books are added to the library, larger phrases, quotations, and other words patterns will become common among the books. The larger the word patterns, the smaller the reference codes will be in relation to them as not all possible word patterns will be used. As entire collections of books are added to the library, sentences, paragraphs, pages, or even whole books will become repetitive. There may be many duplicates of books within a collection and across multiple collections, many references and quotations from one book to another, and much common phraseology within books on particular subjects. If each unique page of a book is stored only once in a common library and given a reference code, then a book of 1,000 pages or more could be stored on a few printed pages as a string of codes referencing the proper full-sized pages in the common library. The physical space taken up by the books would be dramatically reduced. The more collections that are added, the greater the likelihood that phrases, paragraphs, pages, or entire books will already be in the library, and the more information in each collection of books can be stored in reference form. Accessing entire collections of books is then limited not by physical shelf space, but by the ability to reprint and recycle the books as needed for use.

The projected increase in storage capacity using the method herein described is primarily dependent on two factors: 1) the ratio of the number of bits in a block to the number of bits in the reference code, and 2) the amount of repetition in data being stored by the system.

With respect to the first factor, the number of bits used in the reference codes to the sourceblocks must be smaller than the number of bits in the sourceblocks themselves in order for any additional data storage capacity to be obtained. As a simple example, 16-bit sourceblocks would require 216, or 65,536, unique reference codes to represent all possible patterns of bits. If all possible 65,536 blocks patterns are utilized, then the reference code itself would also need to contain sixteen bits in order to refer to all possible 65,536 blocks patterns. In such case, there would be no storage savings. However, if only 16 of those block patterns are utilized, the reference code can be reduced to 4 bits in size, representing an effective compression of 4 times (16 bits/4 bits=4) versus conventional storage. Using a typical block size of 512 bytes, or 4,096 bits, the number of possible block patterns is $2^{4,096}$, which for all practical purposes is unlimited. A typical hard drive contains one terabyte (TB) of physical storage capacity, which represents 1,953,125,000, or roughly $2^{31}$, 512 byte blocks. Assuming that 1 TB of unique 512-byte sourceblocks were contained in the library, and that the reference code would thus need to be 31 bits long, the effective compression ratio for stored data would be on the order of 132 times (4,096/31≈132) that of conventional storage.

With respect to the second factor, in most cases it could be assumed that there would be sufficient repetition within a data set such that, when the data set is broken down into sourceblocks, its size within the library would be smaller than the original data. However, it is conceivable that the initial copy of a data set could require somewhat more storage space than the data stored in a conventional manner, if all or nearly all sourceblocks in that set were unique. For example, assuming that the reference codes are $1/10^{th}$ the size of a full-sized copy, the first copy stored as sourceblocks in the library would need to be 1.1 megabytes (MB), (1 MB for the complete set of full-sized sourceblocks in the library and 0.1 MB for the reference codes). However, since the sourceblocks stored in the library are universal, the more duplicate copies of something you save, the greater efficiency versus conventional storage methods. Conventionally, storing 10 copies of the same data requires 10 times the storage space of a single copy. For example, ten copies of a 1 MB file would take up 10 MB of storage space. However, using the method described herein, only a single full-sized copy is stored, and subsequent copies are stored as reference codes. Each additional copy takes up only a fraction of the space of the full-sized copy. For example, again assuming that the reference codes are $1/10^{th}$ the size of the full-size copy, ten copies of a 1 MB file would take up only 2 MB of space (1 MB for the full-sized copy, and 0.1 MB each for ten sets of reference codes). The larger the library, the more likely that part or all of incoming data will duplicate sourceblocks already existing in the library.

The size of the library could be reduced in a manner similar to storage of data. Where sourceblocks differ from each other only by a certain number of bits, instead of storing a new sourceblock that is very similar to one already existing in the library, the new sourceblock could be represented as a reference code to the existing sourceblock, plus information about which bits in the new block differ from the existing block. For example, in the case where 512 byte sourceblocks are being used, if the system receives a new sourceblock that differs by only one bit from a sourceblock already existing in the library, instead of storing a new 512 byte sourceblock, the new sourceblock could be stored as a reference code to the existing sourceblock, plus a reference to the bit that differs. Storing the new sourceblock as a reference code plus changes would require only a few bytes of physical storage space versus the 512 bytes that a full sourceblock would require. The algorithm could be optimized to store new sourceblocks in this reference code plus changes form unless the changes portion is large enough that it is more efficient to store a new, full sourceblock.

It will be understood by one skilled in the art that transfer and synchronization of data would be increased to the same extent as for storage. By transferring or synchronizing reference codes instead of full-sized data, the bandwidth requirements for both types of operations are dramatically reduced.

In addition, the method described herein is inherently a form of encryption. When the data is converted from its full form to reference codes, none of the original data is contained in the reference codes. Without access to the library of sourceblocks, it would be impossible to reconstruct any portion of the data from the reference codes. This inherent property of the method described herein could obviate the need for traditional encryption algorithms, thereby offsetting most or all of the computational cost of conversion of data back and forth to reference codes. In theory, the method described herein should not utilize any additional computing power beyond traditional storage using encryption algorithms. Alternatively, the method described herein could be in addition to other encryption algorithms to increase data security even further.

In other embodiments, additional security features could be added, such as: creating a proprietary library of sourceblocks for proprietary networks, physical separation of the reference codes from the library of sourceblocks, storage of the library of sourceblocks on a removable device to enable easy physical separation of the library and reference codes from any network, and incorporation of proprietary sequences of how sourceblocks are read and the data reassembled.

Figure 7:
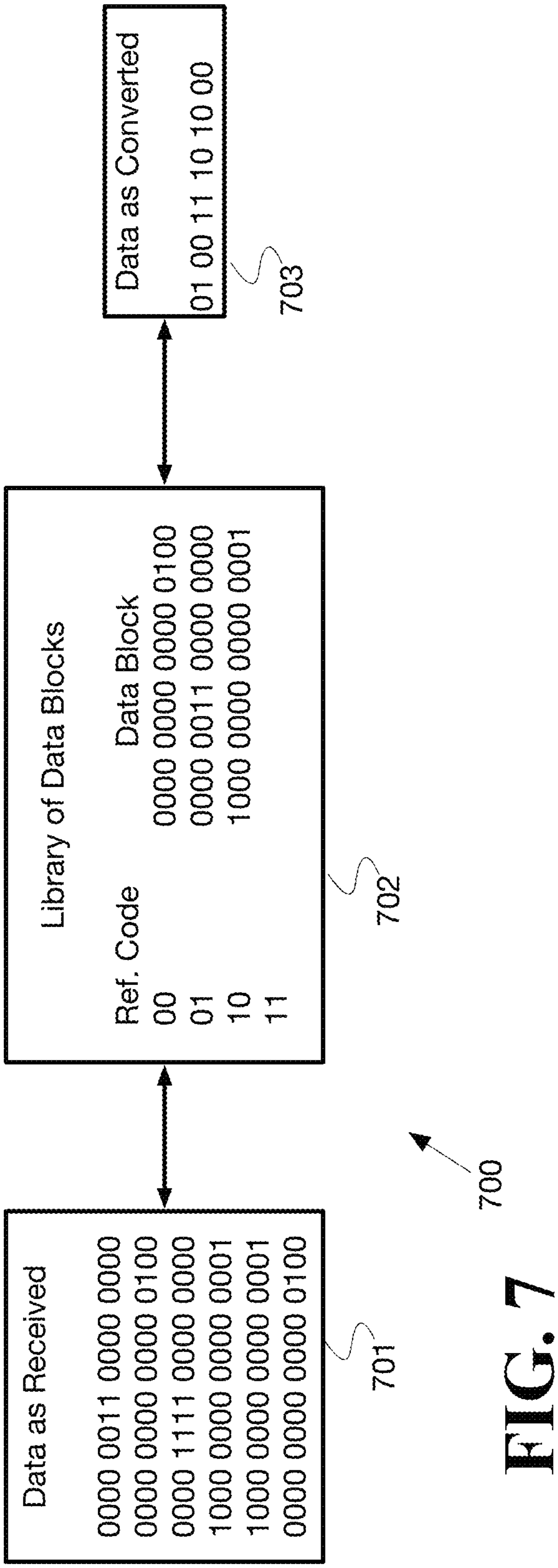
FIG. 7 is a diagram showing an example of how data might be converted into reference codes using an aspect of an embodiment.

FIG. 7 is a diagram showing an example of how data might be converted into reference codes using an aspect of an embodiment 700. As data is received 701, it is read by the processor in sourceblocks of a size dynamically determined by the previously disclosed sourceblock size optimizer 410. In this example, each sourceblock is 16 bits in length, and the library 702 initially contains three sourceblocks with reference codes 00, 01, and 10. The entry for reference code 11 is initially empty. As each 16 bit sourceblock is received, it is compared with the library. If that sourceblock is already contained in the library, it is assigned the corresponding reference code. So, for example, as the first line of data (0000 0011 0000 0000) is received, it is assigned the reference code (01) associated with that sourceblock in the library. If that sourceblock is not already contained in the library, as is the case with the third line of data (0000 1111 0000 0000) received in the example, that sourceblock is added to the library and assigned a reference code, in this case 11. The data is thus converted 703 to a series of reference codes to sourceblocks in the library. The data is stored as a collection of codewords, each of which contains the reference code to a sourceblock and information about the location of the sourceblocks in the data set. Reconstructing the data is performed by reversing the process. Each stored reference code in a data collection is compared with the reference codes in the library, the corresponding sourceblock is read from the library, and the data is reconstructed into its original form.

Figure 8:
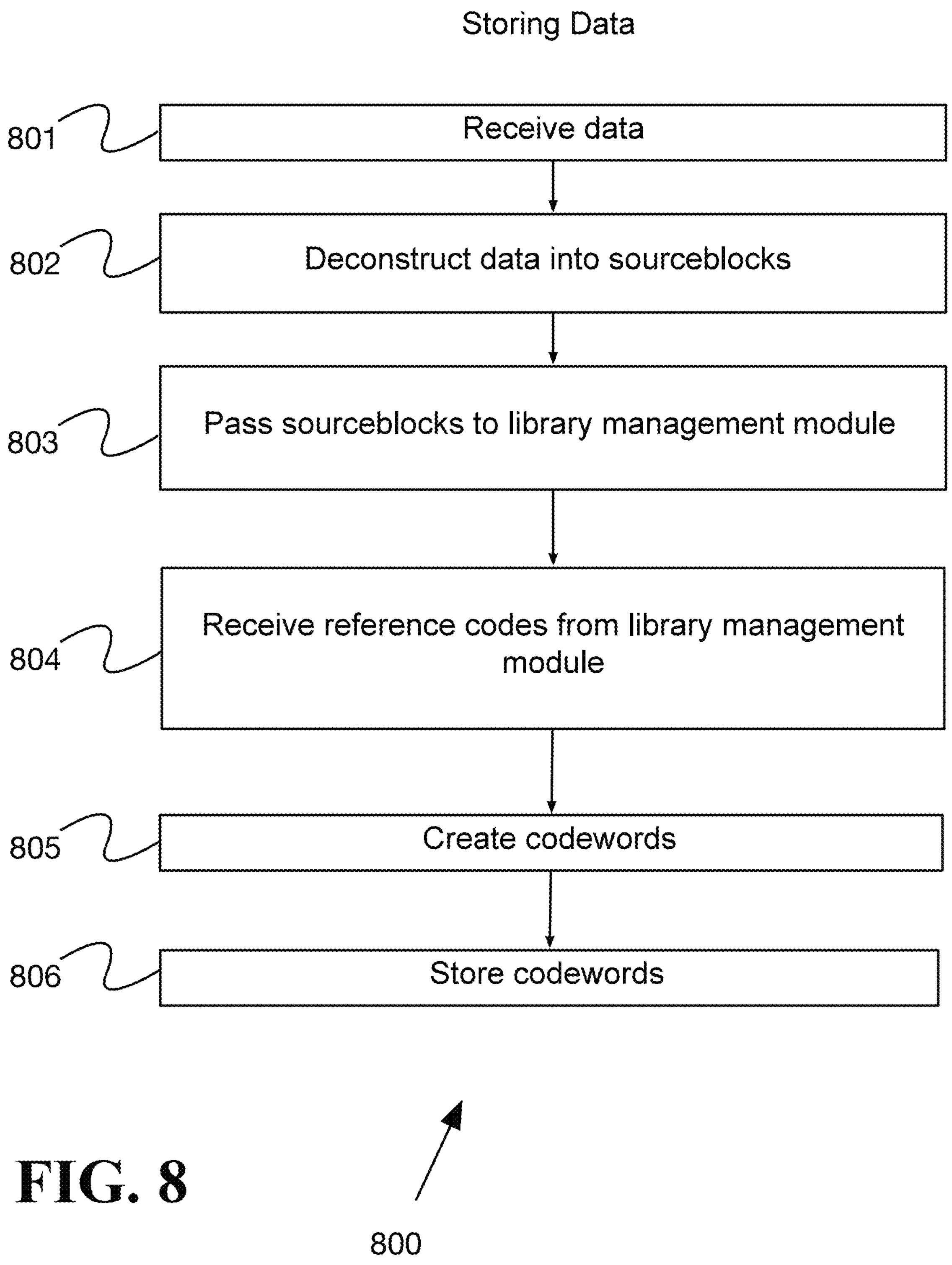
FIG. 8 is a method diagram showing the steps involved in using an embodiment to store data.

FIG. 8 is a method diagram showing the steps involved in using an embodiment 800 to store data. As data is received 801, it would be deconstructed into sourceblocks 802, and passed 803 to the library management module for processing. Reference codes would be received back 804 from the library management module, and could be combined with location information to create codewords 805, which would then be stored 806 as representations of the original data.

Figure 9:
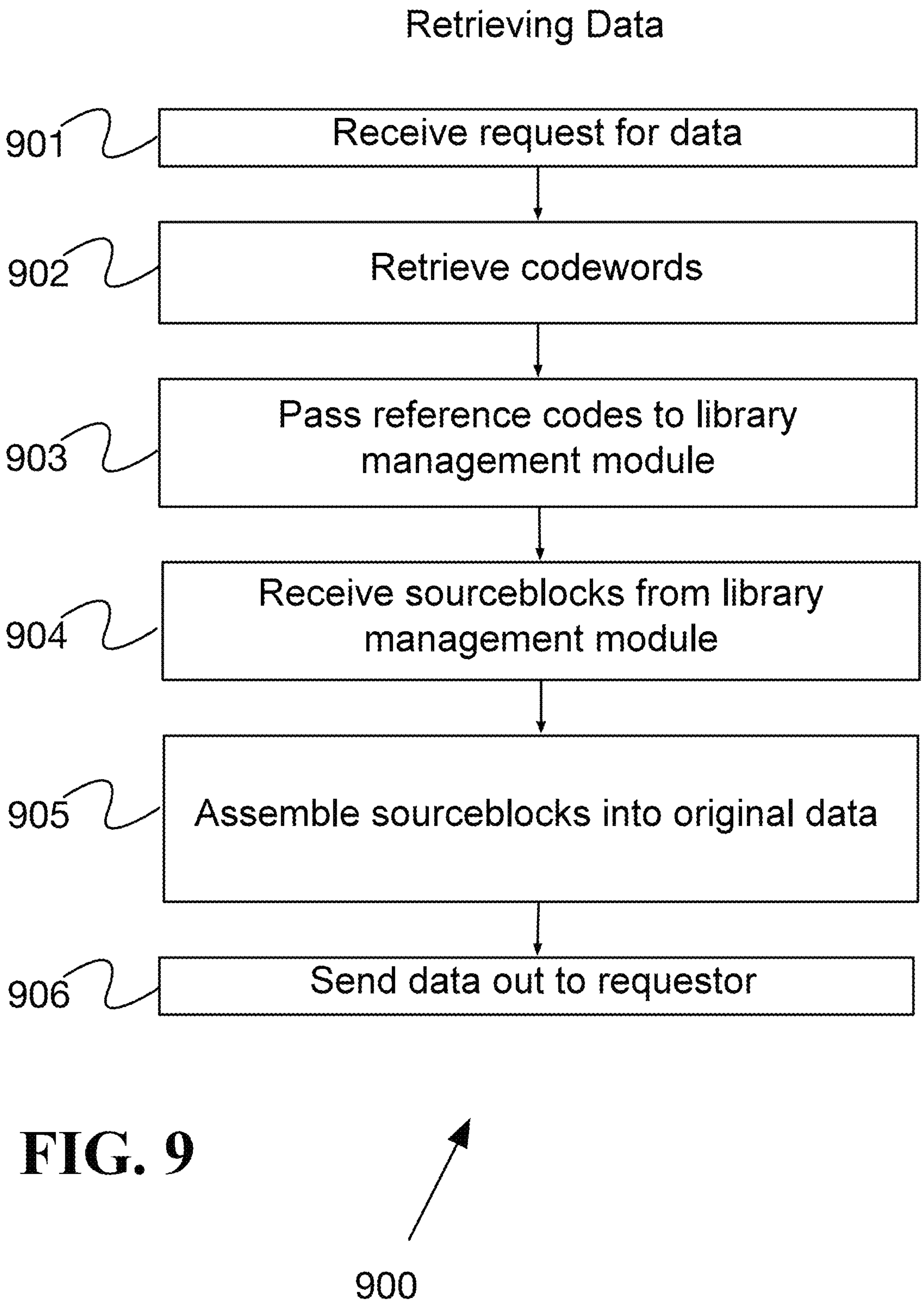
FIG. 9 is a method diagram showing the steps involved in using an embodiment to retrieve data.

FIG. 9 is a method diagram showing the steps involved in using an embodiment 900 to retrieve data. When a request for data is received 901, the associated codewords would be retrieved 902 from the library. The codewords would be passed 903 to the library management module, and the associated sourceblocks would be received back 904. Upon receipt, the sourceblocks would be assembled 905 into the original data using the location data contained in the codewords, and the reconstructed data would be sent out 906 to the requestor.

Figure 10:
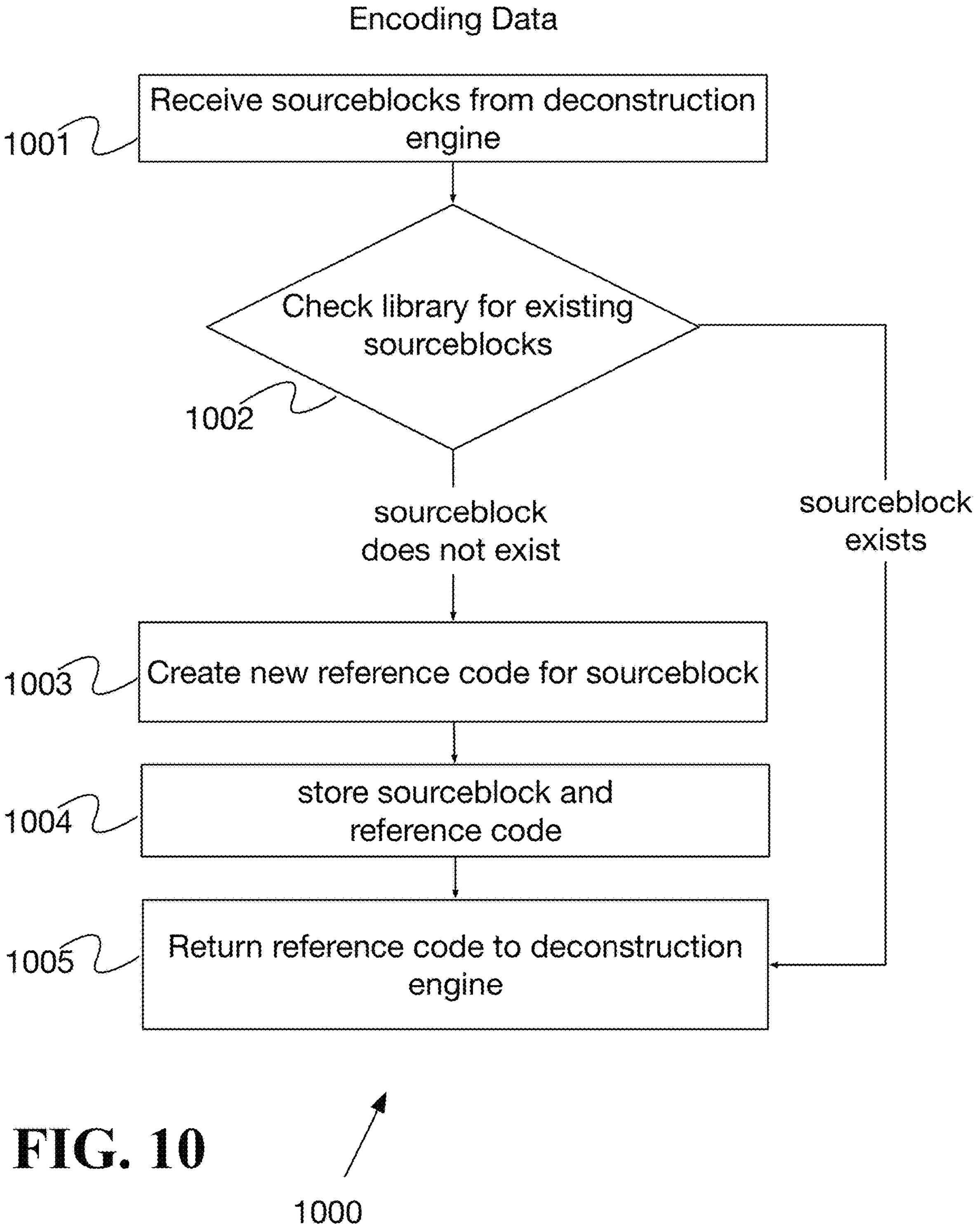
FIG. 10 is a method diagram showing the steps involved in using an embodiment to encode data.

FIG. 10 is a method diagram showing the steps involved in using an embodiment 1000 to encode data. As sourceblocks are received 1001 from the deconstruction engine, they would be compared 1002 with the sourceblocks already contained in the library. If that sourceblock already exists in the library, the associated reference code would be returned 1005 to the deconstruction engine. If the sourceblock does not already exist in the library, a new reference code would be created 1003 for the sourceblock. The new reference code and its associated sourceblock would be stored 1004 in the library, and the reference code would be returned to the deconstruction engine.

Figure 11:
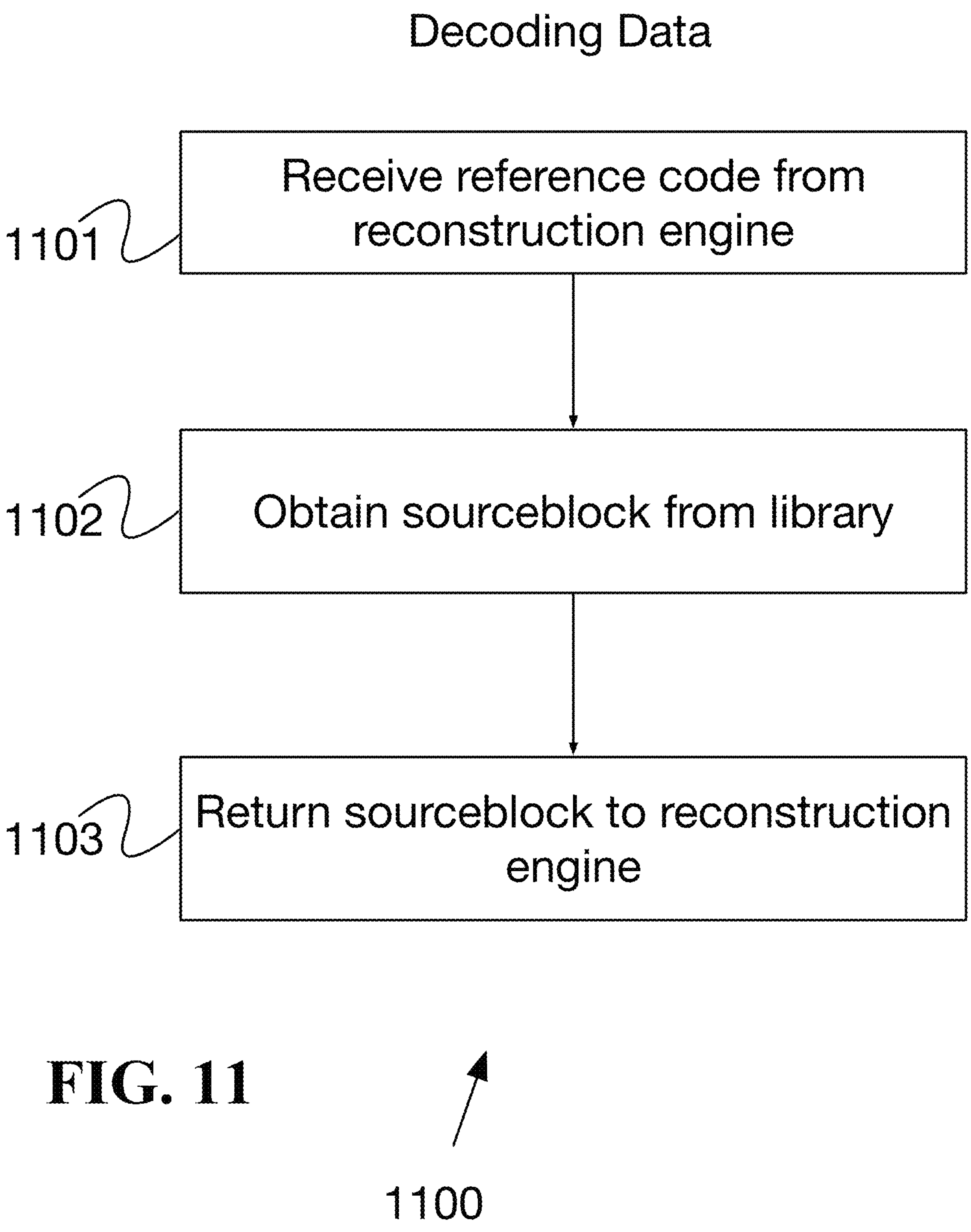
FIG. 11 is a method diagram showing the steps involved in using an embodiment to decode data.

FIG. 11 is a method diagram showing the steps involved in using an embodiment 1100 to decode data. As reference codes are received 1101 from the reconstruction engine, the associated sourceblocks are retrieved 1102 from the library, and returned 1103 to the reconstruction engine.

Figure 16:
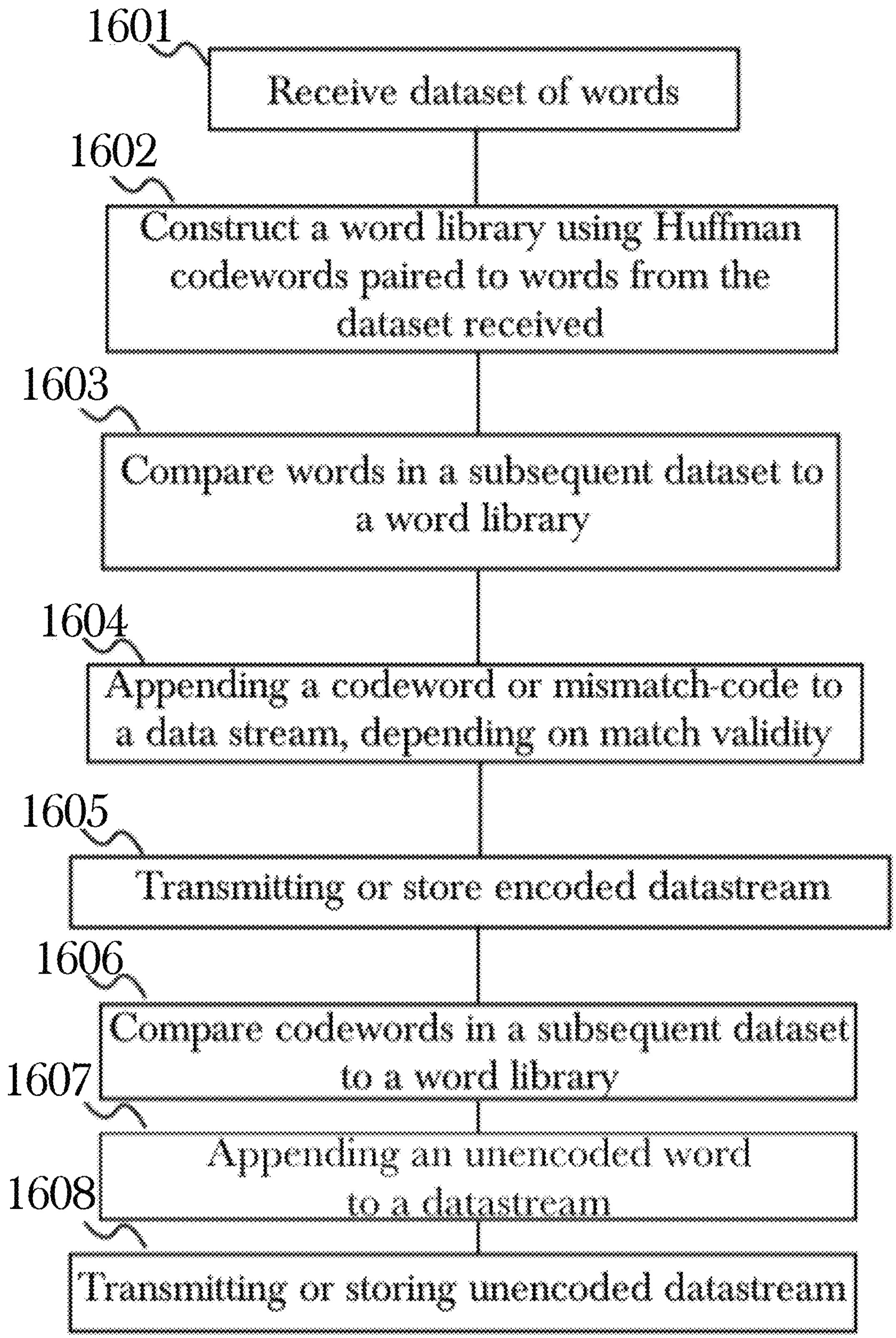
FIG. 16 is a method diagram illustrating key system functionality utilizing an encoder and decoder pair.

FIG. 16 is a method diagram illustrating key system functionality utilizing an encoder and decoder pair, according to a preferred embodiment. In a first step 1601, at least one incoming data set may be received at a customized library generator 1300 that then 1602 processes data to produce a customized word library 1201 comprising key-value pairs of data words (each comprising a string of bits) and their corresponding calculated binary Huffman codewords. A subsequent dataset may be received, and compared to the word library 1603 to determine the proper codewords to use in order to encode the dataset. Words in the dataset are checked against the word library and appropriate encodings are appended to a data stream 1604. If a word is mismatched within the word library and the dataset, meaning that it is present in the dataset but not the word library, then a mismatched code is appended, followed by the unencoded original word. If a word has a match within the word library, then the appropriate codeword in the word library is appended to the data stream. Such a data stream may then be stored or transmitted 1605 to a destination as desired. For the purposes of decoding, an already-encoded data stream may be received and compared 1606, and un-encoded words may be appended to a new data stream 1607 depending on word matches found between the encoded data stream and the word library that is present. A matching codeword that is found in a word library is replaced with the matching word and appended to a data stream, and a mismatch code found in a data stream is deleted and the following unencoded word is re-appended to a new data stream, the inverse of the process of encoding described earlier. Such a data stream may then be stored or transmitted 1608 as desired.

Figure 17:
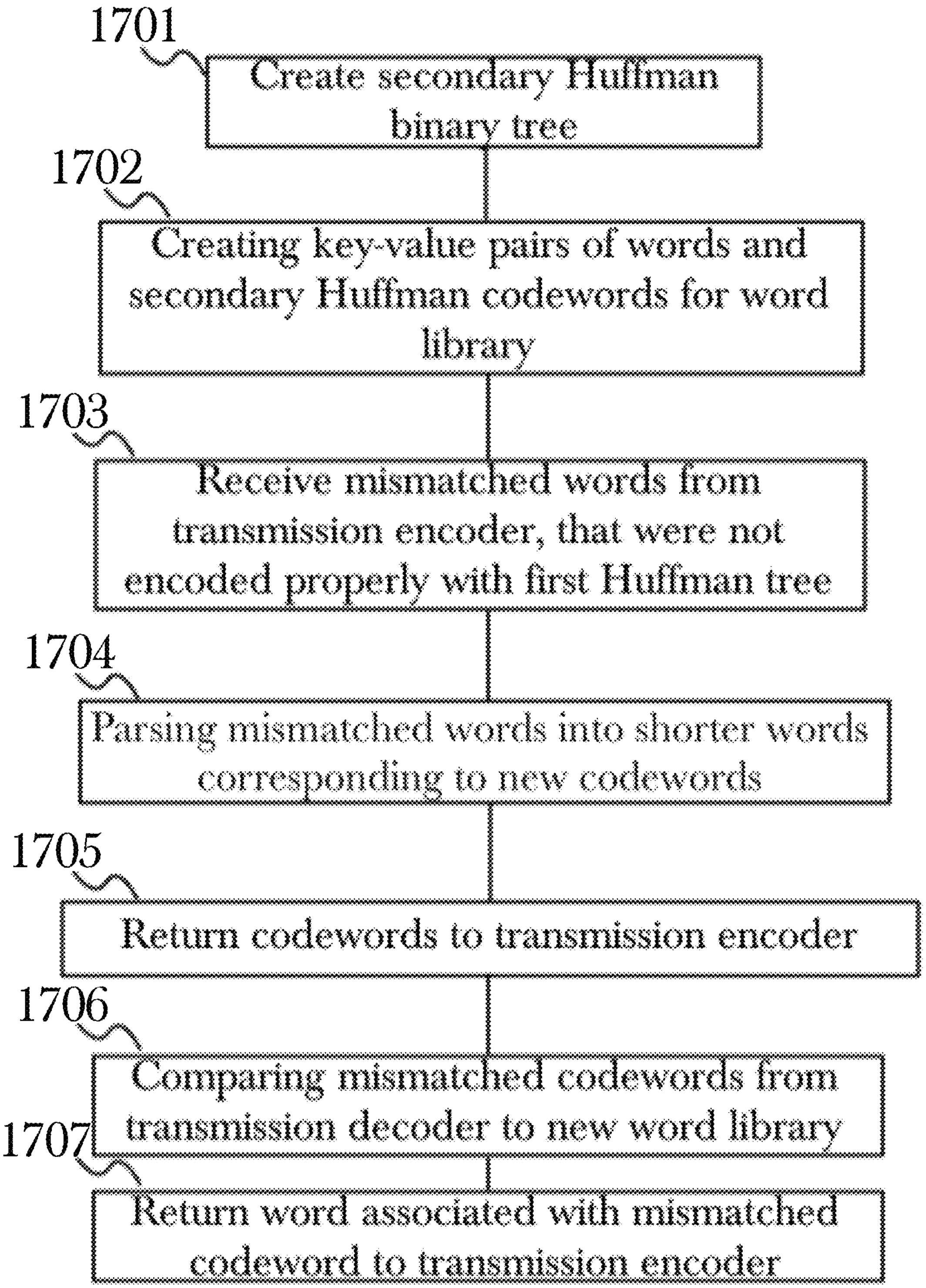
FIG. 17 is a method diagram illustrating possible use of a hybrid encoder/decoder to improve the compression ratio.

FIG. 17 is a method diagram illustrating possible use of a hybrid encoder/decoder to improve the compression ratio, according to a preferred aspect. A second Huffman binary tree may be created 1701, having a shorter maximum length of codewords than a first Huffman binary tree 1602, allowing a word library to be filled with every combination of codeword possible in this shorter Huffman binary tree 1702. A word library may be filled with these Huffman codewords and words from a dataset 1702, such that a hybrid encoder/decoder 1304, 1503 may receive any mismatched words from a dataset for which encoding has been attempted with a first Huffman binary tree 1703, 1604 and parse previously mismatched words into new partial codewords (that is, codewords that are each a substring of an original mismatched codeword) using the second Huffman binary tree 1704. In this way, an incomplete word library may be supplemented by a second word library. New codewords attained in this way may then be returned to a transmission encoder 1705, 1500. In the event that an encoded dataset is received for decoding, and there is a mismatch code indicating that additional coding is needed, a mismatch code may be removed and the unencoded word used to generate a new codeword as before 1706, so that a transmission encoder 1500 may have the word and newly generated codeword added to its word library 1707, to prevent further mismatching and errors in encoding and decoding.

It will be recognized by a person skilled in the art that the methods described herein can be applied to data in any form. For example, the method described herein could be used to store genetic data, which has four data units: C, G, A, and T. Those four data units can be represented as 2 bit sequences: 00, 01, 10, and 11, which can be processed and stored using the method described herein.

It will be recognized by a person skilled in the art that certain embodiments of the methods described herein may have uses other than data storage. For example, because the data is stored in reference code form, it cannot be reconstructed without the availability of the library of sourceblocks. This is effectively a form of encryption, which could be used for cyber security purposes. As another example, an embodiment of the method described herein could be used to store backup copies of data, provide for redundancy in the event of server failure, or provide additional security against cyberattacks by distributing multiple partial copies of the library among computers are various locations, ensuring that at least two copies of each sourceblock exist in different locations within the network.

Figure 18:
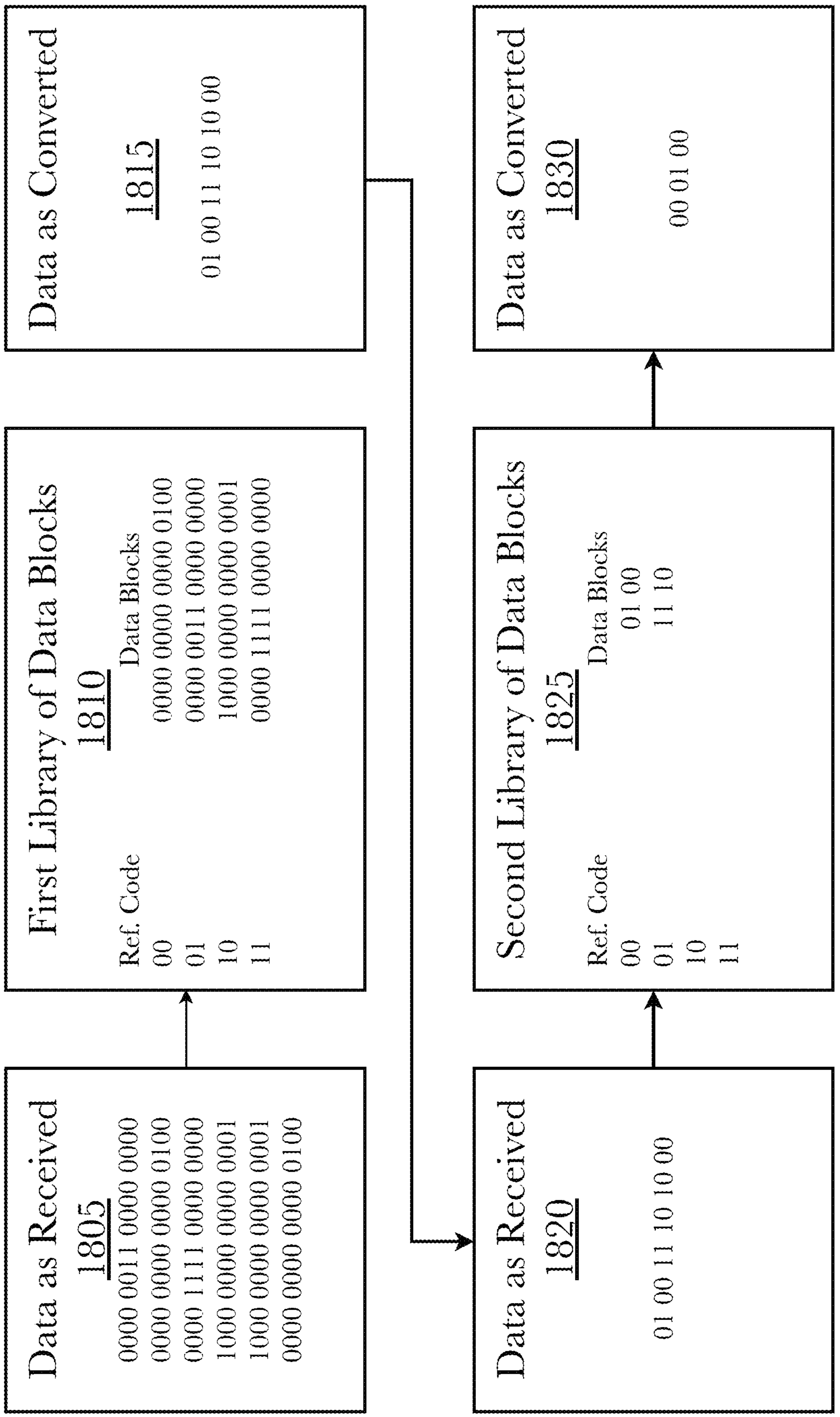
FIG. 18 is a flow diagram illustrating the use of a data encoding system used to recursively encode data to further reduce data size.

FIG. 18 is a flow diagram illustrating the use of a data encoding system used to recursively encode data to further reduce data size. Data may be input 1805 into a data deconstruction engine 102 to be deconstructed into code references, using a library of code references based on the input 1810. Such example data is shown in a converted, encoded format 1815, highly compressed, reducing the example data from 96 bits of data to 12 bits of data, before sending this newly encoded data through the process again 1820, to be encoded by a second library 1825, reducing it even further. The newly converted data 1830 is shown as only 6 bits in this example, thus a size of 6.25% of the original data packet. With recursive encoding, then, it is possible and implemented in the system to achieve increasing compression ratios, using multi-layered encoding, through recursively encoding data. Both initial encoding libraries 1810 and subsequent libraries 1825 may be achieved through machine learning techniques to find optimal encoding patterns to reduce size, with the libraries being distributed to recipients prior to transfer of the actual encoded data, such that only the compressed data 1830 must be transferred or stored, allowing for smaller data footprints and bandwidth requirements. This process can be reversed to reconstruct the data. While this example shows only two levels of encoding, recursive encoding may be repeated any number of times. The number of levels of recursive encoding will depend on many factors, a non-exhaustive list of which includes the type of data being encoded, the size of the original data, the intended usage of the data, the number of instances of data being stored, and available storage space for codebooks and libraries. Additionally, recursive encoding can be applied not only to data to be stored or transmitted, but also to the codebooks and/or libraries, themselves. For example, many installations of different libraries could take up a substantial amount of storage space. Recursively encoding those different libraries to a single, universal library would dramatically reduce the amount of storage space required, and each different library could be reconstructed as necessary to reconstruct incoming streams of data.

Figure 20:
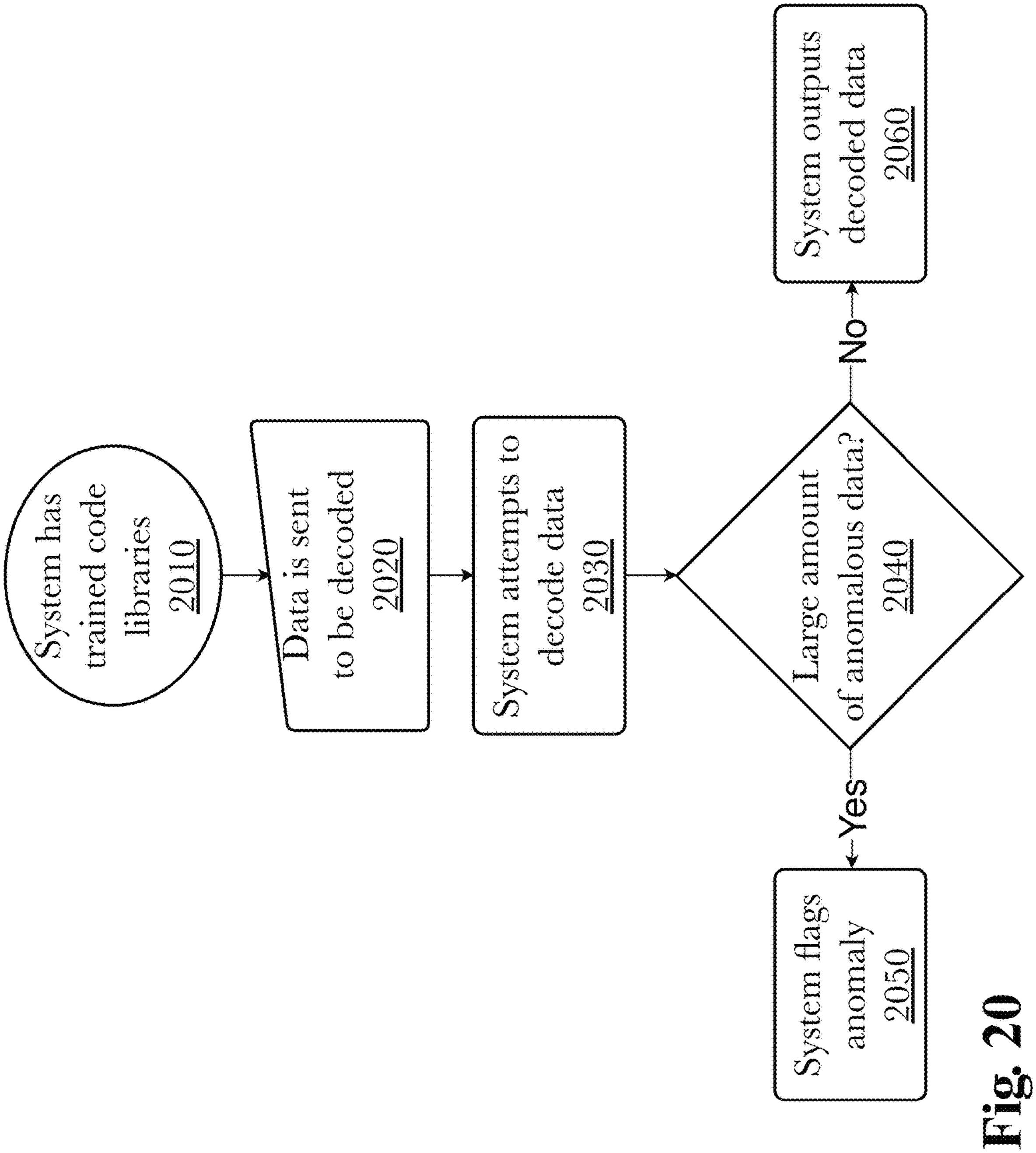
FIG. 20 is a flow diagram of an exemplary method used to detect anomalies in received encoded data and producing a warning.

FIG. 20 is a flow diagram of an exemplary method used to detect anomalies in received encoded data and producing a warning. A system may have trained encoding libraries 2010, before data is received from some source such as a network connected device or a locally connected device including USB connected devices, to be decoded 2020. Decoding in this context refers to the process of using the encoding libraries to take the received data and attempt to use encoded references to decode the data into its original source 2030, potentially more than once if recursive encoding was used, but not necessarily more than once. An anomaly detector 1910 may be configured to detect a large amount of un-encoded data 2040 in the midst of encoded data, by locating data or references that do not appear in the encoding libraries, indicating at least an anomaly, and potentially data tampering or faulty encoding libraries. A flag or warning is set by the system 2050, allowing a user to be warned at least of the presence of the anomaly and the characteristics of the anomaly. However, if a large number of invalid references or unencoded data are not present in the encoded data that is attempting to be decoded, the data may be decoded and output as normal 2060, indicating no anomaly has been detected.

Figure 21:
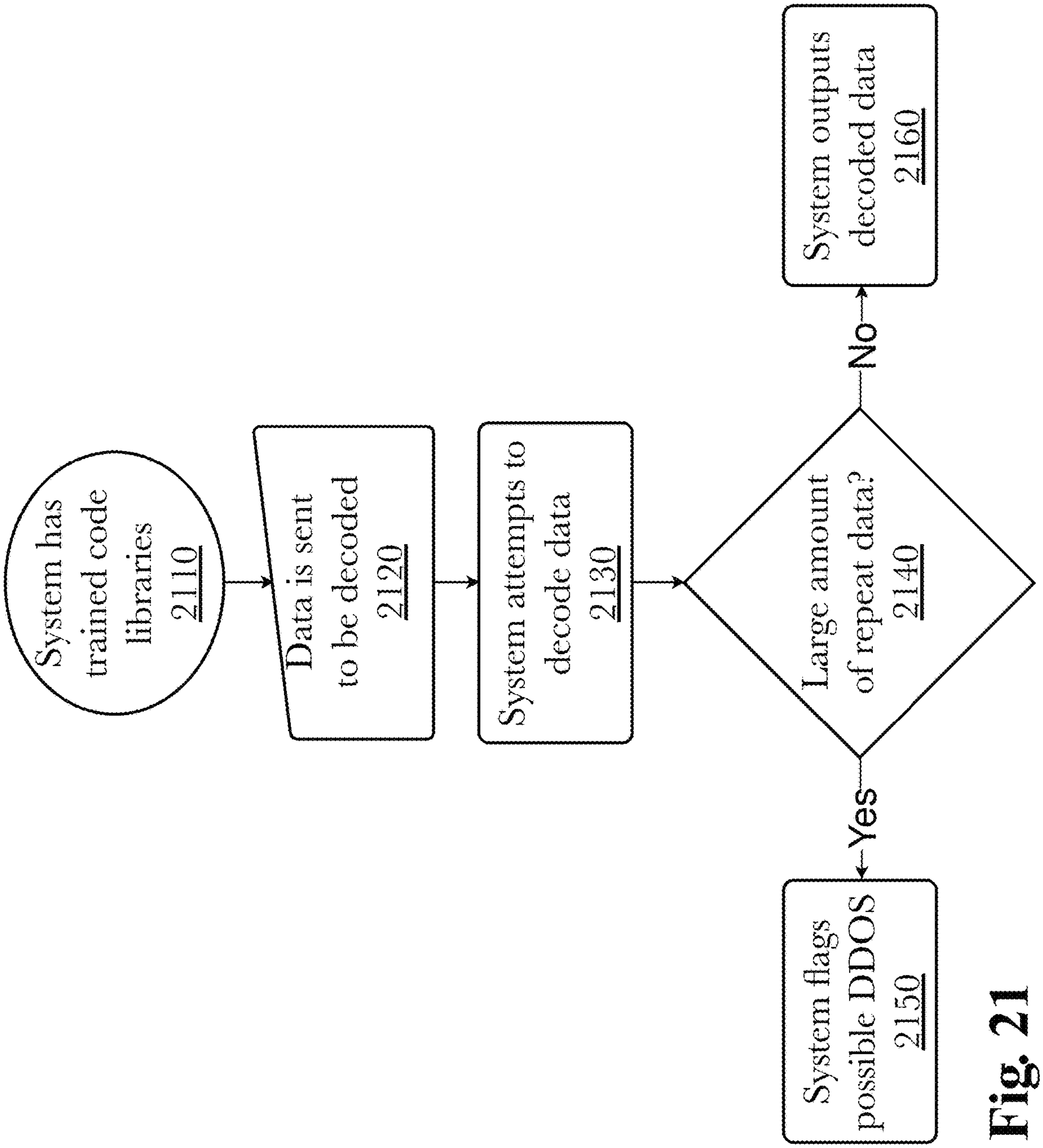
FIG. 21 is a flow diagram of a data encoding system used for Distributed Denial of Service (DDOS) attack denial.

FIG. 21 is a flow diagram of a method used for Distributed Denial of Service (DDoS) attack denial. A system may have trained encoding libraries 2110, before data is received from some source such as a network connected device or a locally connected device including USB connected devices, to be decoded 2120. Decoding in this context refers to the process of using the encoding libraries to take the received data and attempt to use encoded references to decode the data into its original source 2130, potentially more than once if recursive encoding was used, but not necessarily more than once. A DDOS detector 1920 may be configured to detect a large amount of repeating data 2140 in the encoded data, by locating data or references that repeat many times over (the number of which can be configured by a user or administrator as need be), indicating a possible DDOS attack. A flag or warning is set by the system 2150, allowing a user to be warned at least of the presence of a possible DDOS attack, including characteristics about the data and source that initiated the flag, allowing a user to then block incoming data from that source. However, if a large amount of repeat data in a short span of time is not detected, the data may be decoded and output as normal 2160, indicating no DDOS attack has been detected.

Figure 23:
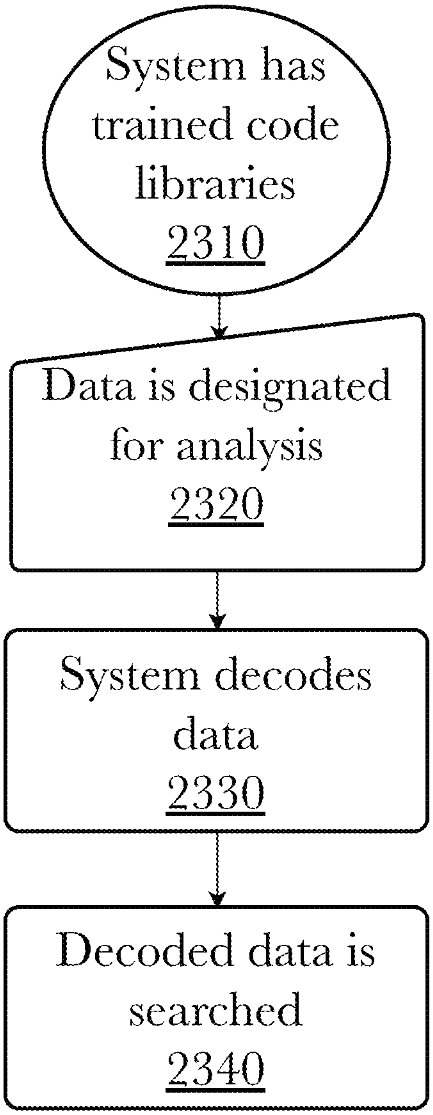
FIG. 23 is a flow diagram of an exemplary method used to enable high-speed data mining of repetitive data.

FIG. 23 is a flow diagram of an exemplary method used to enable high-speed data mining of repetitive data. A system may have trained encoding libraries 2310, before data is received from some source such as a network connected device or a locally connected device including USB connected devices, to be analyzed 2320 and decoded 2330. When determining data for analysis, users may select specific data to designate for decoding 2330, before running any data mining or analytics functions or software on the decoded data 2340. Rather than having traditional decryption and decompression operate over distributed drives, data can be regenerated immediately using the encoding libraries disclosed herein, as it is being searched. Using methods described in FIG. 9 and FIG. 11, data can be stored, retrieved, and decoded swiftly for searching, even across multiple devices, because the encoding library may be on each device. For example, if a group of servers host codewords relevant for data mining purposes, a single computer can request these codewords, and the codewords can be sent to the recipient swiftly over the bandwidth of their connection, allowing the recipient to locally decode the data for immediate evaluation and searching, rather than running slow, traditional decompression algorithms on data stored across multiple devices or transfer larger sums of data across limited bandwidth.

Figure 25:
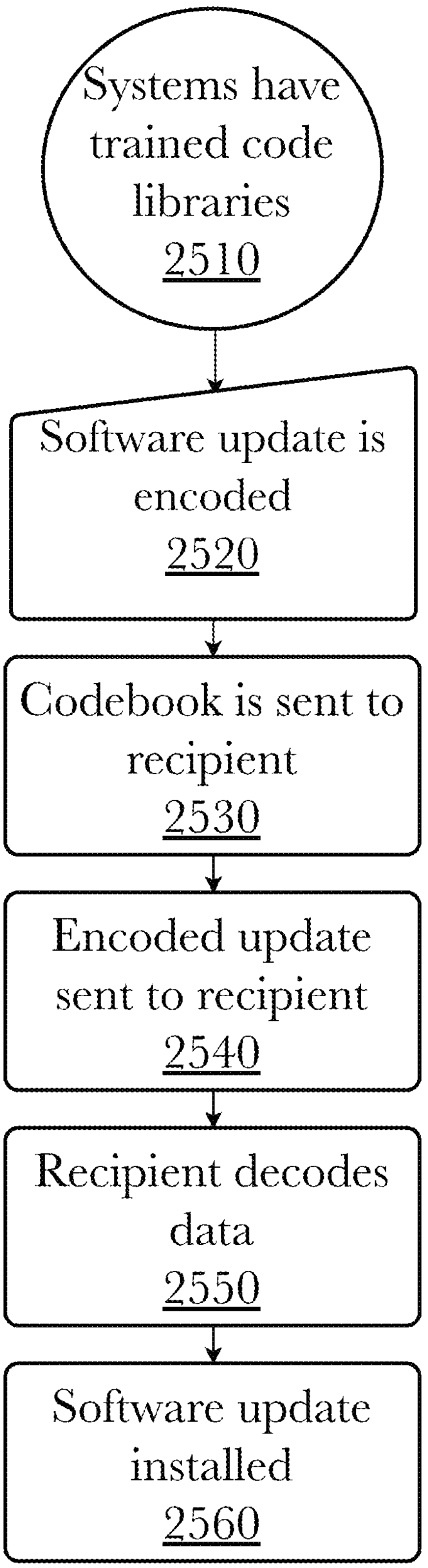
FIG. 25 is a flow diagram of an exemplary method used to encode and transfer software and firmware updates to a device for installation, for the purposes of reduced bandwidth consumption.

FIG. 25 is a flow diagram of an exemplary method used to encode and transfer software and firmware updates to a device for installation, for the purposes of reduced bandwidth consumption. A first system may have trained code libraries or "codebooks" present 2510, allowing for a software update of some manner to be encoded 2520. Such a software update may be a firmware update, operating system update, security patch, application patch or upgrade, or any other type of software update, patch, modification, or upgrade, affecting any computer system. A codebook for the patch must be distributed to a recipient 2530, which may be done beforehand and either over a network or through a local or physical connection, but must be accomplished at some point in the process before the update may be installed on the recipient device 2560. An update may then be distributed to a recipient device 2540, allowing a recipient with a codebook distributed to them 2530 to decode the update 2550 before installation 2560. In this way, an encoded and thus heavily compressed update may be sent to a recipient far quicker and with less bandwidth usage than traditional lossless compression methods for data, or when sending data in uncompressed formats. This especially may benefit large distributions of software and software updates, as with enterprises updating large numbers of devices at once.

Figure 27:
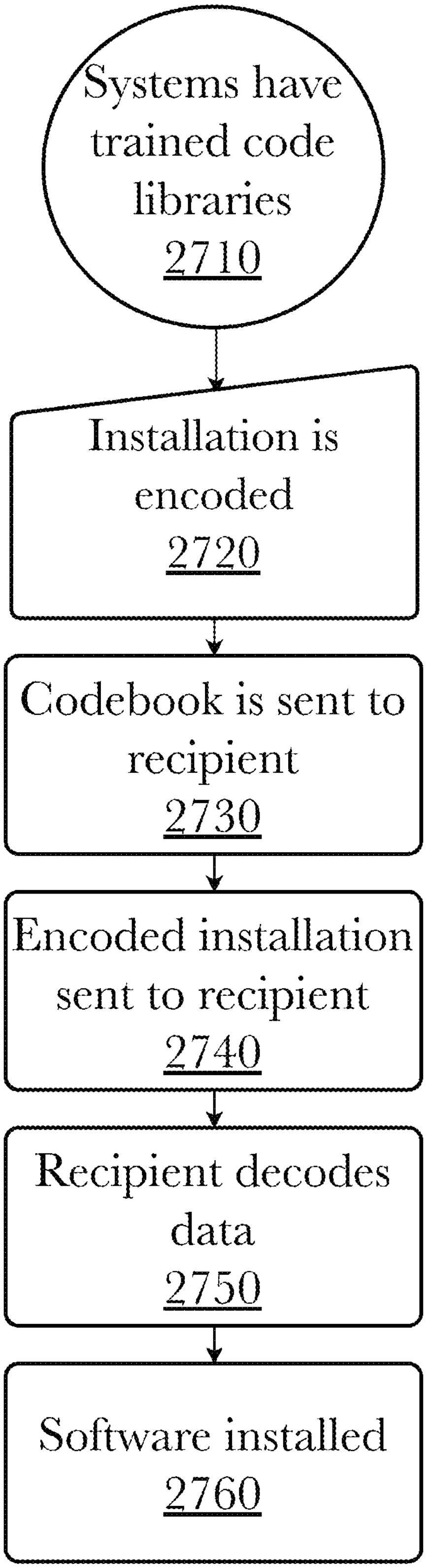
FIG. 27 is a flow diagram of an exemplary method used to encode new software and operating system installations for reduced bandwidth required for transference.

FIG. 27 is a flow diagram of an exemplary method used to encode new software and operating system installations for reduced bandwidth required for transference. A first system may have trained code libraries or "codebooks" present 2710, allowing for a software installation of some manner to be encoded 2720. Such a software installation may be a software update, operating system, security system, application, or any other type of software installation, execution, or acquisition, affecting a computer system. An encoding library or "codebook" for the installation must be distributed to a recipient 2730, which may be done beforehand and either over a network or through a local or physical connection, but must be accomplished at some point in the process before the installation can begin on the recipient device 2760. An installation may then be distributed to a recipient device 2740, allowing a recipient with a codebook distributed to them 2730 to decode the installation 2750 before executing the installation 2760. In this way, an encoded and thus heavily compressed software installation may be sent to a recipient far quicker and with less bandwidth usage than traditional lossless compression methods for data, or when sending data in uncompressed formats. This especially may benefit large distributions of software and software updates, as with enterprises updating large numbers of devices at once.

Figure 31:
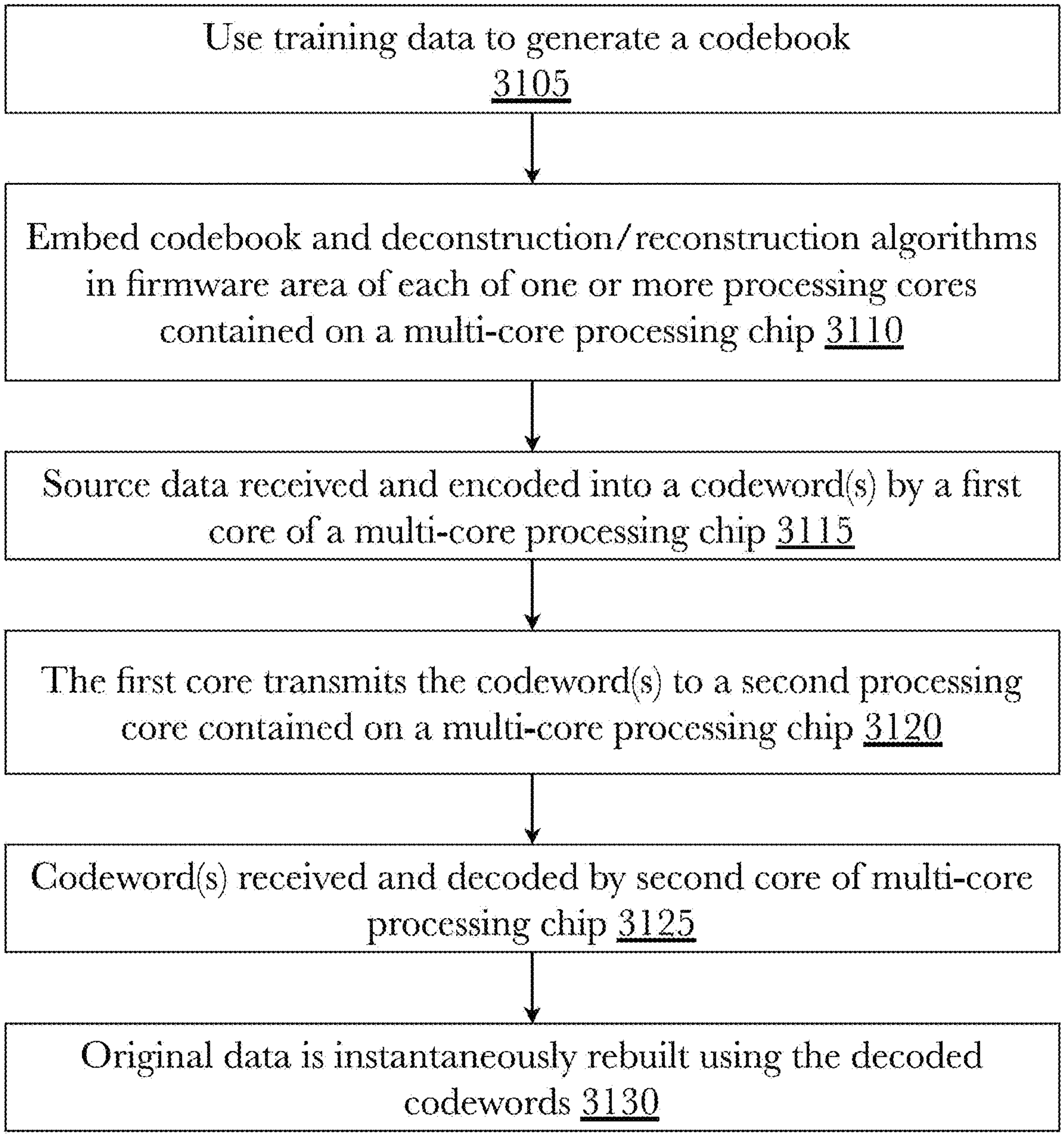
FIG. 31 is a flow diagram of an exemplary method used to transmit encoded data between one or more processing cores of a multi-core processing chip for increased bandwidth required for transmittance.

FIG. 31 is a flow diagram of an exemplary method used to transmit encoded data between one or more processing cores of a multi-core processing chip for increased bandwidth required for transmittance. According to an embodiment, the use of training data to generate a codebook 3105 is the first step taken. The training data is used to identify patterns in data prior to embedding code or programming firmware in a semiconductor (e.g., a processing chip with one or more processing cores). These patterns and their associated, smaller indices, or codewords, may be stored in a codebook that is replicated in the sending and receiving bus for each core contained on the chip. In addition to the codebook, lightweight code housing reconstruction and deconstruction algorithms may be embedded in the firmware area of each processing core contained on the multi-core chip 3110. A first processing core may receive source data and encode it into codeword(s) as it is received 3115 using the deconstruction algorithm stored in the firmware of the first core. Then, the first core may transmit the codeword(s) to a second processing core contained on the same multi-core processing chip 3120. The second processing core may receive and decode the codeword(s) 3125 from the first processing core using the reconstruction algorithm stored in the firmware of the second core. Once the codewords have been decoded, the original data is instantaneously rebuilt 3130 by the second processing core. The rebuilt original data may then be sent as output to a given location.

Exemplary Hardware Architecture

FIG. 48 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions based on technologies like complex instruction set computer (CISC) or reduced instruction set computer (RISC). Further, computing device 10 may comprise one or more specialized processors such as a graphics processing unit (GPU) 22 configured to accelerate processing of computer graphics and images via a large array of specialized processing cores arranged in parallel. Further computing device 10 may be comprised of one or more specialized processes such as Intelligent Processing Units, field-programmable gate arrays or application-specific integrated circuits for specific tasks or types of tasks. The term processor may further include: neural processing units (NPUs) or neural computing units optimized for machine learning and artificial intelligence workloads using specialized architectures and data paths; tensor processing units (TPUs) designed to efficiently perform matrix multiplication and convolution operations used heavily in neural networks and deep learning applications; application-specific integrated circuits (ASICs) implementing custom logic for domain-specific tasks; application-specific instruction set processors (ASIPs) with instruction sets tailored for particular applications; field-programmable gate arrays (FPGAs) providing reconfigurable logic fabric that can be customized for specific processing tasks; processors operating on emerging computing paradigms such as quantum computing, optical computing, mechanical computing (e.g., using nanotechnology entities to transfer data), and so forth. Depending on configuration, computing device 10 may comprise one or more of any of the above types of processors in order to efficiently handle a variety of general purpose and specialized computing tasks. The specific processor configuration may be selected based on performance, power, cost, or other design constraints relevant to the intended application of computing device 10.

System memory 30 is processor-accessible data storage in the form of volatile and/or nonvolatile memory. System memory 30 may be either or both of two types: non-volatile memory and volatile memory. Non-volatile memory **30*a* is not erased when power to the memory is removed, and includes memory types such as read only memory (ROM), electronically-erasable programmable memory (EEPROM), and rewritable solid state memory (commonly known as "flash memory"). Non-volatile memory 30*a* is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30*a* may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30*b* is erased when power to the memory is removed and is typically used for short-term storage of data for processing. Volatile memory 30*b* includes memory types such as random-access memory (RAM), and is normally the primary operating memory into which the operating system 35, applications 36, program modules 37, and application data 38 are loaded for execution by processors 20. Volatile memory 30*b* is generally faster than non-volatile memory 30*a* due to its electrical characteristics and is directly accessible to processors 20 for processing of instructions and data storage and retrieval. Volatile memory 30*b*** may comprise one or more smaller cache memories which operate at a higher clock speed and are typically placed on the same IC as the processors to improve performance.

There are several types of computer memory, each with its own characteristics and use cases. System memory 30 may be configured in one or more of the several types described herein, including high bandwidth memory (HBM) and advanced packaging technologies like chip-on-wafer-on-substrate (CoWoS). Static random access memory (SRAM) provides fast, low-latency memory used for cache memory in processors, but is more expensive and consumes more power compared to dynamic random access memory (DRAM). SRAM retains data as long as power is supplied. DRAM is the main memory in most computer systems and is slower than SRAM but cheaper and more dense. DRAM requires periodic refresh to retain data. NAND flash is a type of non-volatile memory used for storage in solid state drives (SSDs) and mobile devices and provides high density and lower cost per bit compared to DRAM with the trade-off of slower write speeds and limited write endurance. HBM is an emerging memory technology that provides high bandwidth and low power consumption which stacks multiple DRAM dies vertically, connected by through-silicon vias (TSVs). HBM offers much higher bandwidth (up to 1 TB/s) compared to traditional DRAM and may be used in high-performance graphics cards, AI accelerators, and edge computing devices. Advanced packaging and CoWoS are technologies that enable the integration of multiple chips or dies into a single package. CoWoS is a 2.5D packaging technology that interconnects multiple dies side-by-side on a silicon interposer and allows for higher bandwidth, lower latency, and reduced power consumption compared to traditional PCB-based packaging. This technology enables the integration of heterogeneous dies (e.g., CPU, GPU, HBM) in a single package and may be used in high-performance computing, AI accelerators, and edge computing devices.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. In some high-performance computing systems, multiple GPUs may be connected using NVLink bridges, which provide high-bandwidth, low-latency interconnects between GPUs. NVLink bridges enable faster data transfer between GPUs, allowing for more efficient parallel processing and improved performance in applications such as machine learning, scientific simulations, and graphics rendering. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44. Network interface 42 may support various communication standards and protocols, such as Ethernet and Small Form-Factor Pluggable (SFP). Ethernet is a widely used wired networking technology that enables local area network (LAN) communication. Ethernet interfaces typically use RJ45 connectors and support data rates ranging from 10 Mbps to 100 Gbps, with common speeds being 100 Mbps, 1 Gbps, 10 Gbps, 25 Gbps, 40 Gbps, and 100 Gbps. Ethernet is known for its reliability, low latency, and cost-effectiveness, making it a popular choice for home, office, and data center networks. SFP is a compact, hot-pluggable transceiver used for both telecommunication and data communications applications. SFP interfaces provide a modular and flexible solution for connecting network devices, such as switches and routers, to fiber optic or copper networking cables. SFP transceivers support various data rates, ranging from 100 Mbps to 100 Gbps, and can be easily replaced or upgraded without the need to replace the entire network interface card. This modularity allows for network scalability and adaptability to different network requirements and fiber types, such as single-mode or multi-mode fiber.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid state memory technology. Non-volatile data storage devices 50 may be implemented using various technologies, including hard disk drives (HDDs) and solid-state drives (SSDs). HDDs use spinning magnetic platters and read/write heads to store and retrieve data, while SSDs use NAND flash memory. SSDs offer faster read/write speeds, lower latency, and better durability due to the lack of moving parts, while HDDs typically provide higher storage capacities and lower cost per gigabyte. NAND flash memory comes in different types, such as Single-Level Cell (SLC), Multi-Level Cell (MLC), Triple-Level Cell (TLC), and Quad-Level Cell (QLC), each with trade-offs between performance, endurance, and cost. Storage devices connect to the computing device 10 through various interfaces, such as SATA, NVMe, and PCIe. SATA is the traditional interface for HDDs and SATA SSDs, while NVMe (Non-Volatile Memory Express) is a newer, high-performance protocol designed for SSDs connected via PCIe. PCIe SSDs offer the highest performance due to the direct connection to the PCIe bus, bypassing the limitations of the SATA interface. Other storage form factors include M.2 SSDs, which are compact storage devices that connect directly to the motherboard using the M.2 slot, supporting both SATA and NVMe interfaces. Additionally, technologies like Intel Optane memory combine 3D XPoint technology with NAND flash to provide high-performance storage and caching solutions. Non-volatile data storage devices 50 may be non-removable from computing device 10, as in the case of internal hard drives, removable from computing device 10, as in the case of external USB hard drives, or a combination thereof. However, computing devices will typically comprise one or more internal, non-removable hard drives using either magnetic disc or solid-state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, object oriented databases, NoSQL databases, vector databases, knowledge graph databases, key-value databases, document oriented data stores, and graph databases.

Applications (also known as computer software or software applications) are sets of programming instructions designed to perform specific tasks or provide specific functionality on a computer or other computing devices. Applications are typically written in high-level programming languages such as C, C++, Scala, Erlang, GoLang, Java, Scala, Rust, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems facilitated by specifications such as containerd.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network or optical transmitters (e.g., lasers). Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers or networking functions may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices or intermediate networking equipment (e.g., for deep packet inspection).

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90. Also, certain processing subtasks may be sent to a microservice 91 for processing with the result being transmitted to computing device 10 for incorporation into a larger processing task. Infrastructure as Code (IaaC) tools like Terraform can be used to manage and provision computing resources across multiple cloud providers or hyperscalers. This allows for workload balancing based on factors such as cost, performance, and availability. For example, Terraform can be used to automatically provision and scale resources on AWS spot instances during periods of high demand, such as for surge rendering tasks, to take advantage of lower costs while maintaining the required performance levels. In the context of rendering, tools like Blender can be used for object rendering of specific elements, such as a car, bike, or house. These elements can be approximated and roughed in using techniques like bounding box approximation or low-poly modeling to reduce the computational resources required for initial rendering passes. The rendered elements can then be integrated into the larger scene or environment as needed, with the option to replace the approximated elements with higher-fidelity models as the rendering process progresses.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is containerd, which is widely used in software development and deployment. Containerization, particularly with open-source technologies like containerd and container orchestration systems like Kubernetes, is a common approach for deploying and managing applications. Containers are created from images, which are lightweight, standalone, and executable packages that include application code, libraries, dependencies, and runtime. Images are often built from a containerfile or similar, which contains instructions for assembling the image. Containerfiles are configuration files that specify how to build a container image. Systems like Kubernetes natively support containerd as a container runtime. They include commands for installing dependencies, copying files, setting environment variables, and defining runtime configurations. Container images can be stored in repositories, which can be public or private. Organizations often set up private registries for security and version control using tools such as Harbor, JFrog Artifactory and Bintray, GitLab Container Registry, or other container registries. Containers can communicate with each other and the external world through networking. Containerd provides a default network namespace, but can be used with custom network plugins. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, mainframe computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are serverless logic apps, microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, protobuffers, gRPC or message queues such as Kafka. Microservices 91 can be combined to perform more complex or distributed processing tasks. In an embodiment, Kubernetes clusters with containerized resources are used for operational packaging of system.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over public or private networks or the Internet on a subscription or alternative licensing basis, or consumption or ad-hoc marketplace basis, or combination thereof.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power or support for highly dynamic compute, transport or storage resource variance or uncertainty over time requiring scaling up and down of constituent system resources. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, NVLink or other GPU-to-GPU high bandwidth communications links and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

The skilled person will be aware of a range of possible modifications of the various aspects described above. Accordingly, the present invention is defined by the claims and their equivalents.

What is claimed is:

1. A computer system comprising:

a hardware memory, wherein the computer system is configured to execute software instructions stored on non-transitory machine-readable storage media that:

store a unified codebook in memory, the unified codebook associating data patterns with both compression codes and encryption parameters;

receive data along with processing requirements indicating a desired balance between compression efficiency and security level;

select a processing mode from multiple available modes based on the processing requirements;

deconstruct the received data into blocks for processing;

when encryption is not required, compress the blocks using the unified codebook;

when encryption is required;

transform the blocks using mathematical operations that provide cryptographic properties while maintaining compressibility;

generate output data that combines compression and encryption based on the selected processing mode; and optionally separate transformation information from compressed data based on security requirements;

transmit or store the processed data;

reconstruct original or approximate data from the processed data using mode-appropriate algorithms and the unified codebook;

synchronize codebook updates across distributed processing nodes when operating in a distributed environment;

wherein the synchronization of codebook updates further comprises differential update generation that transmits only changed entries, version control mechanisms that ensure compatibility across nodes, and atomic update protocols that prevent inconsistencies during distributed synchronization; and adapt processing parameters based on data characteristics and system performance metrics.

2. The computer system of claim 1, wherein the unified codebook further comprises a transformation matrix that maps compression codes to encryption states using row-stochastic probability distributions, enabling the mathematical operations to achieve dyadic distribution properties for cryptographic security.

3. The computer system of claim 1, wherein the processing mode selection further comprises evaluating data entropy levels, regulatory compliance requirements, and available computational resources to automatically determine an optimal mode from compression-only, lossless encrypted compression, lossy encrypted compression, and modified lossless encrypted compression.

4. The computer system of claim 1, wherein the reconstruction of original or approximate data further comprises mode-specific quality thresholds where lossless modes require bit-perfect reconstruction verification and lossy modes permit controlled information loss within predetermined perceptual or statistical bounds.

5. A method for distributed node-based data compaction with encryption, comprising the steps of:

storing a unified codebook in memory, the unified codebook associating data patterns with both compression codes and encryption parameters;

receiving data along with processing requirements indicating a desired balance between compression efficiency and security level;

selecting a processing mode from multiple available modes based on the processing requirements;

deconstructing the received data into blocks for processing;

when encryption is not required, compressing the blocks using the unified codebook;

when encryption is required;

transforming the blocks using mathematical operations that provide cryptographic properties while maintaining compressibility;

generating output data that combines compression and encryption based on the selected processing mode; and optionally separating transformation information from compressed data based on security requirements;

transmitting or storing the processed data;

reconstructing original or approximate data from the processed data using mode-appropriate algorithms and the unified codebook;

synchronizing codebook updates across distributed processing nodes when operating in a distributed environment;

wherein the synchronization of codebook updates further comprises differential update generation that transmits only changed entries, version control mechanisms that ensure compatibility across nodes, and atomic update protocols that prevent inconsistencies during distributed synchronization; and adapting processing parameters based on data characteristics and system performance metrics.

6. The method of claim 5, wherein the unified codebook further comprises a transformation matrix that maps compression codes to encryption states using row-stochastic probability distributions, enabling the mathematical operations to achieve dyadic distribution properties for cryptographic security.

7. The method of claim 5, wherein the processing mode selection further comprises evaluating data entropy levels, regulatory compliance requirements, and available computational resources to automatically determine an optimal mode from compression-only, lossless encrypted compression, lossy encrypted compression, and modified lossless encrypted compression.

8. The method of claim 5, wherein the reconstruction of original or approximate data further comprises mode-specific quality thresholds where lossless modes require bit-perfect reconstruction verification and lossy modes permit controlled information loss within predetermined perceptual or statistical bounds.

* * * * *